(12) United States Patent  
Wang

(10) Patent No.: US 7,119,008 B2
(45) Date of Patent: Oct. 10, 2006

(54) INTEGRATING METAL LAYERS WITH ULTRA LOW-K DIELECTRICS

(75) Inventor: Hui Wang, Fremont, CA (US)

(73) Assignee: ACM Research, Inc., Fremont, CA (US)

( * ) Notice: Subject to any disclaimer, the term of this patent is extended or adjusted under 35 U.S.C. 154(b) by 210 days.

(21) Appl. No.: 10/380,848

(22) PCT Filed: Sep. 18, 2001

(86) PCT No.: PCT/US01/29173

§ 371 (c)(1),
(2), (4) Date: Mar. 14, 2003

(87) PCT Pub. No.: WO02/23616

PCT Pub. Date: Mar. 21, 2002

(65) Prior Publication Data

US 2004/0266130 A1    Dec. 30, 2004

Related U.S. Application Data

(60) Provisional application No. 60/233,587, filed on Sep. 18, 2000.

(51) Int. Cl.
    *H01L 21/4763* (2006.01)
(52) U.S. Cl. ............... 438/624; 438/626; 257/E21.535
(58) Field of Classification Search ............... 438/597, 438/622, 624, 626; 257/E21.585
    See application file for complete search history.

(56) References Cited

U.S. PATENT DOCUMENTS

| 6,136,707 | A  | * | 10/2000 | Cohen .................. 438/687 |
| 6,252,290 | B1 | * | 6/2001  | Quek et al. ............. 257/522 |
| 6,284,050 | B1 |   | 9/2001  | Shi et al. |
| 6,294,467 | B1 |   | 9/2001  | Yokoyama et al. |
| 6,303,014 | B1 |   | 10/2001 | Taylor et al. |
| 6,455,415 | B1 | * | 9/2002  | Lopatin et al. ......... 438/628 |
| 6,790,336 | B1 | * | 9/2004  | Andryushchenko ....... 205/220 |
| 2002/0108861 | A1 | * | 8/2002 | Emesh et al. .......... 205/81 |

OTHER PUBLICATIONS

D. Banks's, "Introduction to Micriengineering", www.dbanks.demon.co.uk/ueng/wetetch.html, Aug. 1, 2001, 4 pgs.
R. DeJule, Associate Editor, "Dual-Damascene: Overcoming Process Issues", SI Jun. 2000, 8 pgs., www.semiconductor.net/semiconductor/issues/2000.
G. C. Dunham, "Microfabrication Equipment", www.emsl.pnl.gov:2080/capabs/nm/microfab.html, Aug. 1, 2001, 5pgs.
T. N. Theis, "The future of interconnection technology", IBM Journal of Research & Development, vol. 44, No. 3, 2000, 13 pgs.
"Anisotropic Vs. Isotropic Etching", Virginia Microelectronics Center, 1 pg., www.vcu.edu/egrweb/vmc, Aug. 20, 2001.
"What is Dielectric Constant", www.arlonmed.com/Everything?Materials, Aug. 1, 2001, 3 pgs.

* cited by examiner

*Primary Examiner*—Bradley K. Smith
(74) *Attorney, Agent, or Firm*—Morrison & Foerster LLP

(57) ABSTRACT

In forming a layer of a semiconductor wafer, a dielectric layer is deposited on the semiconductor wafer. The dielectric layer includes material having a low dielectric constant. Recessed and non-recessed areas are formed in the dielectric layer. A metal layer is deposited on the dielectric layer to fill the recessed areas and cover the non-recessed areas. The metal layer is then electropolished to remove the metal layer covering the non-recessed areas while maintaining the metal layer in the recessed areas.

28 Claims, 48 Drawing Sheets

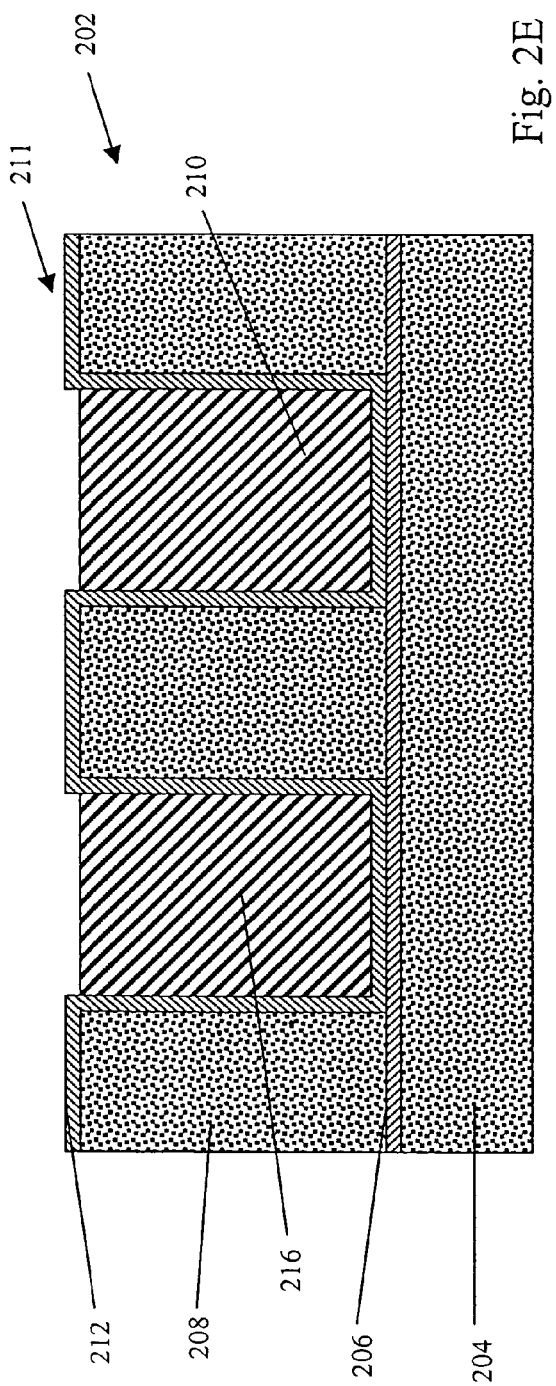
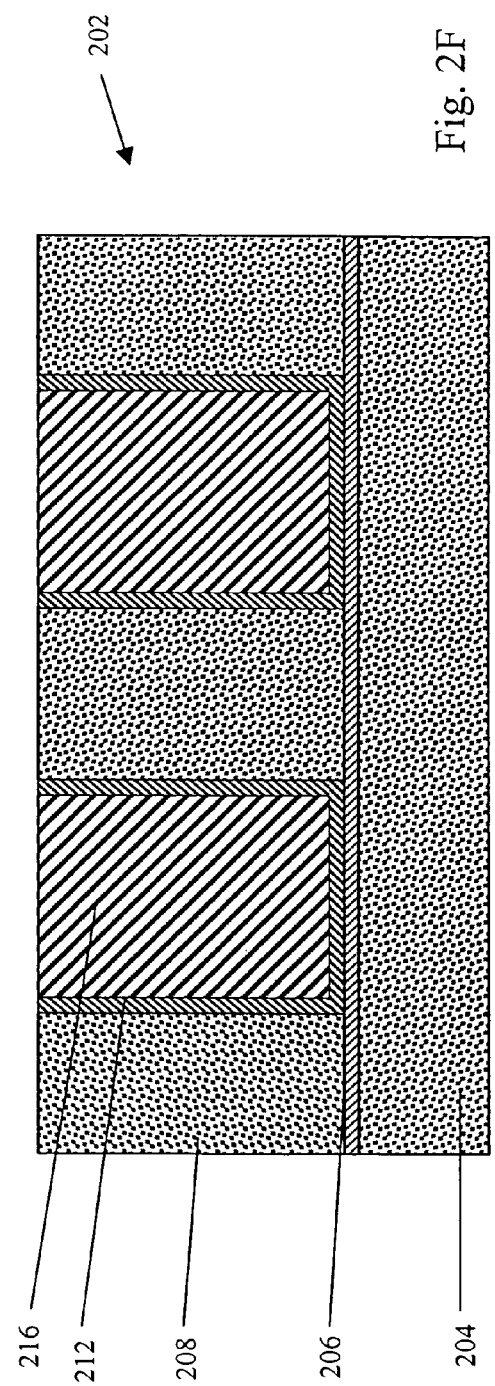
Fig. 2E
Fig. 2F

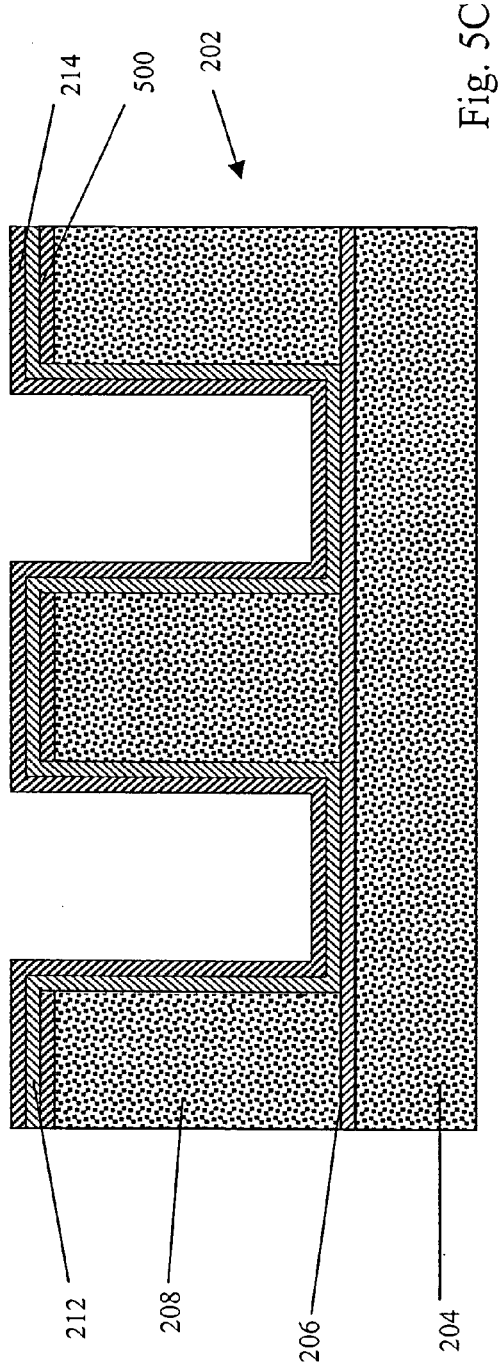
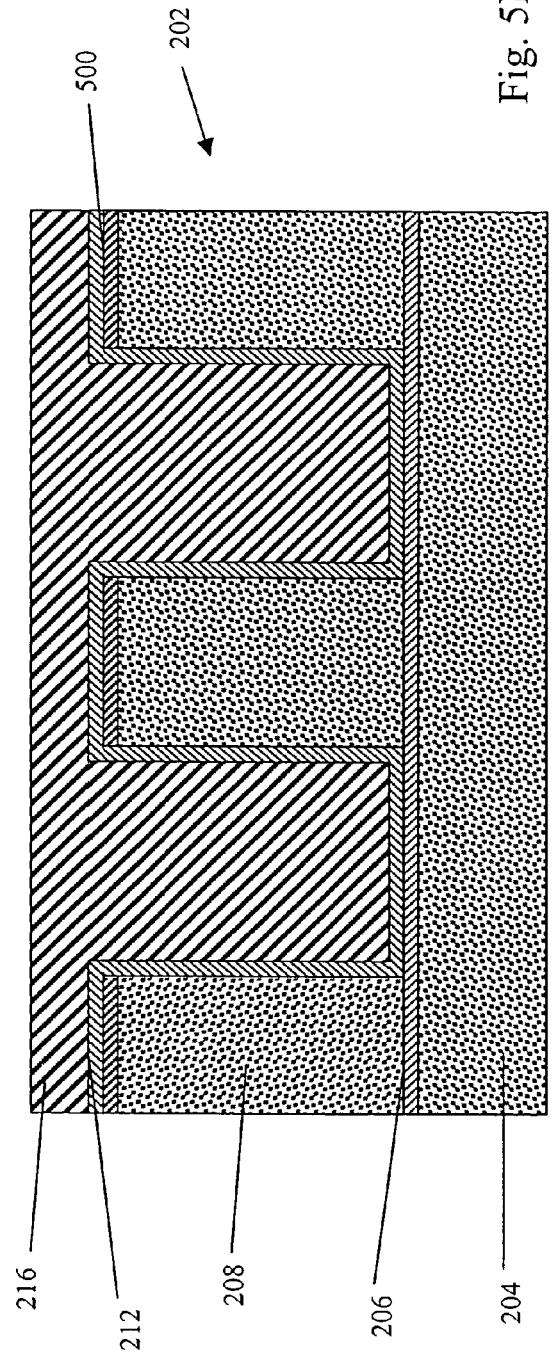
Fig. 5C
Fig. 5D

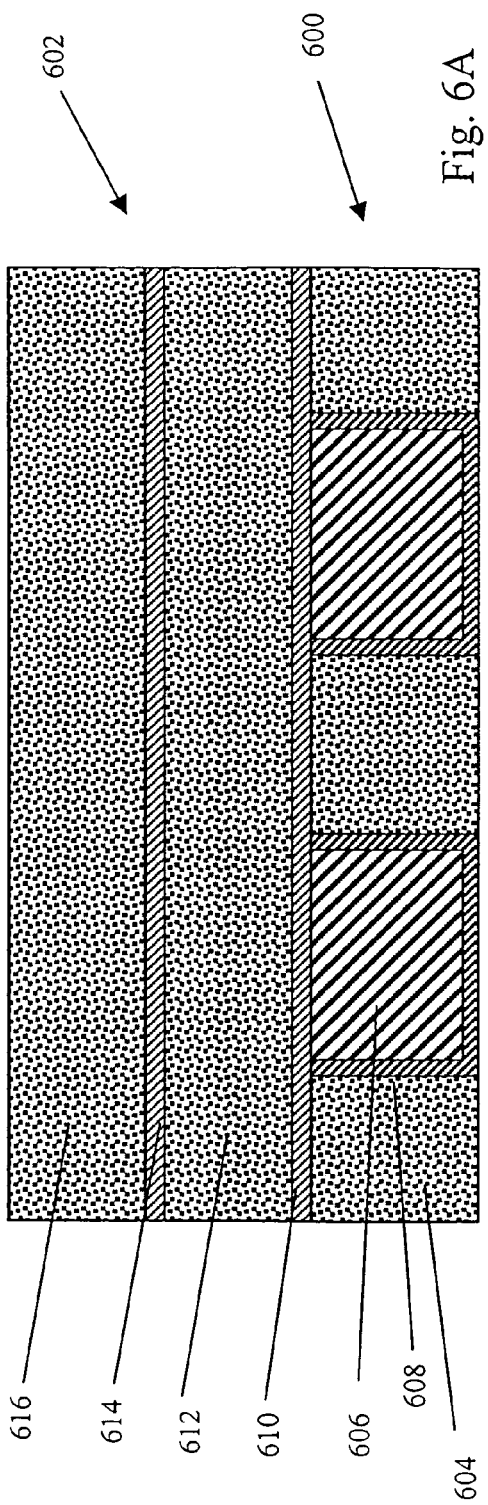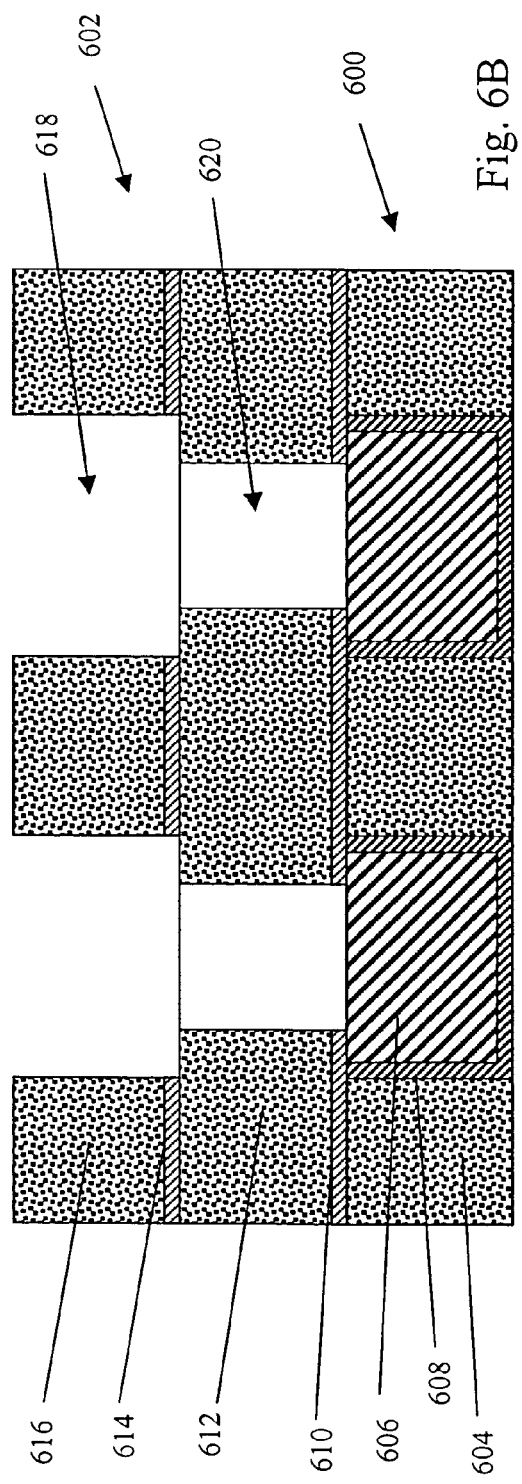
Fig. 6A
Fig. 6B

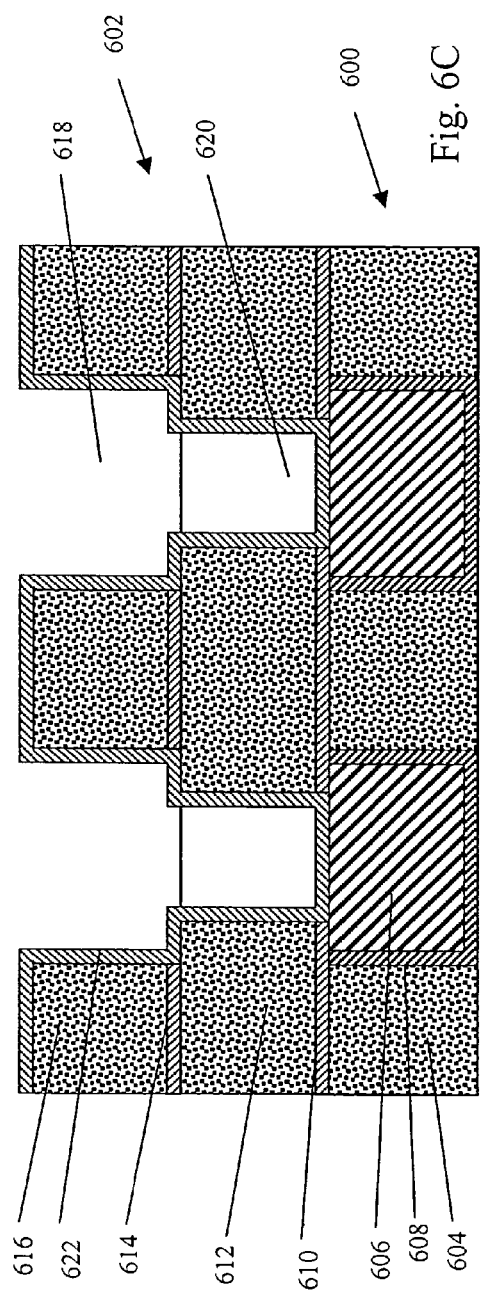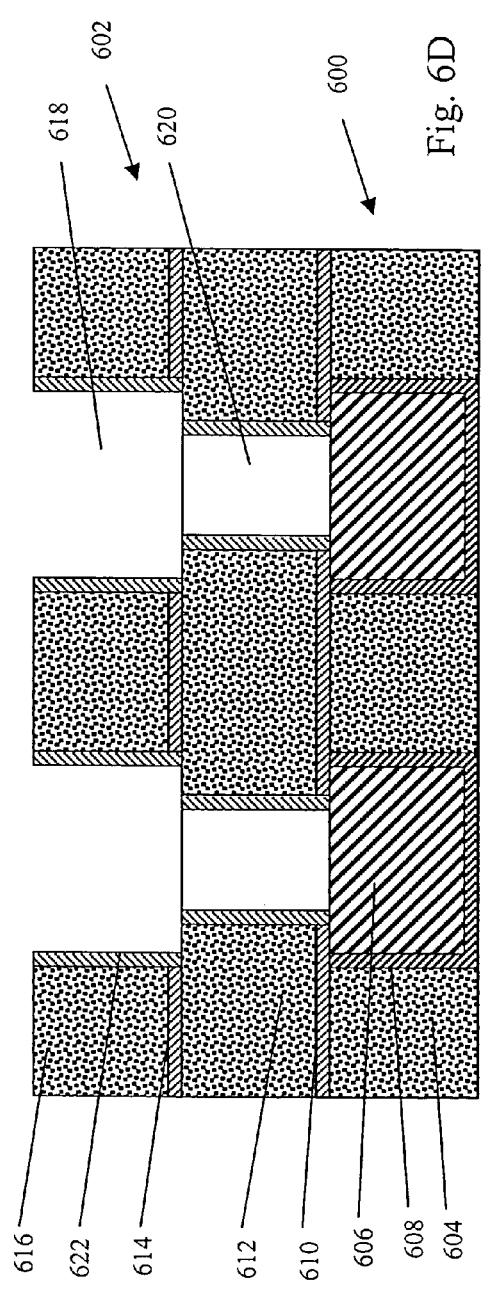

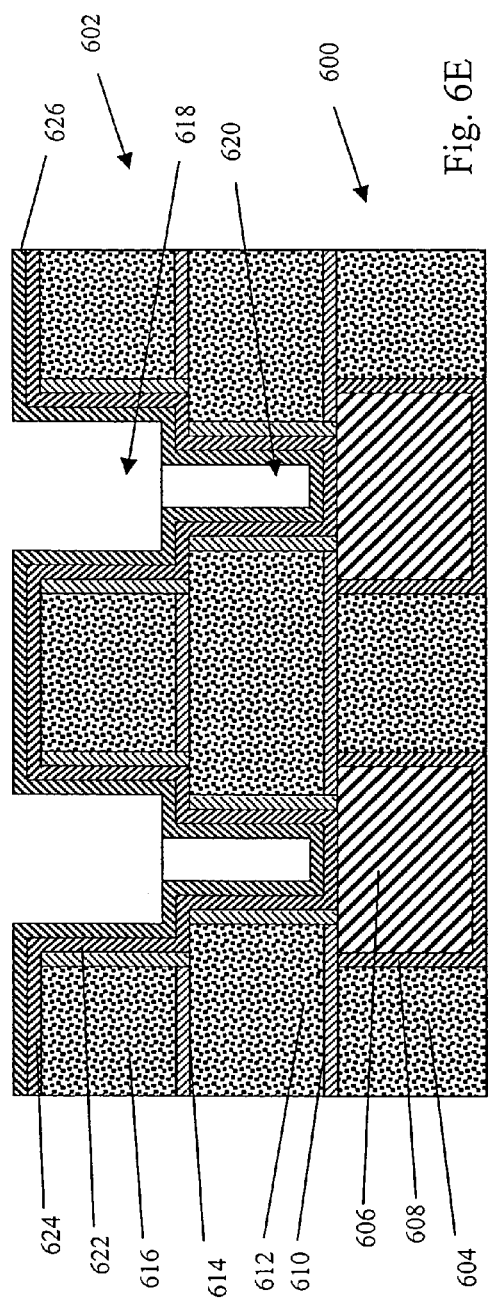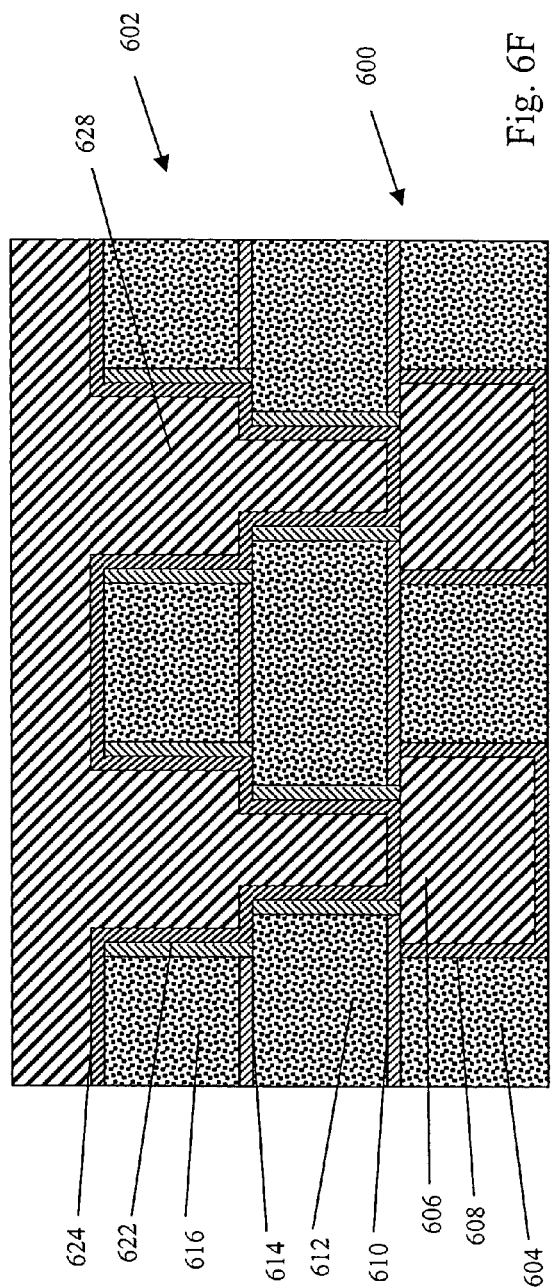
Fig. 6E
Fig. 6F

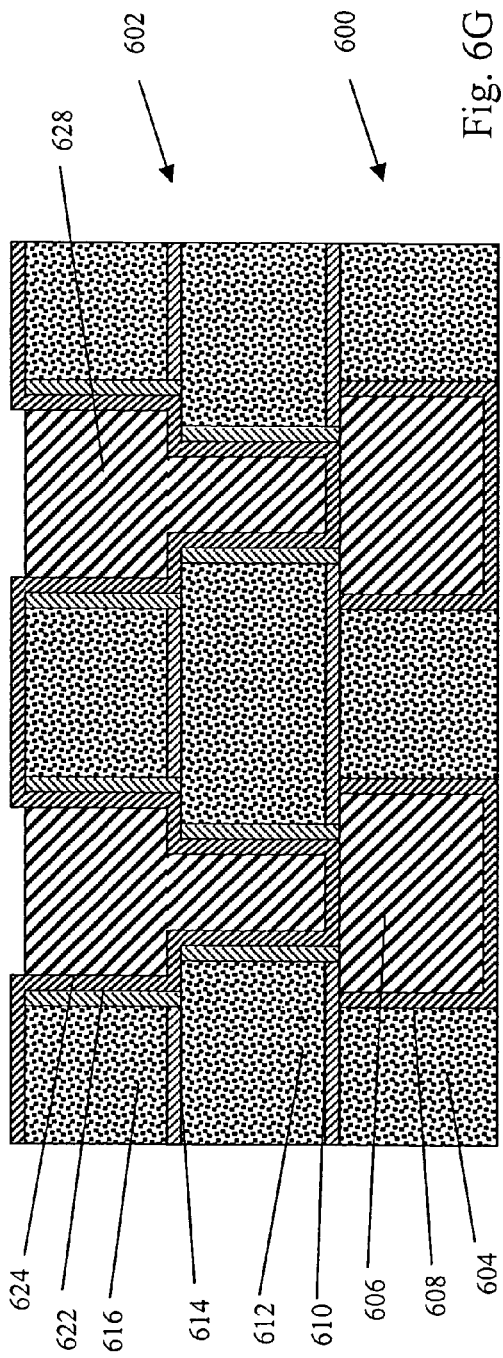
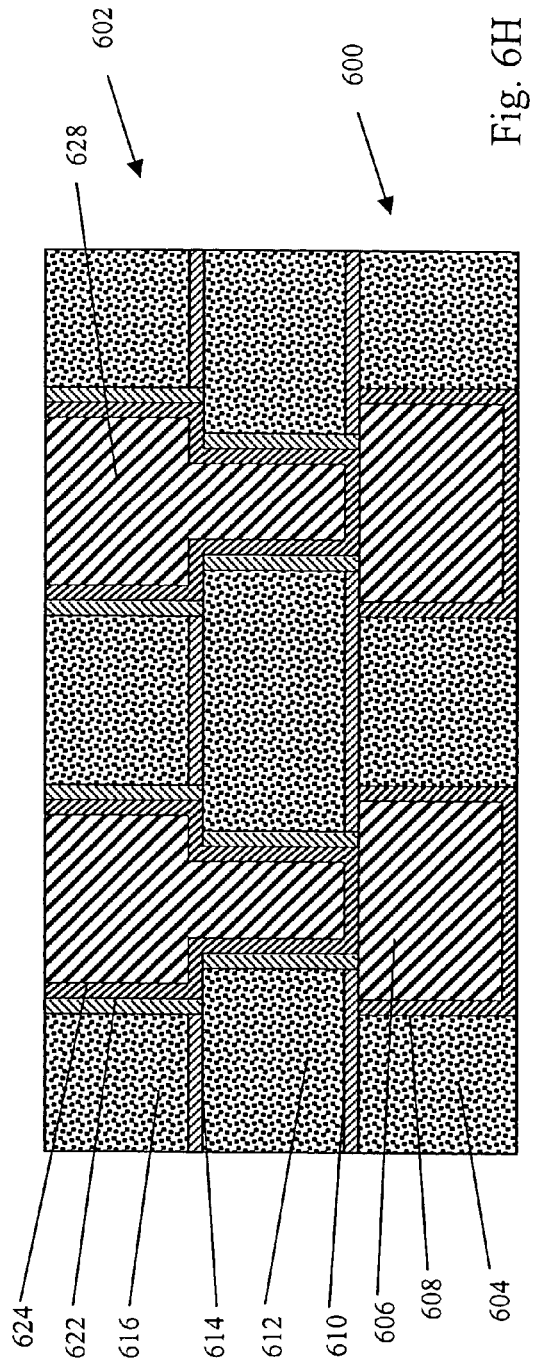
Fig. 6G
Fig. 6H

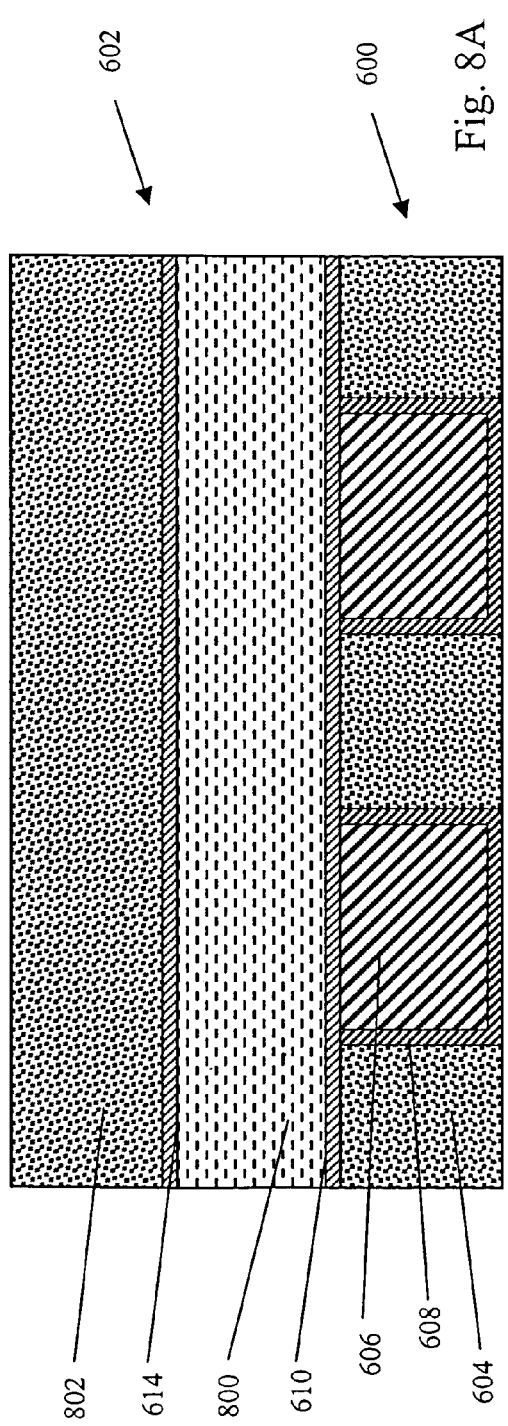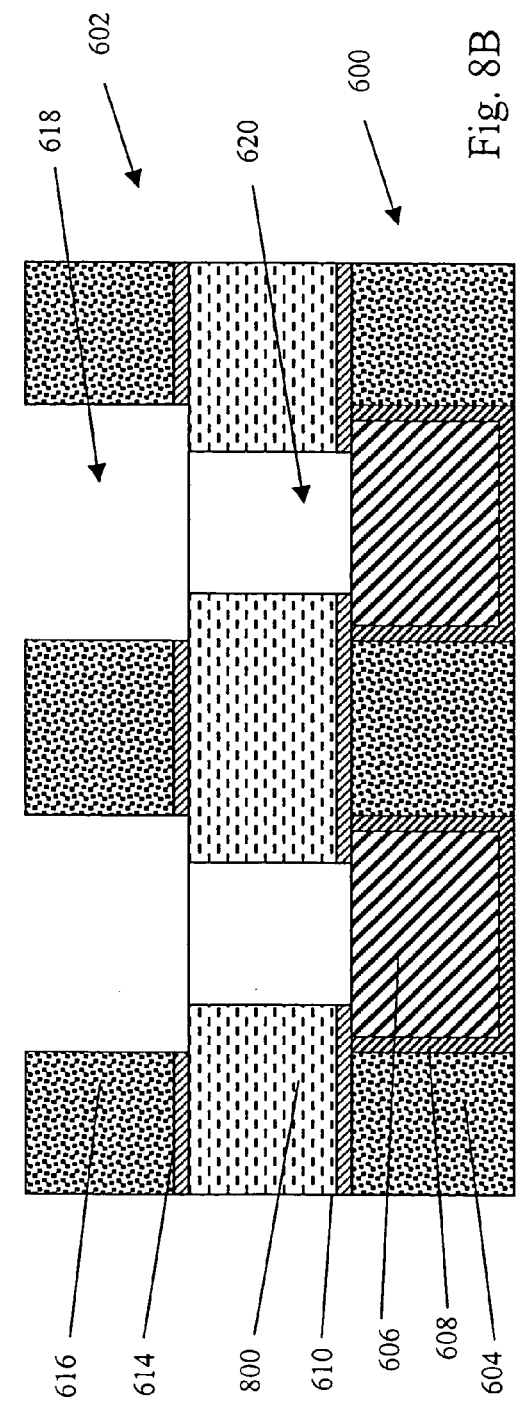
Fig. 8A
Fig. 8B

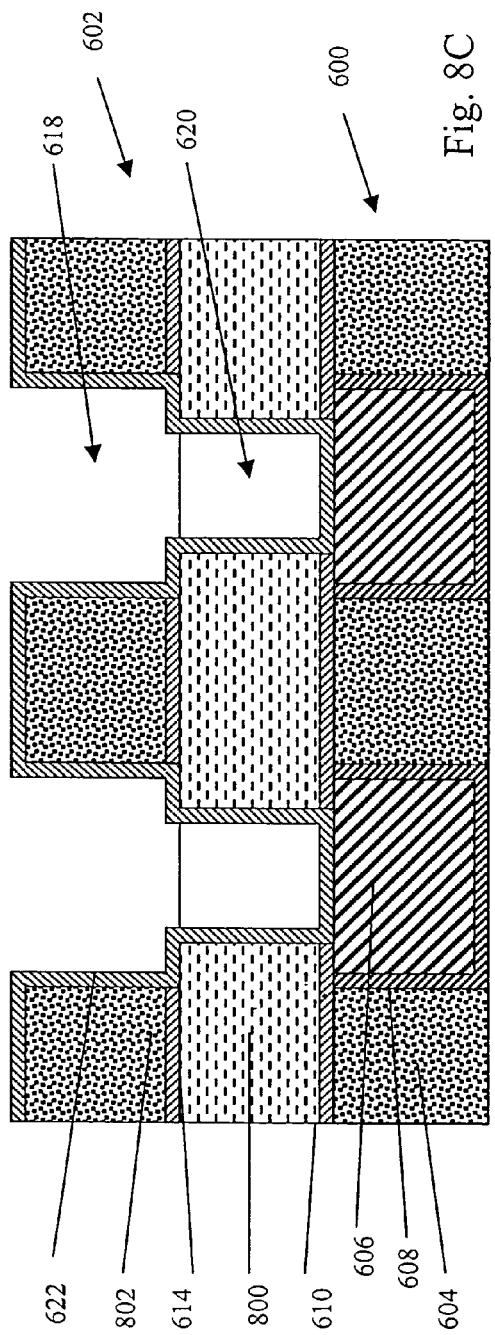
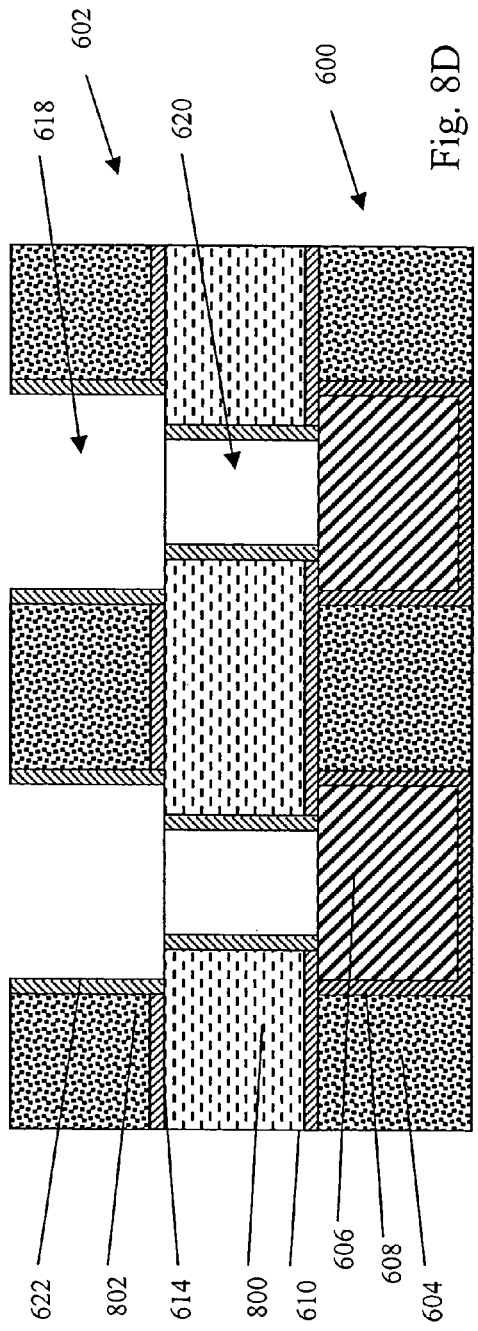

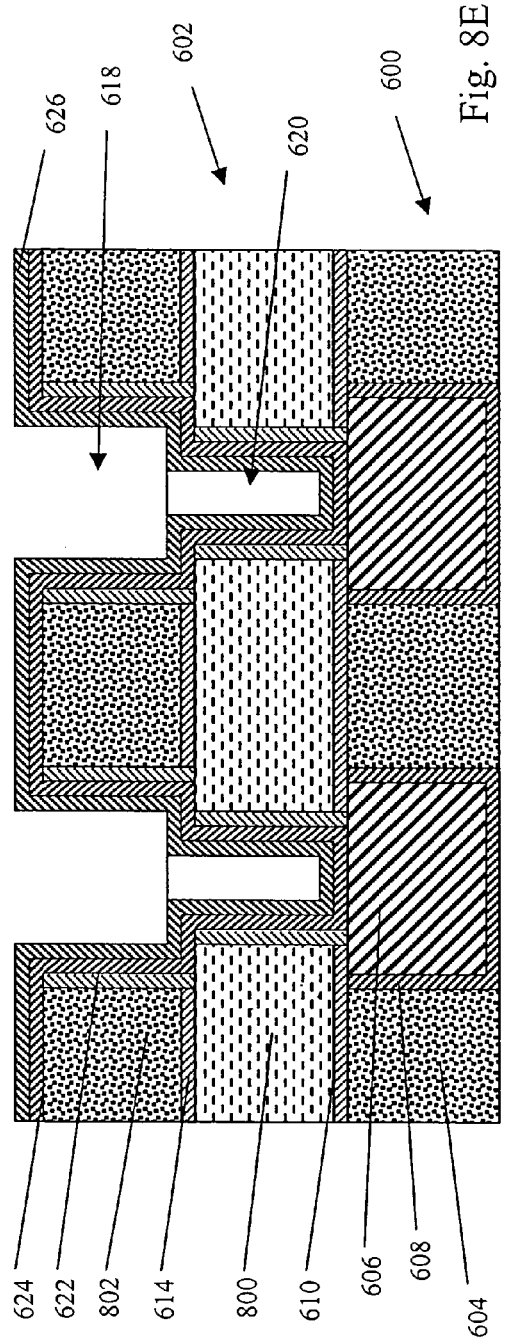
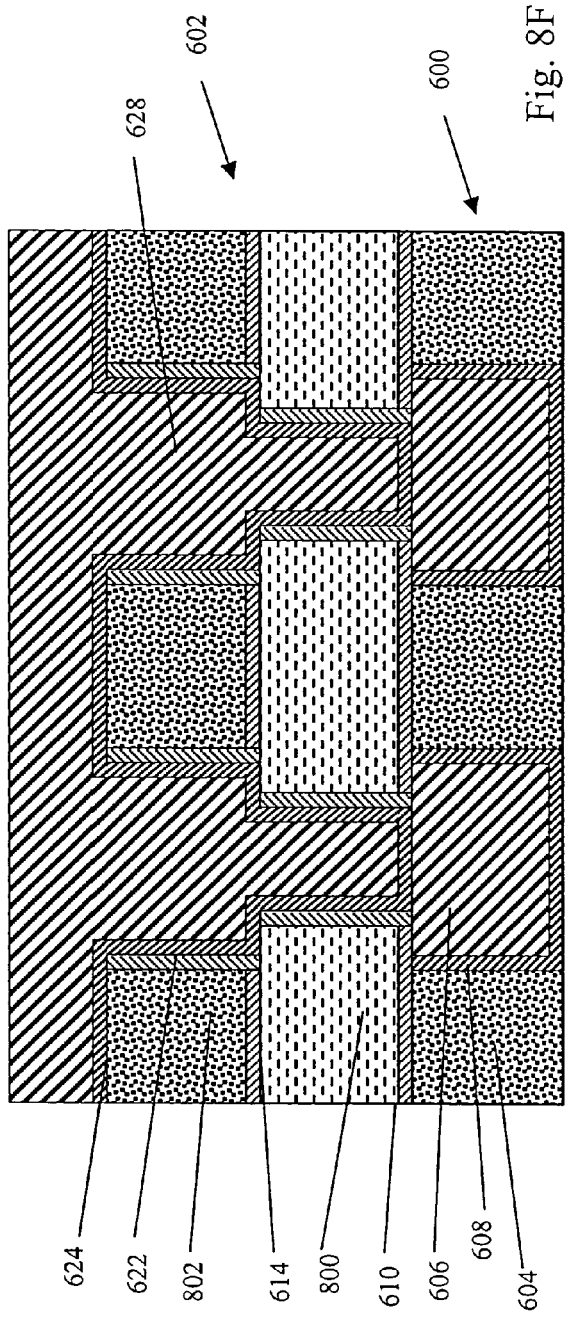

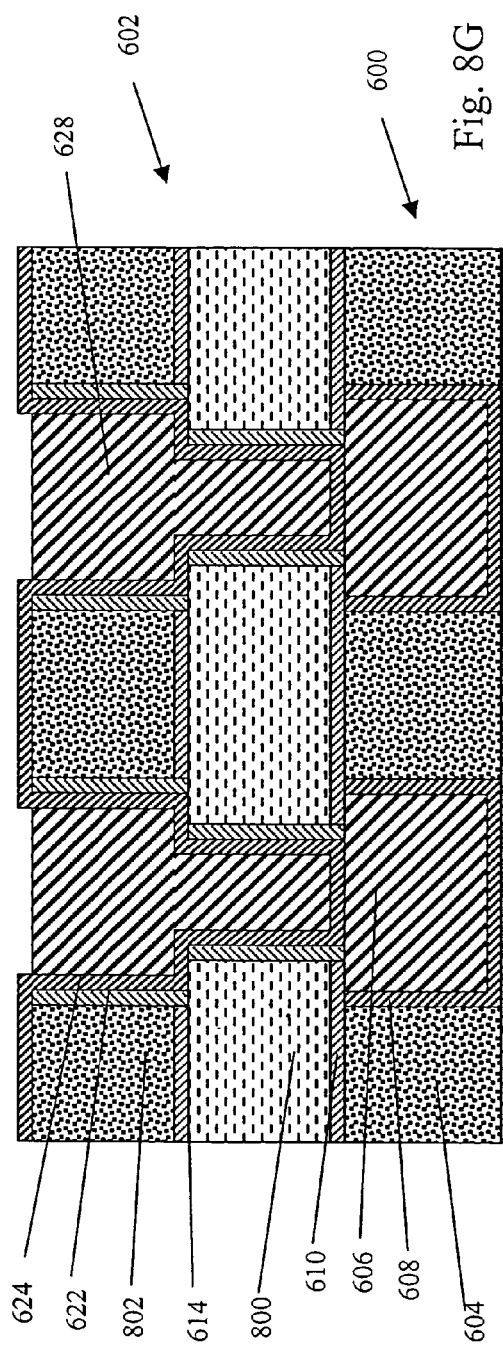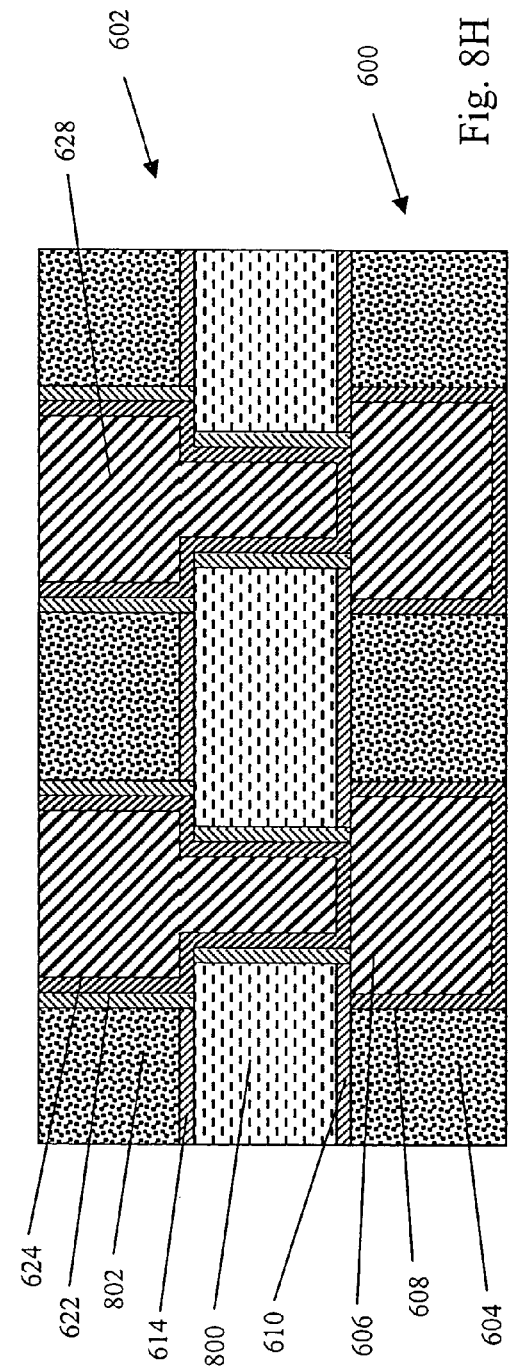

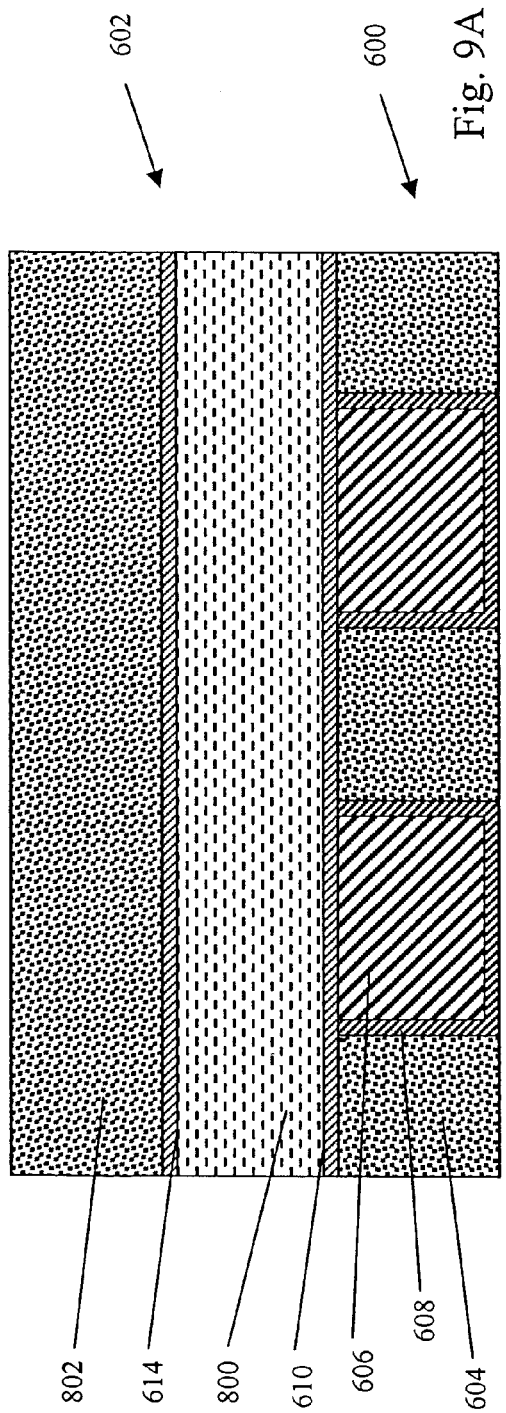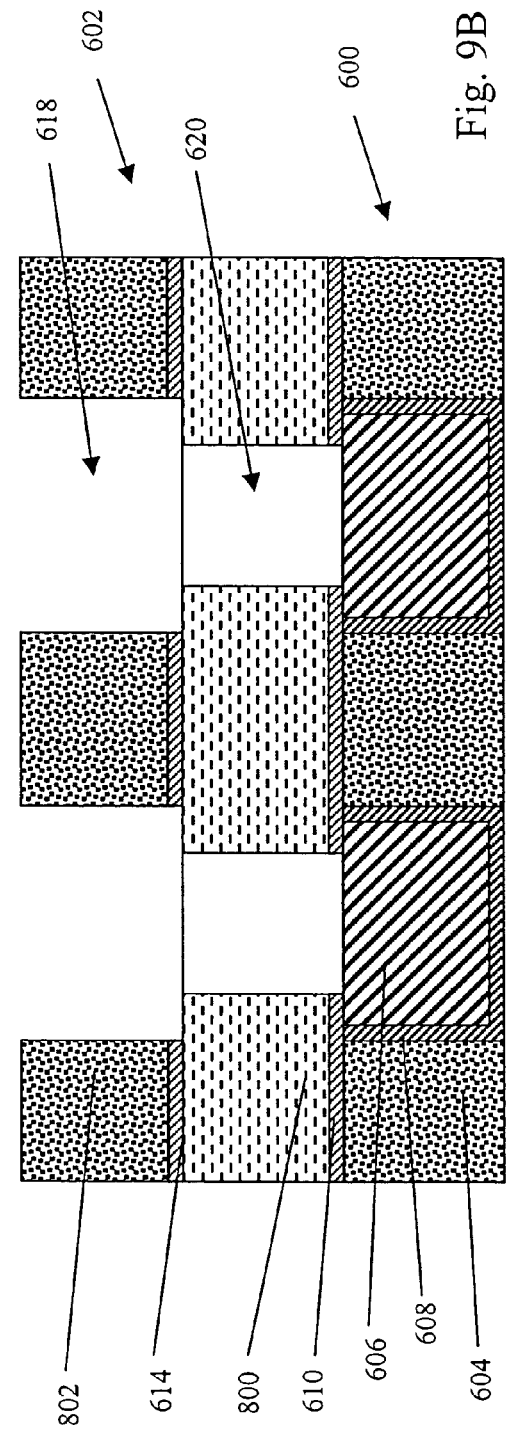
Fig. 9A
Fig. 9B

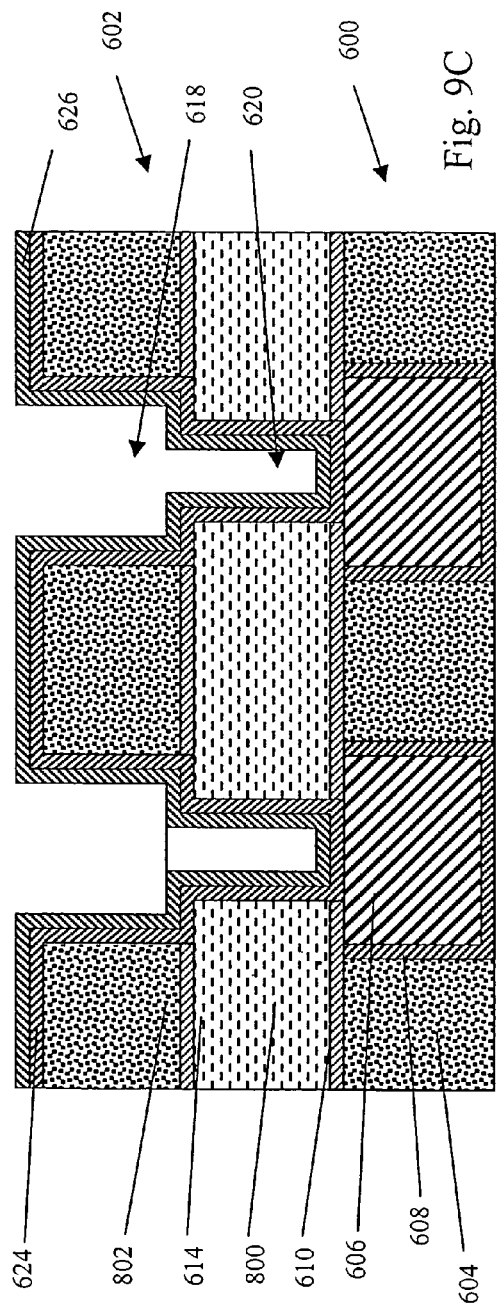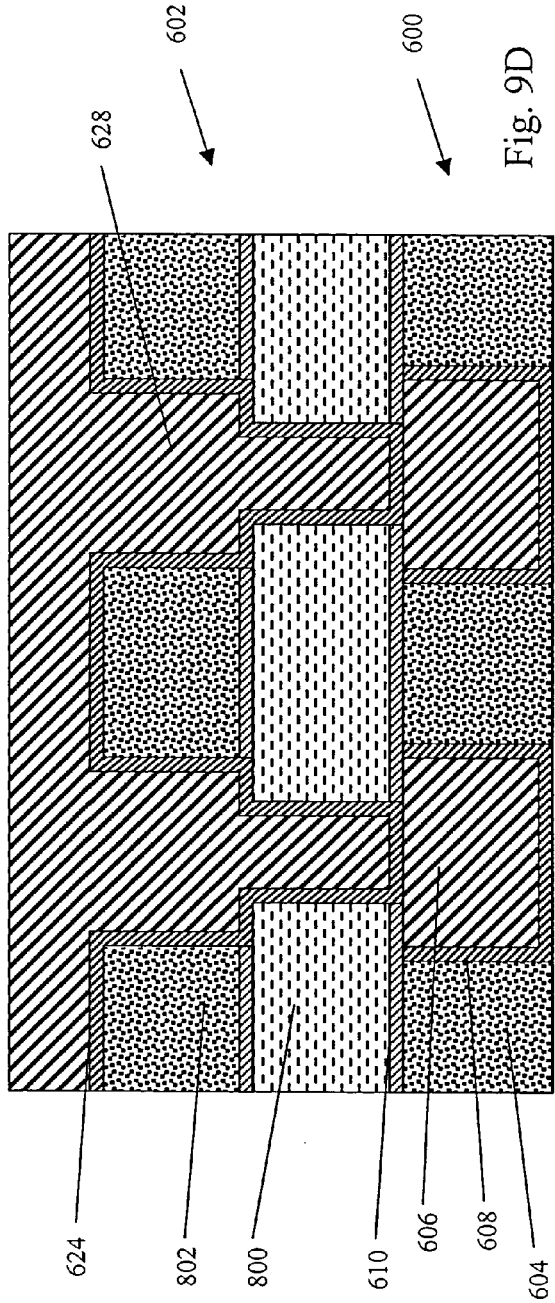

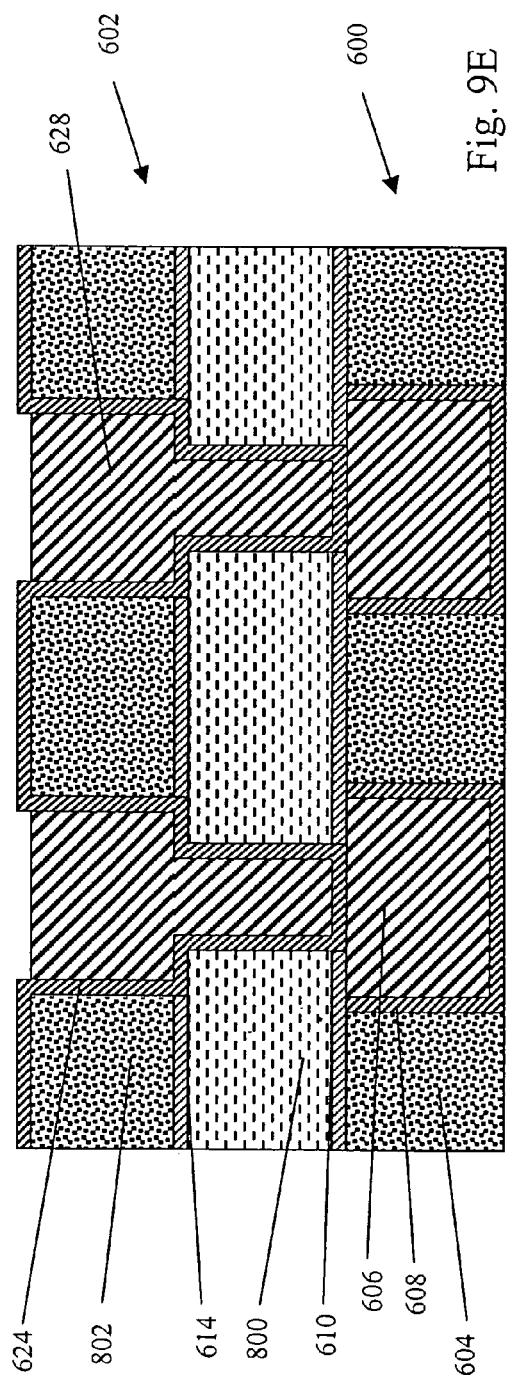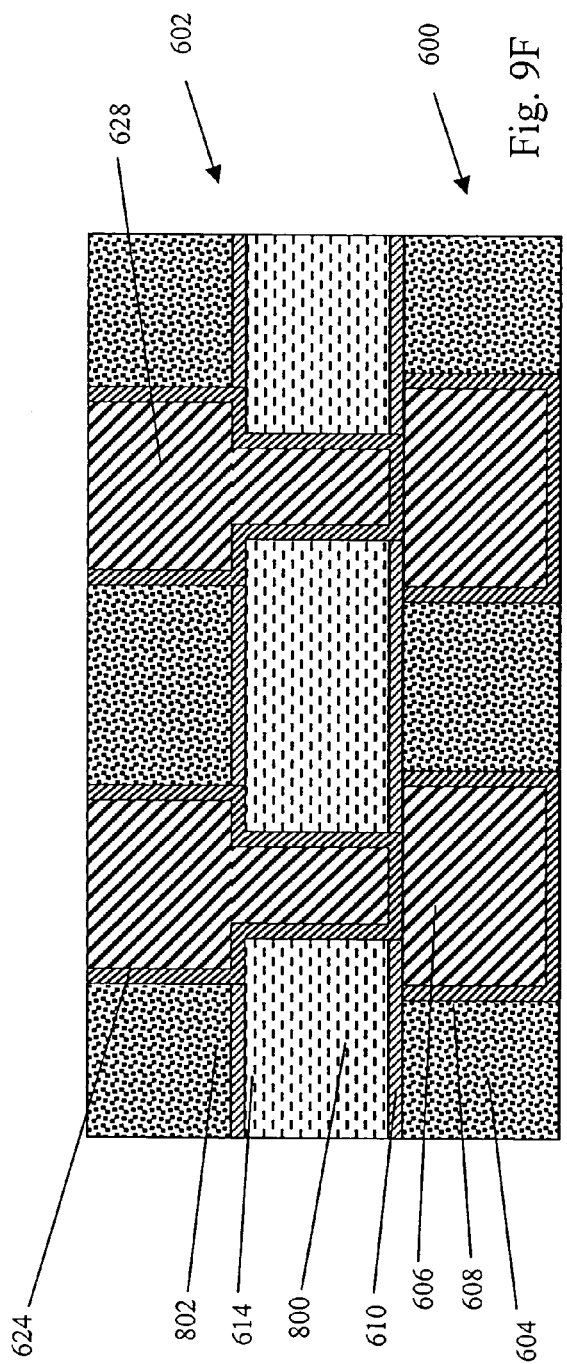

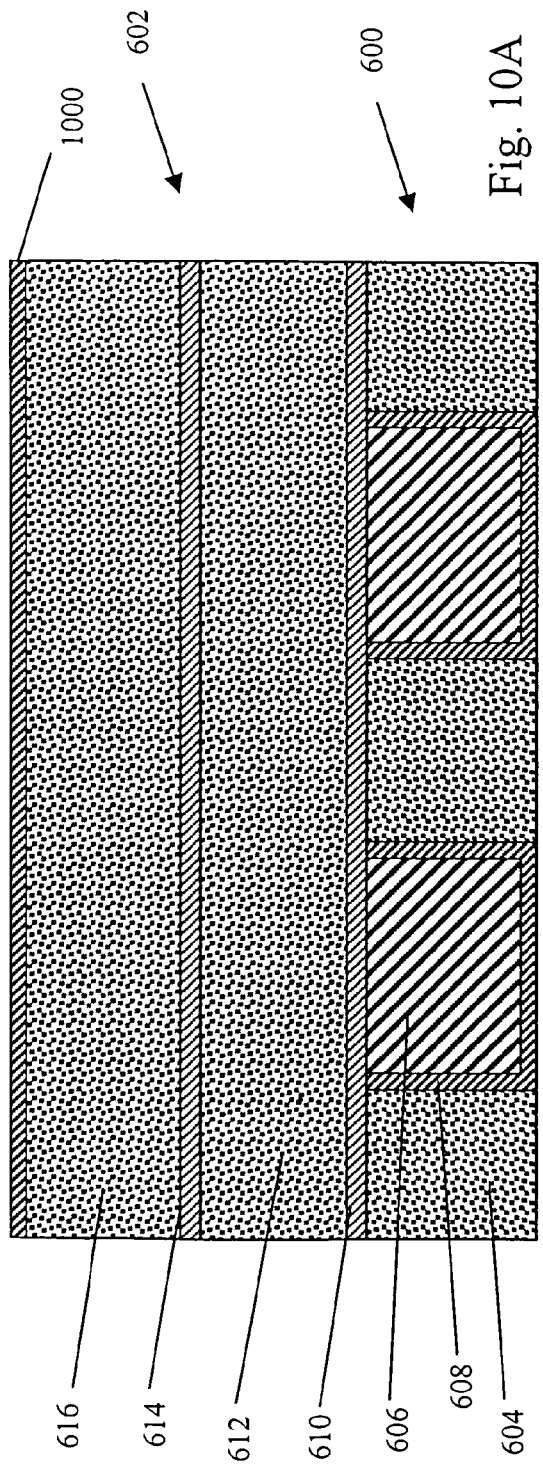
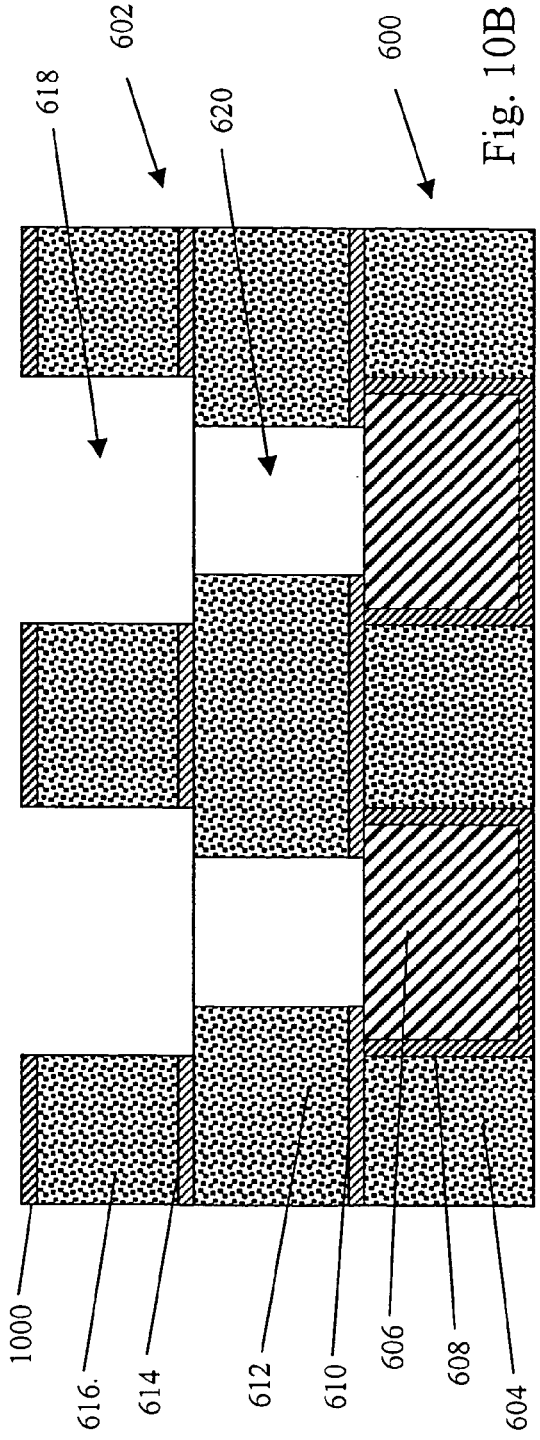

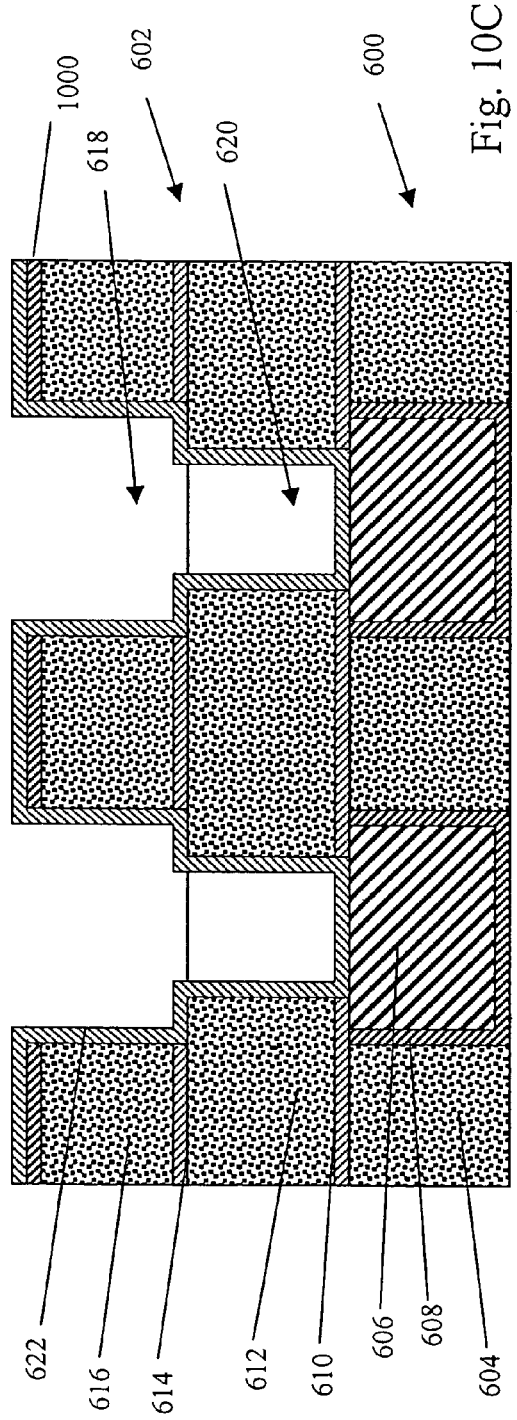
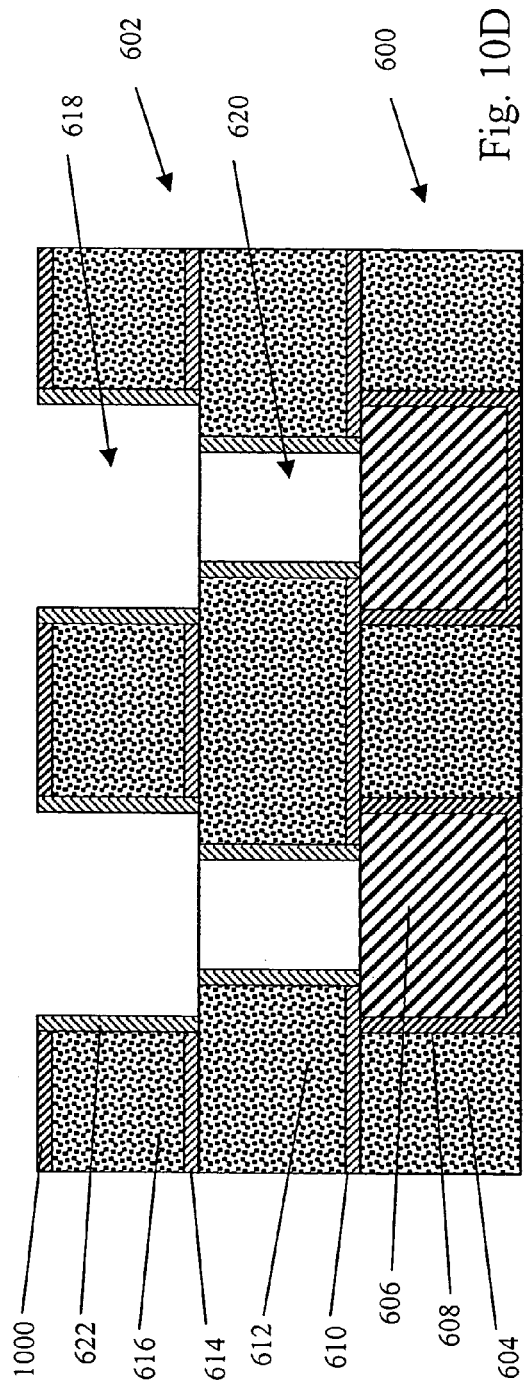
Fig. 10C
Fig. 10D

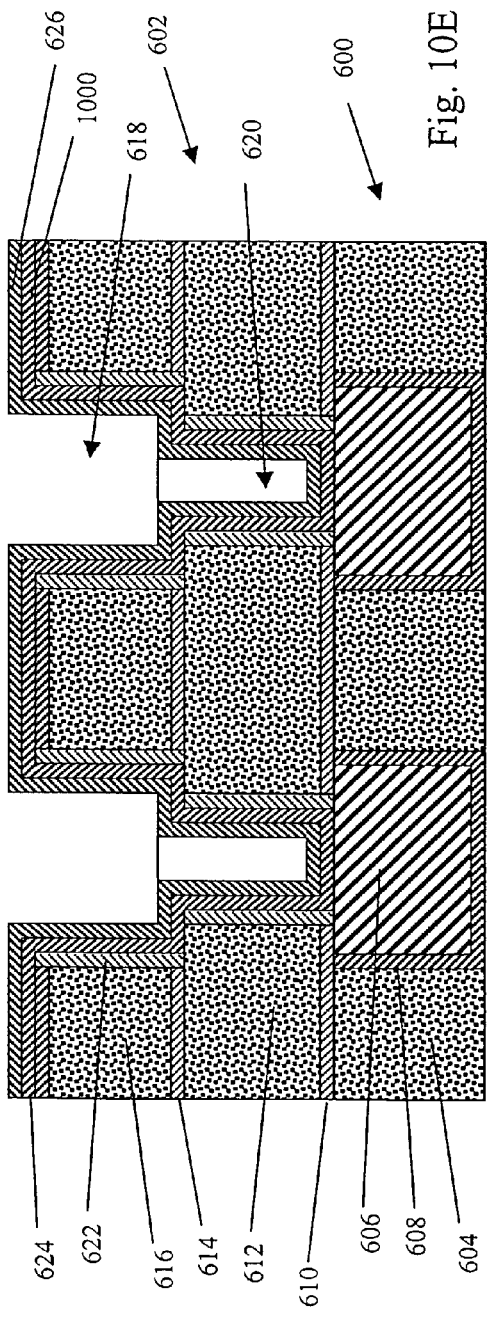
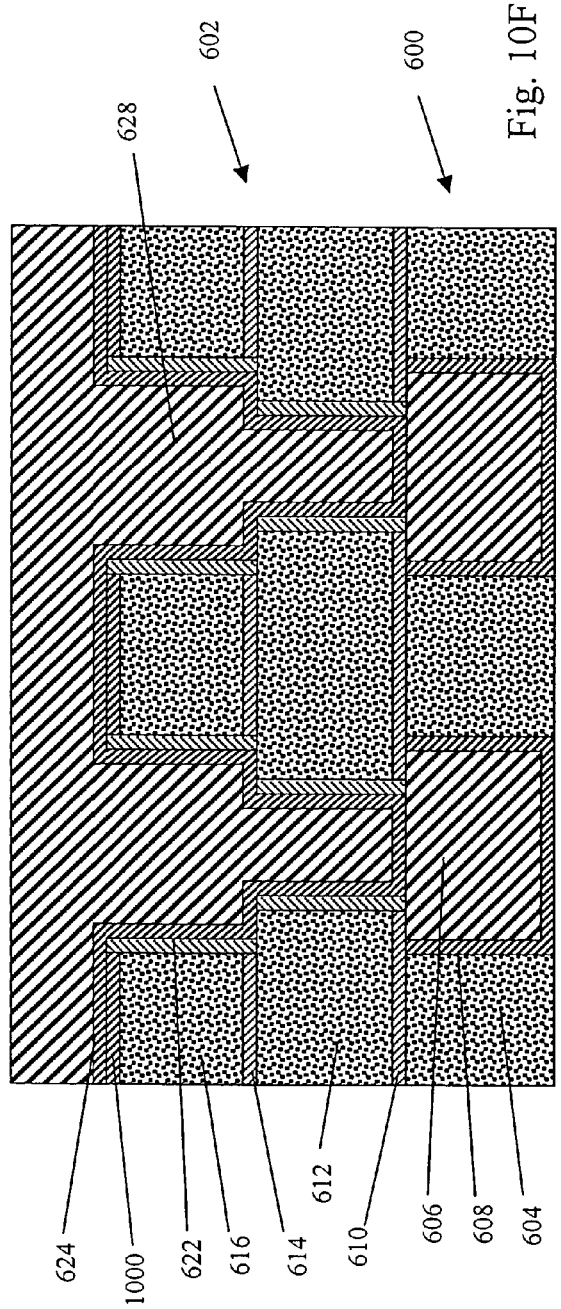

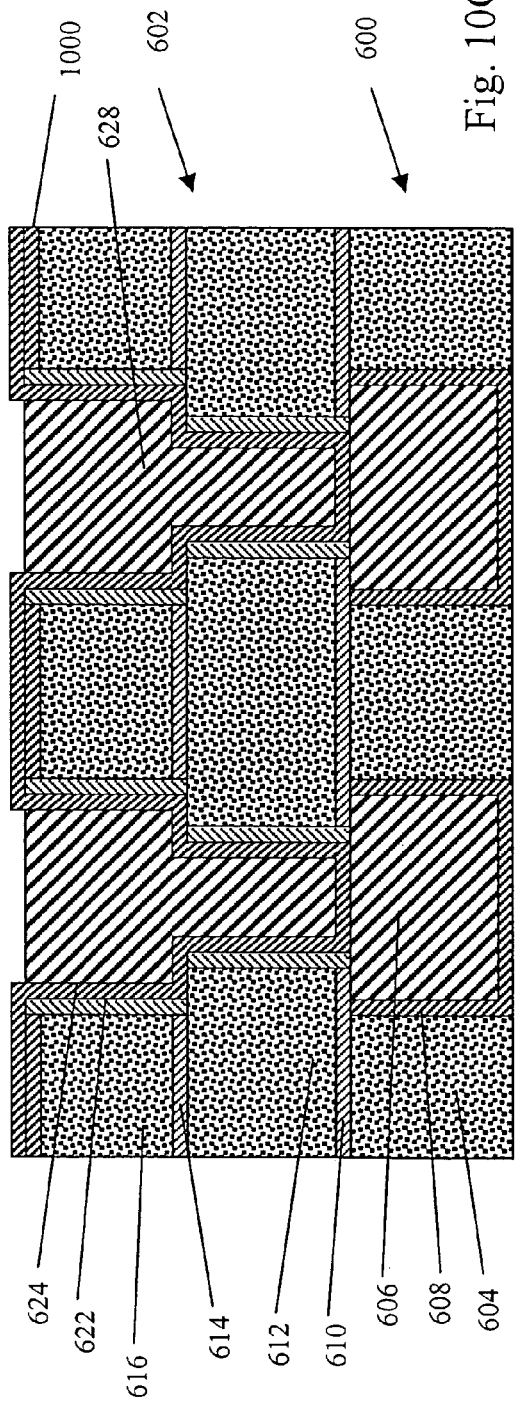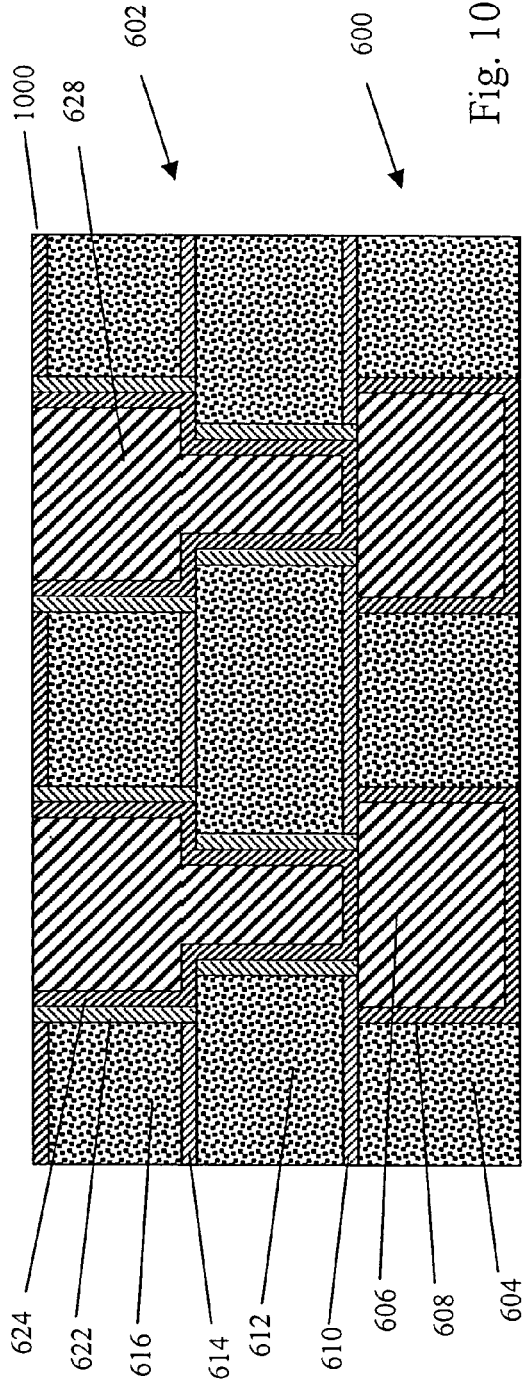
Fig. 10G
Fig. 10H

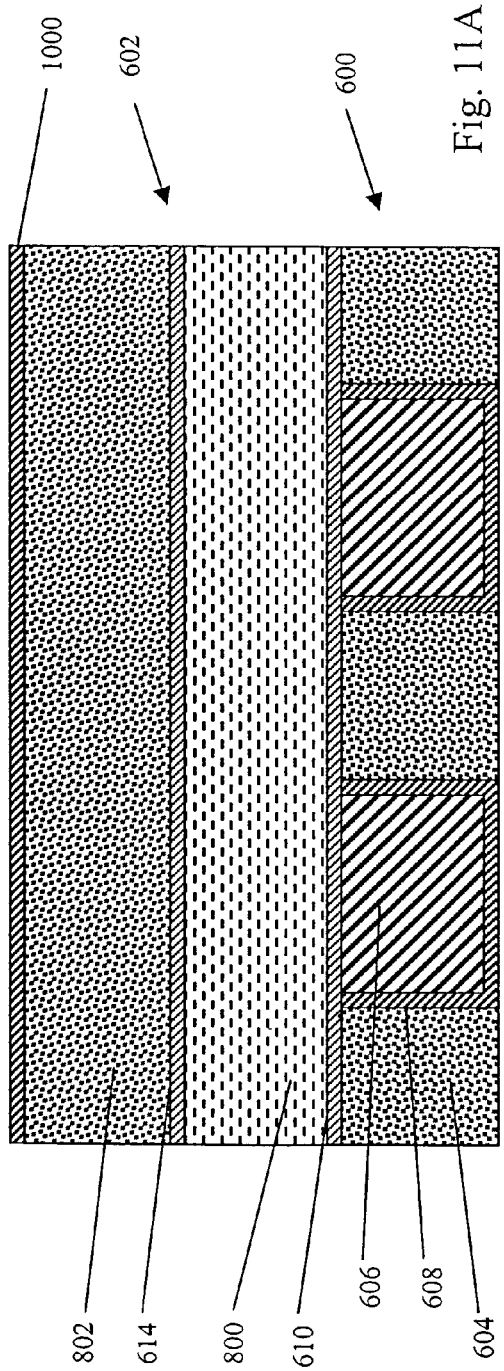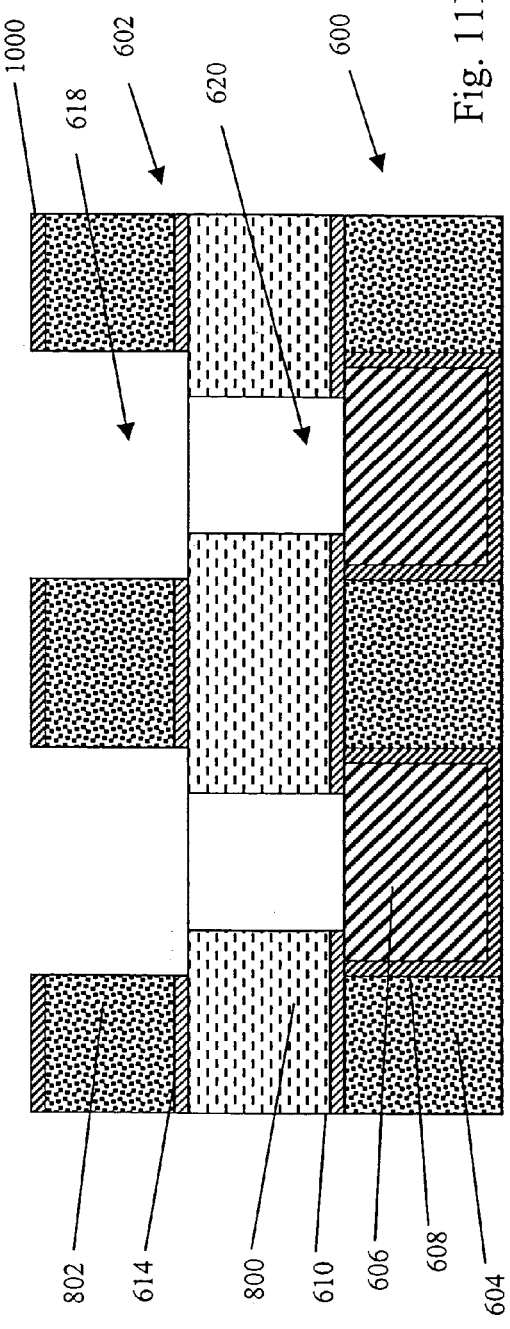

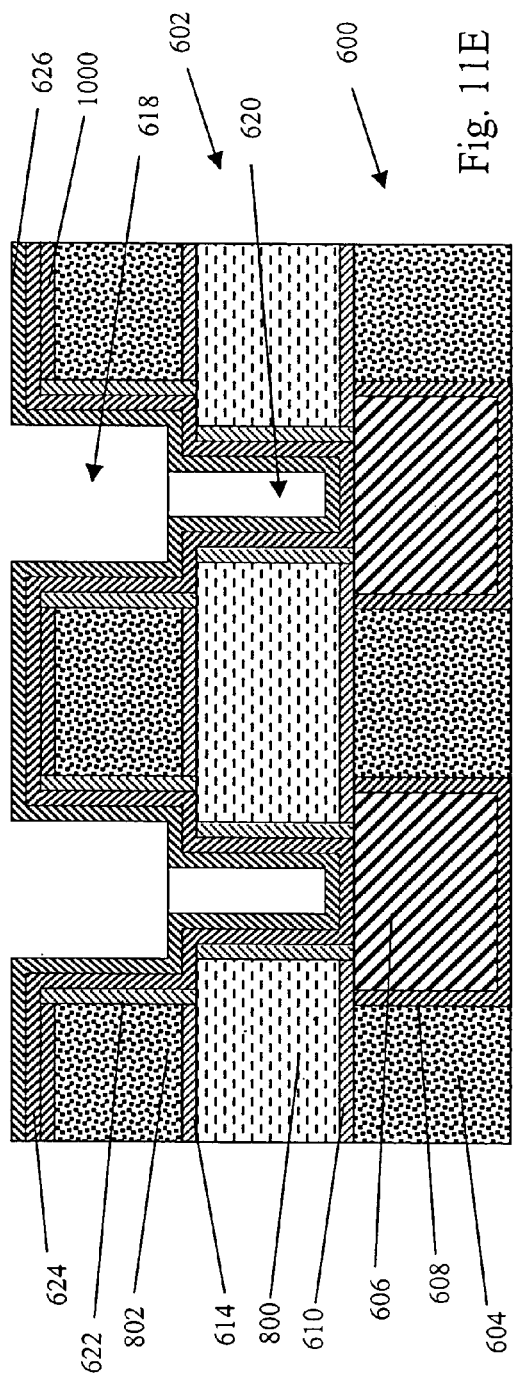
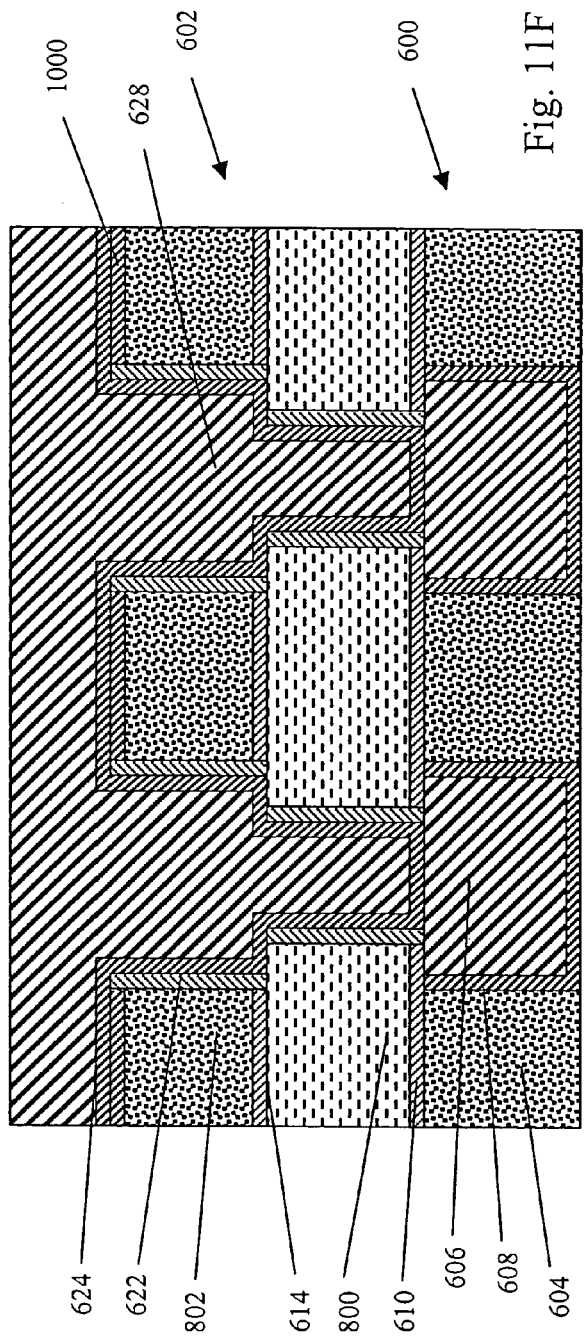

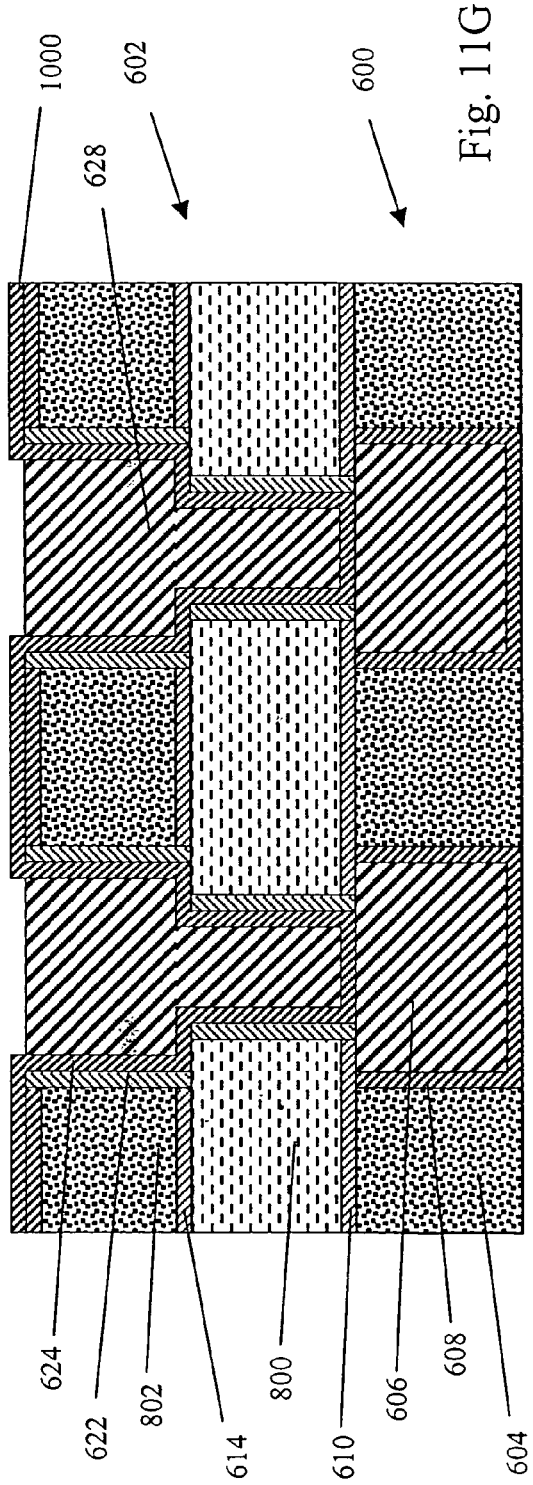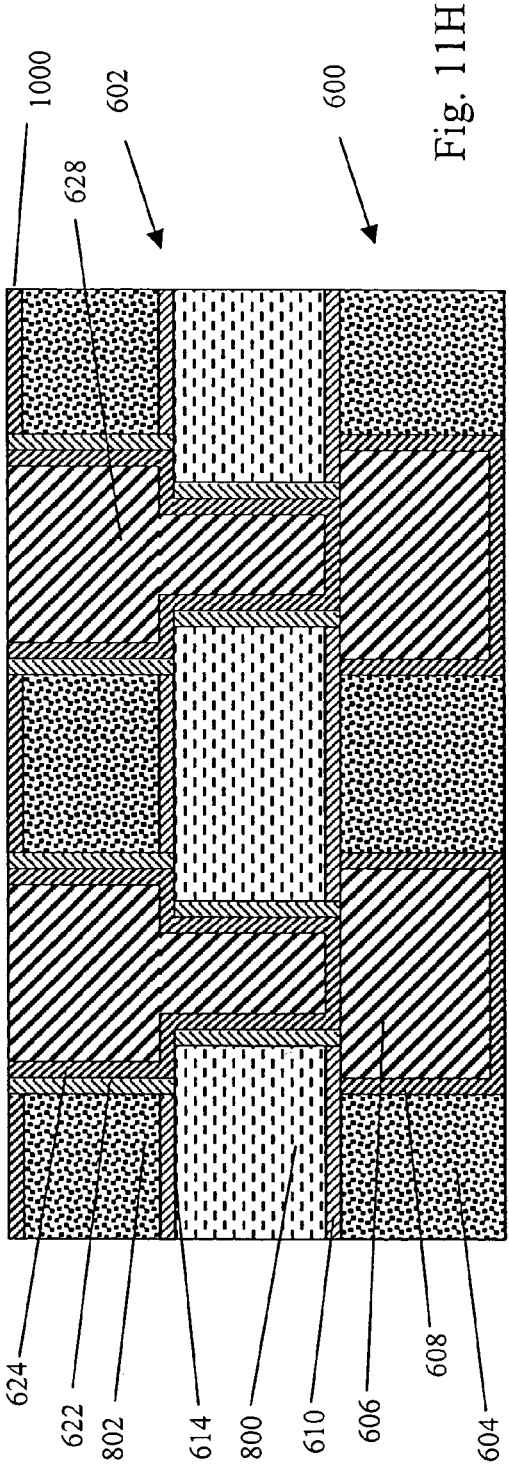

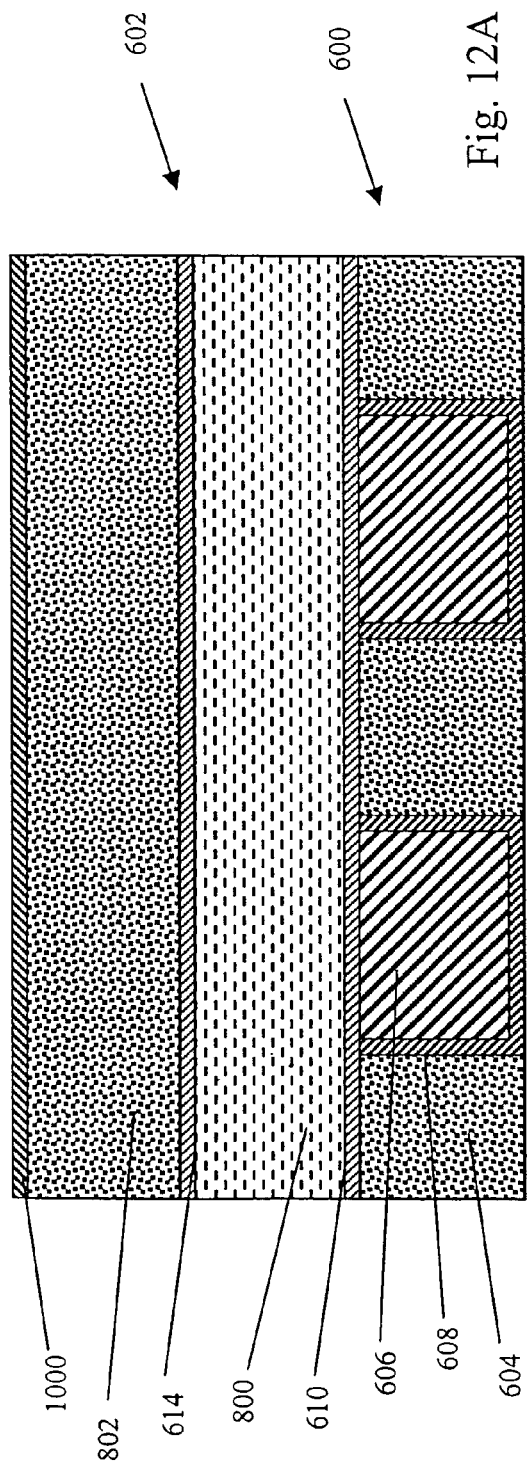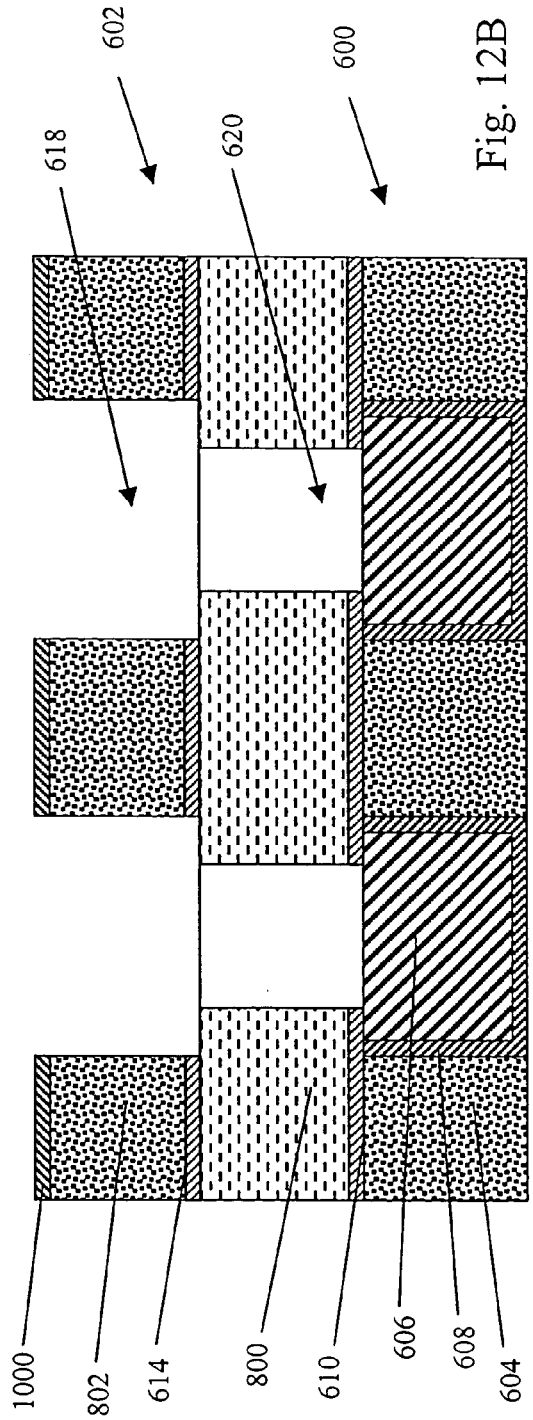
Fig. 12A
Fig. 12B

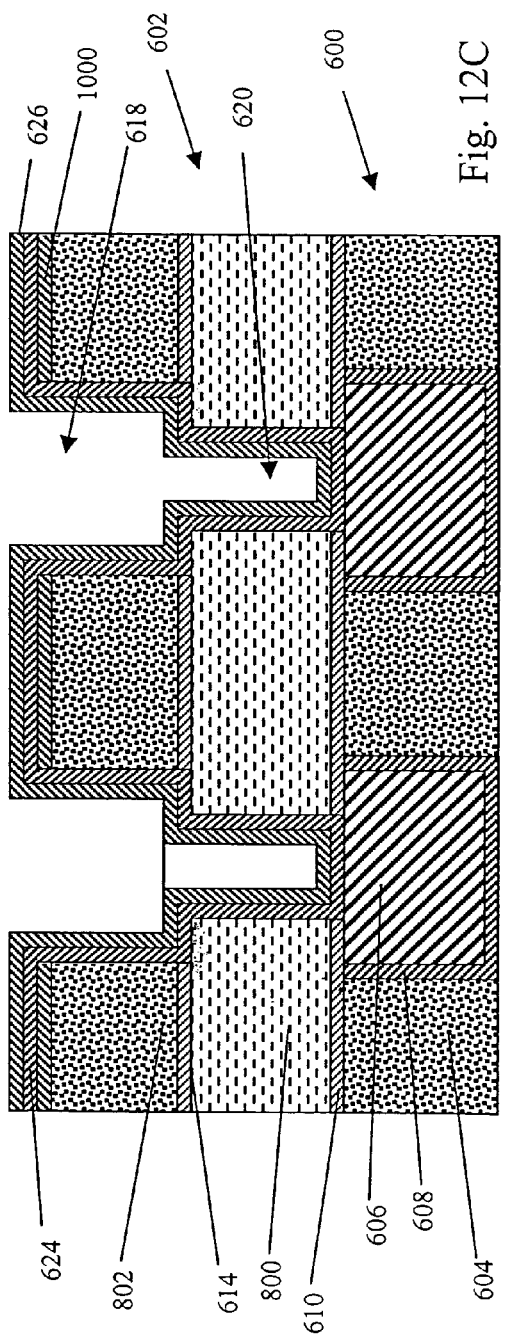
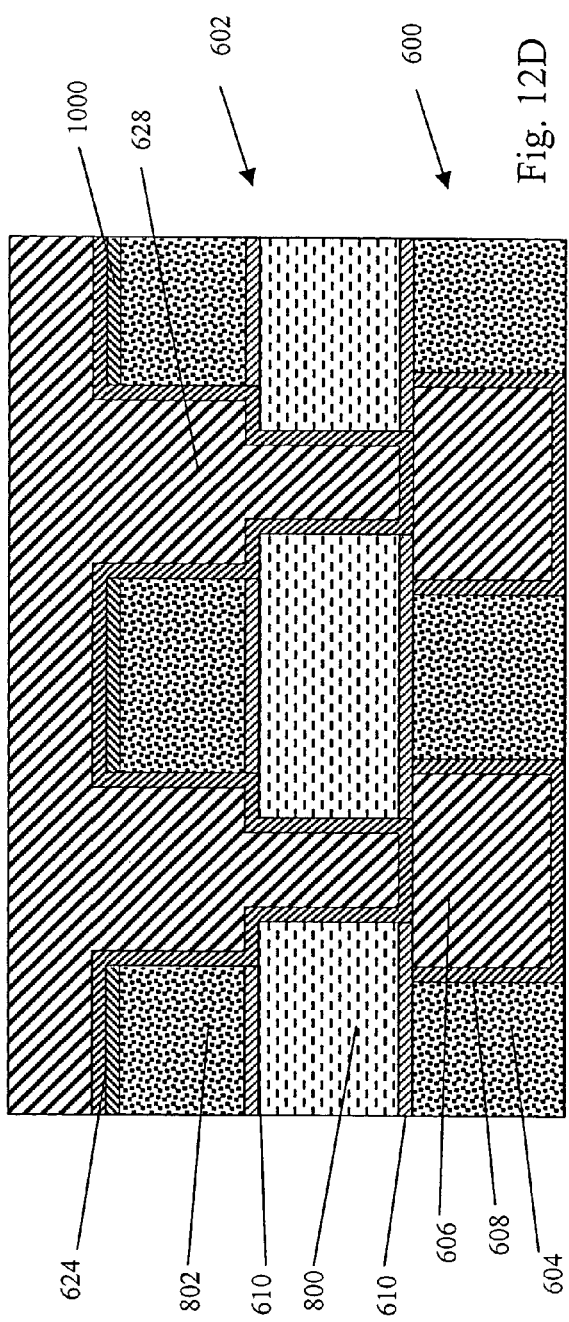
Fig. 12C
Fig. 12D

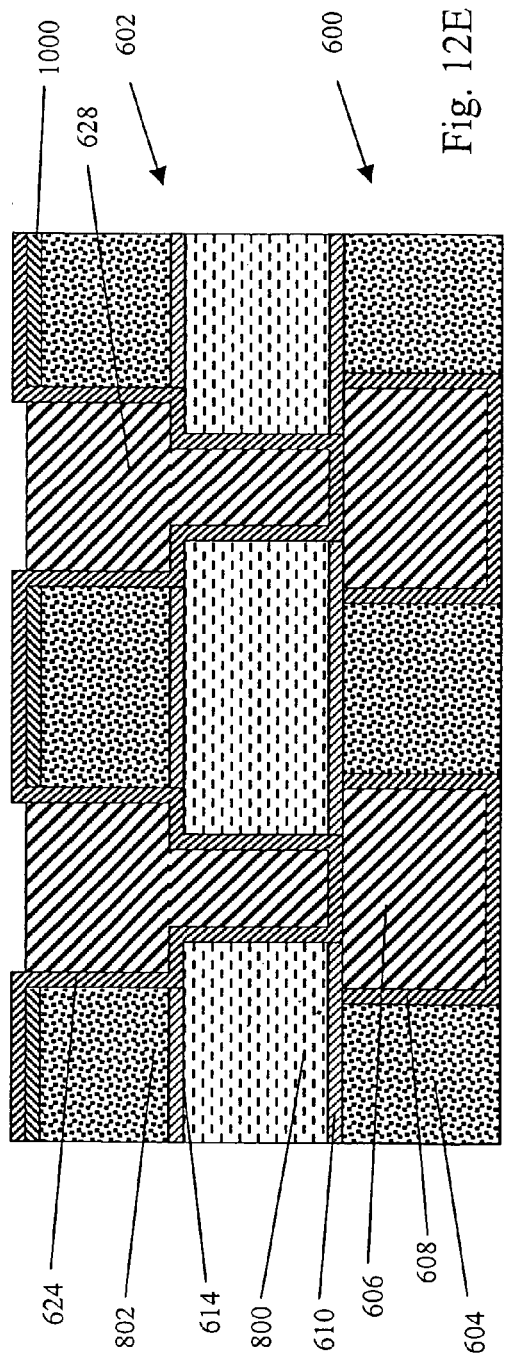
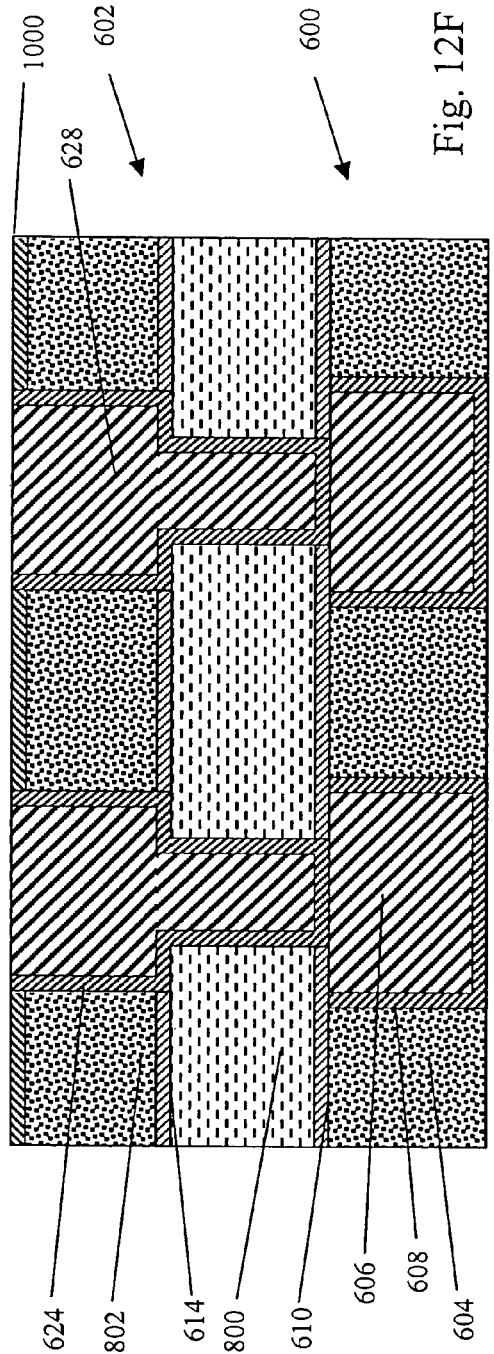

INTEGRATING METAL LAYERS WITH ULTRA LOW-K DIELECTRICS

CROSS-REFERENCE TO RELATED APPLICATIONS

The present application claims priority of an earlier filed provisional application U.S. Ser. No. 60/233,587, entitled METHOD FOR INTEGRATING COPPER WITH ULTRA-LOW K DIELECTRICS, filed on Sep. 18, 2000, the entire content of which is incorporated herein by reference.

BACKGROUND

1. Field of the Invention

The present invention generally relates to interconnections within layers of a semiconductor wafer. More particularly, the present invention relates to interconnections in low-K dielectric materials and ultra low-K dielectric materials.

2. Description of the Related Art

In general, semiconductor devices are manufactured or fabricated on disks of semiconducting materials called wafers or slices. More particularly, wafers are initially sliced from a silicon ingot. The wafers then undergo multiple masking, etching, and deposition processes to form the electronic circuitry of semiconductor devices.

During the past decades, the semiconductor industry has increased the power of semiconductor devices in accordance with Moore's law, which predicts that the power of semiconductor devices will double every 18 months. This increase in the power of semiconductor devices has been achieved in part by decreasing the feature size (i.e., the smallest dimension present on a device) of these semiconductor devices. In fact, the feature size of semiconductor devices has quickly gone from 0.35 microns to 0.25 microns, and now to 0.18 microns. Undoubtedly, this trend toward smaller semiconductor devices is likely to proceed well beyond the sub-0.18 micron stage.

However, one potential limiting factor to developing more powerful semiconductor devices is the increasing signal delays at the interconnections (the lines of conductors, which connect elements of a single semiconductor device and/or connect any number of semiconductor devices together). As the feature size of semiconductor devices has decreased, the density of interconnections on the devices has increased. The closer proximity of interconnections, however, increases the line-to-line capacitance of the interconnections, which results in greater signal delay at the interconnections. In general, interconnection delays have been found to increase with the square of the reduction in feature size. In contrast, gate delays have been found to decrease linearly with the reduction in feature size. As such, there is generally a net increase in overall delays with a reduction in feature size.

One conventional approach to compensate for this increase in interconnection delay has been to add more layers of metal. However, this approach has the disadvantage of increasing production costs associated with forming the additional layers of metal. Furthermore, these additional layers of metal generate additional heat, which can be adverse to both chip performance and reliability.

An alternative approach to compensate for the increase in interconnection delay is to use dielectric materials having low dielectric constants (low-K dielectrics). However, because low-K dielectric materials have porous microstructures, they also have lower mechanical integrity and thermal conductivity than other dielectric materials. Consequently, low-K dielectric materials typically cannot sustain the stress and pressure applied to them during a conventional damascene process.

In a conventional damascene process, metal is patterned within canal-like trenches and/or via. The deposited metal is then typically polished back using chemical mechanical polishing (CMP). In general, depending on the interconnection structure design, anywhere from half a micron to 1.5 millimeters of metal can be polished.

However, when metal is patterned within trenches and/or via of a low-K dielectric material, and then polished back using CMP, the low-K dielectric material can fracture or pull away from the metal within the trenches and/or via due to the stress and pressure of CMP. Consequently, strong or rigid structures have been formed within the low-K dielectric materials to help them sustain the stress and pressure applied during CMP. However, building such structures within the low-K dielectric materials can be costly and can increase the interconnection delays within the device that the low-K dielectric materials were intended to reduce.

SUMMARY

The present invention relates to forming a layer of a semiconductor wafer. In accordance with one aspect of the present invention, a dielectric layer is deposited on the semiconductor wafer. The dielectric layer includes material having a low dielectric constant. Recessed and non-recessed areas are formed in the dielectric layer. A metal layer is deposited on the dielectric layer to fill the recessed areas and cover the non-recessed areas. The metal layer is then electropolished to remove the metal layer covering the non-recessed areas while maintaining the metal layer in the recessed areas.

DESCRIPTION OF THE DRAWING FIGURES

The present invention can be best understood by reference to the following detailed description taken in conjunction with the accompanying drawing figures, in which like parts may be referred to by like numerals:

FIGS. 2A–2H illustrate, in cross-sectional view, an exemplary embodiment of the various steps of a damascene process;

FIGS. 5A–5H illustrate, in cross-sectional view, an alternative embodiment of the various steps of a damascene process;

FIGS. 6A–6J illustrate, in cross-sectional view, an exemplary embodiment of the various steps of a damascene process;

FIGS. 8A–8J illustrate, in cross-sectional view, another exemplary embodiment of the various steps of a damascene process;

FIGS. 9A–9H illustrate, in cross-sectional view, another exemplary embodiment of the various steps of a damascene process;

FIGS. 10A–10J illustrate, in cross-sectional view, an alternative embodiment of the various steps of a damascene process;

FIGS. 11A–11J illustrate, in cross-sectional view, another alternative embodiment of the various steps of a damascene process;

FIGS. 12A–12H illustrate, in cross-sectional view, another alternative embodiment of the various steps of a damascene process.

DETAILED DESCRIPTION

In order to provide a more thorough understanding of the present invention, the following description sets forth numerous specific details, such as specific configurations, parameters, examples, and the like. It should be recognized, however, that such description is not intended as a limitation on the scope of the present invention, but is intended to provide a better description of the exemplary embodiments.

Figure 1:
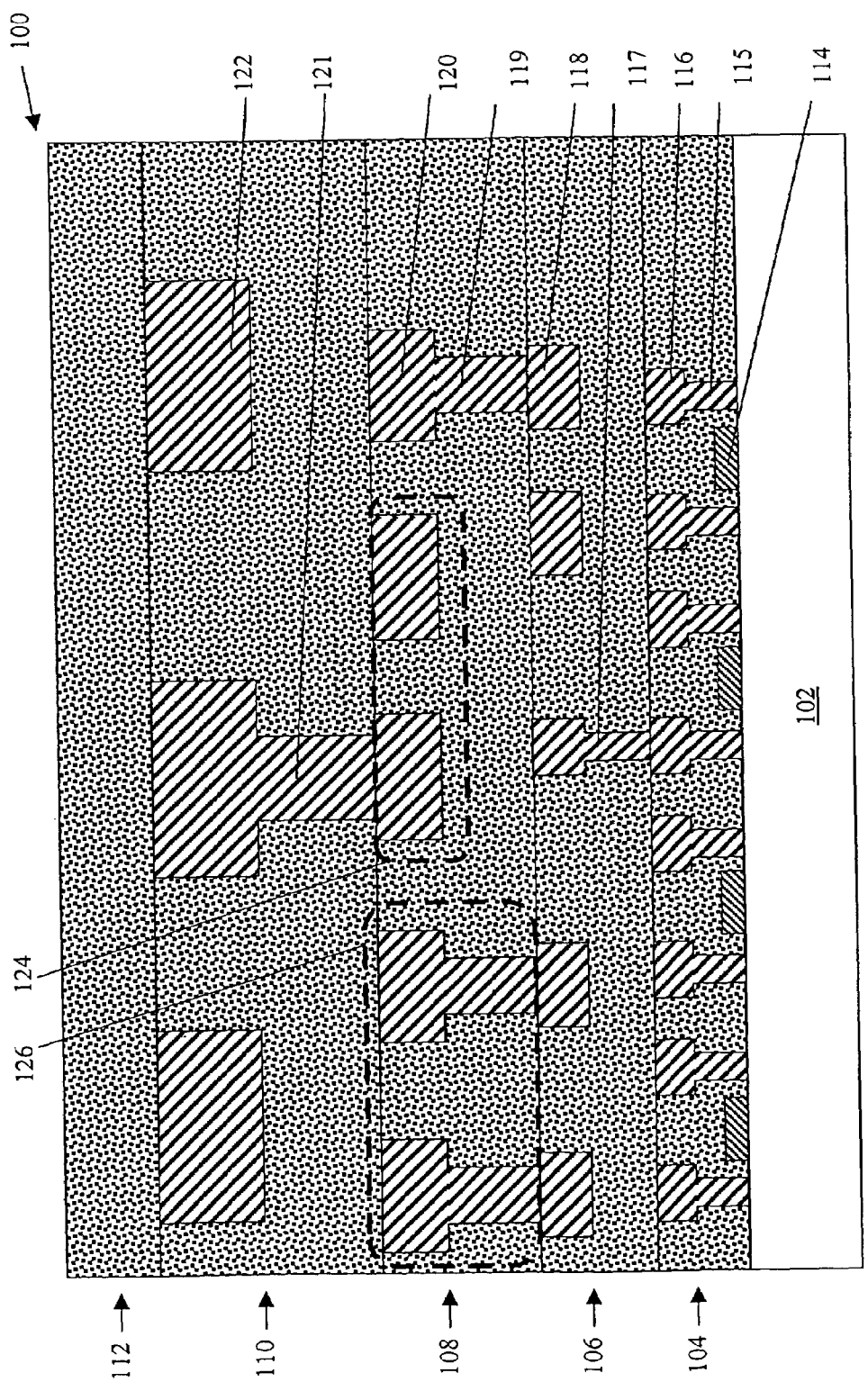
FIG. 1 is a cross-sectional view of an exemplary semiconductor wafer.

With reference to FIG. 1, an exemplary semiconductor wafer 100 is depicted having layers 104, 106, 108, 110, and 112 formed on a substrate 102. Substrate 102 preferably includes silicon, but can include various semiconductor materials, such as gallium arsenide and the like, depending on the particular application. Furthermore, layer 104 can include gates 114, lines 116, and plugs 115. Similarly, layers 106, 108, and 110 can include lines 118, 120, 122, and plugs 117, 119, 121, respectively.

Generally, plugs can connect lines in different layers, and can connect lines to substrate 102, as shown in layer 104. More particularly, plugs can connect lines to sources and drains in substrate 102 that are associated with gates 114. Additionally, although some of the lines in layers 106, 108, and 110 do not connect to plugs in this cross-section, these lines can have plugs connecting to them in other cross-sections. Furthermore, as shown, lines can be wider than the plugs connected to them. However, it should be recognized that, in some applications, lines may not necessarily be wider than the plugs connected to them.

Furthermore, it should be recognized that although semiconductor wafer 100 is shown in FIG. 1 with five layers 104, 106, 108, 110, and 112 formed on substrate 102, semiconductor wafer 100 can include any number of layers formed on substrate 102. Moreover, it should be recognized that semiconductor wafer 100 can include any number of gates, lines, and plugs within these layers.

In FIGS. 2A–2H, cross-sectional views of a layer 202 are shown to illustrate various steps of an exemplary damascene process used to form lines, such as lines 120 in section 124 of FIG. 1. More particularly, as will be described in greater detail below, in a damascene process, canal-like trenches and via are formed in a dielectric layer. The trenches and via are filled with a conducting material to form lines and plugs, respectively. It should be noted, however, that the process shown in this exemplary embodiment can be used to form gates or any other structure of semiconductor device.

Figure 2A:
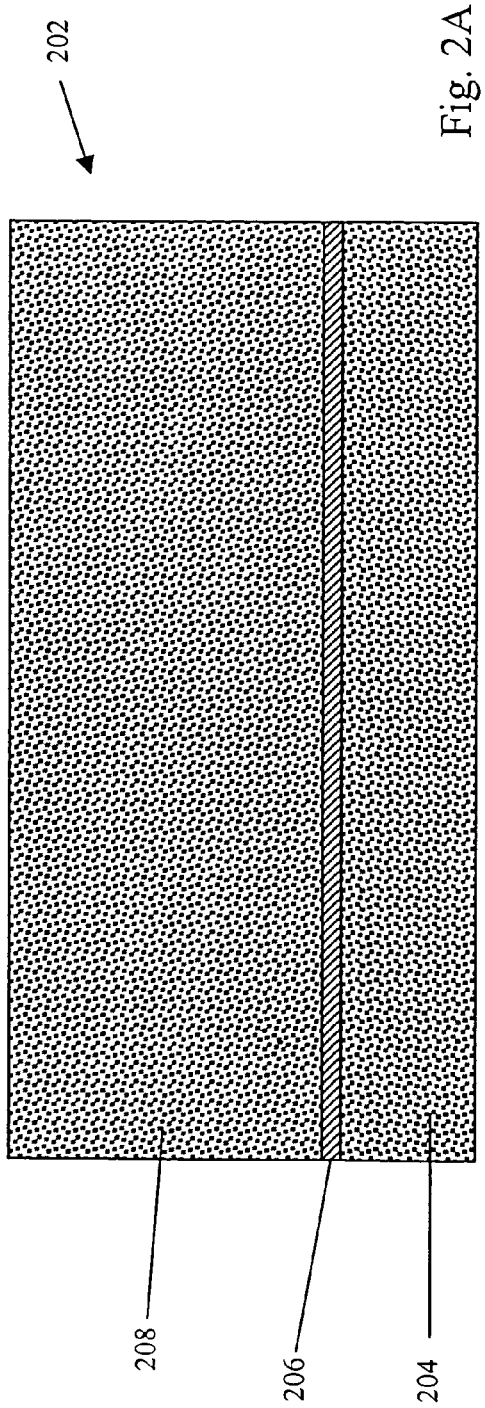

With reference now to FIG. 2A, a dielectric layer 204 can be formed on a previously formed layer of a semiconductor wafer by any convenient method, such as chemical vapor deposition (CVD), physical vapor deposition (PVD), atomic layer deposition (ALD), a spin-on coating process followed by curing and drying steps, and the like. In the present embodiment, dielectric layer 204 can include various materials having dielectric constant (K) values less than that of silicon dioxide, which is about 4.0. Examples of materials having K values less than that of silicon dioxide are listed in Tables 1 and 2 below:

TABLE 1

| Dielectric Material | Approximate K Value | Preferred Deposition Method(s) |
|---|---|---|
| Fluorinated silicate glass | 3.2–3.6 | CVD |
| Polyimides | 3.0–3.5 | Spin-on coating |
| Fluorinated polyimides | 2.5–3.3 | Spin-on coating |
| Hybrids/composites | 2.8–3.0 | Spin-on coating |
| Siloxanes | 2.7–2.9 | Spin-on coating |
| Organic polymers | 2.3–2.7 | Spin-on coating |
| α-C:F | 2.1–2.5 | CVD |
| Si—O—C | 2.4–2.8 | CVD |
| Parylenes/fluorinated parylenes | 2.2–2.6 | CVD |

TABLE 2

| Dielectric Material | Approximate K Value | Preferred Deposition Method(s) |
|---|---|---|
| Organic polymers | 2.3–2.7 | Spin-on coating |
| α-C:F | 2.1–2.5 | CVD |
| Si—O—C | 2.4–2.8 | CVD |
| Parylenes/fluorinated parylenes | 2.2–2.6 | CVD |
| PTFE (Polyterafluoroethylene) | 2.0 | Spin-on coating |
| Nanoporous silica | <2.0 | Spin-on coating |
| Nanoporous organic | <2.0 | Spin-on coating |

It should be recognized, however, that dielectric layer 204 can include any materials having K values less than that of silicon dioxide. Generally, low-K materials provide better electrical isolation than silicon dioxide, thereby allowing the formation of semiconductor devices with smaller feature sizes than those that can be formed using silicon dioxide.

In the present exemplary process, after dielectric layer 204 is formed on a previously formed layer, insulation layer 206 can be deposited on top of dielectric layer 204 by any convenient deposition process, such as CVD, PVD, ALD, a spin-on coating process followed by curing and drying steps, and the like. As will be described below, insulation layer 206 can include materials having anti-reflective properties and resistance to lithography and etching methods, such as silicon nitride.

It should be recognized that any reference to depositing a first material "on top of" or "on" a second material in this or any other embodiment can include depositing the first material on one or more intermediate material that may be formed on the second material, unless otherwise explicitly stated. Furthermore, it should be recognized that any reference to depositing a first material "on top of" or "on" a second material in this or any other embodiment should not be viewed as being limited to a particular orientation. For example, the first material can be deposited below the first material if the materials are being formed on the bottom side of a wafer.

After insulation layer 206 is deposited on top of dielectric layer 204, a dielectric layer 208 can be deposited on top of insulation layer 206 by any convenient method, such as CVD, PVD, ALD, a spin-on coating process followed by curing and drying steps, and the like. Dielectric layer 208 can include various materials having dielectric constant (K) values less than that of silicon dioxide, such as those listed in Tables 1 and 2. It should be recognized, however, that dielectric layer 204 can include any materials having K values less than about 4.0.

Figure 2B:
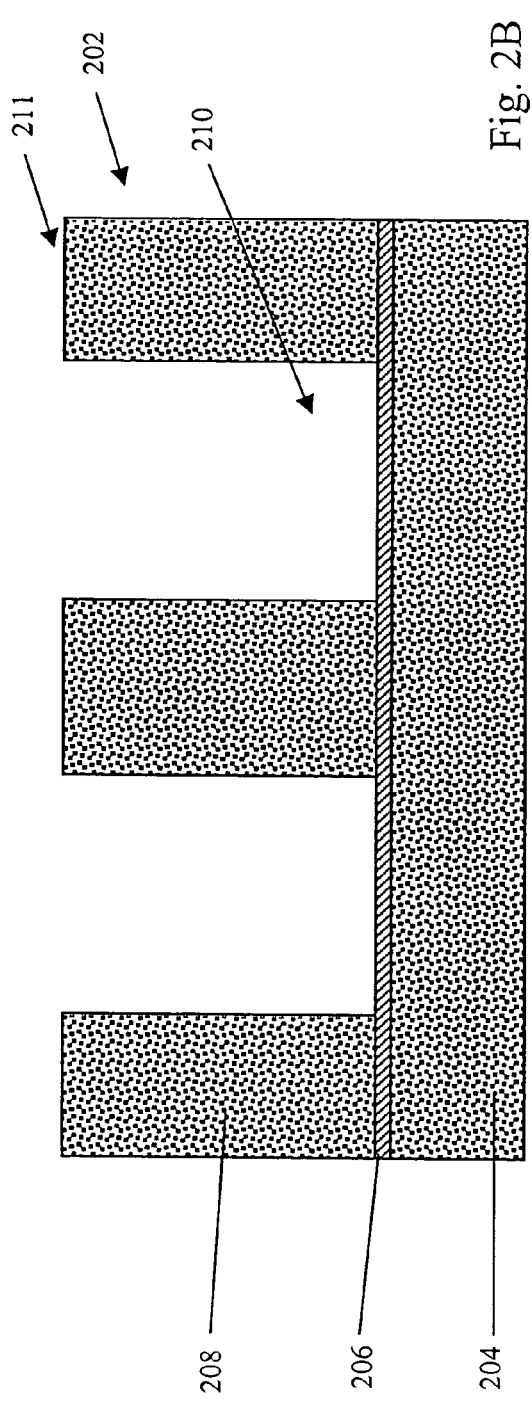

Referring now to FIG. 2B, recessed areas 210 and non-recessed areas 211 can then be formed in dielectric layer 208 by any convenient method, such as by lithography and etching, and the like. More particularly, the lithography method used can include UV lithography, deep UV lithography, x-ray lithography, electron lithography, ion beam lithography, and the like. As shown, insulation layer 206 can separate dielectric layer 204 from dielectric layer 208, and can therefore reduce the amount of dielectric layer 204 etched away or otherwise damaged during a lithography and etching process used to form the recessed areas 210 in dielectric layer 208. Moreover, insulation layer 206 can include anti-reflective properties that can reduce the reflection of light or UV rays from insulation layer 206 and any layers below that could interfere with a lithography and etching process used to form the recessed areas 210 in dielectric layer 208.

Figure 2C:
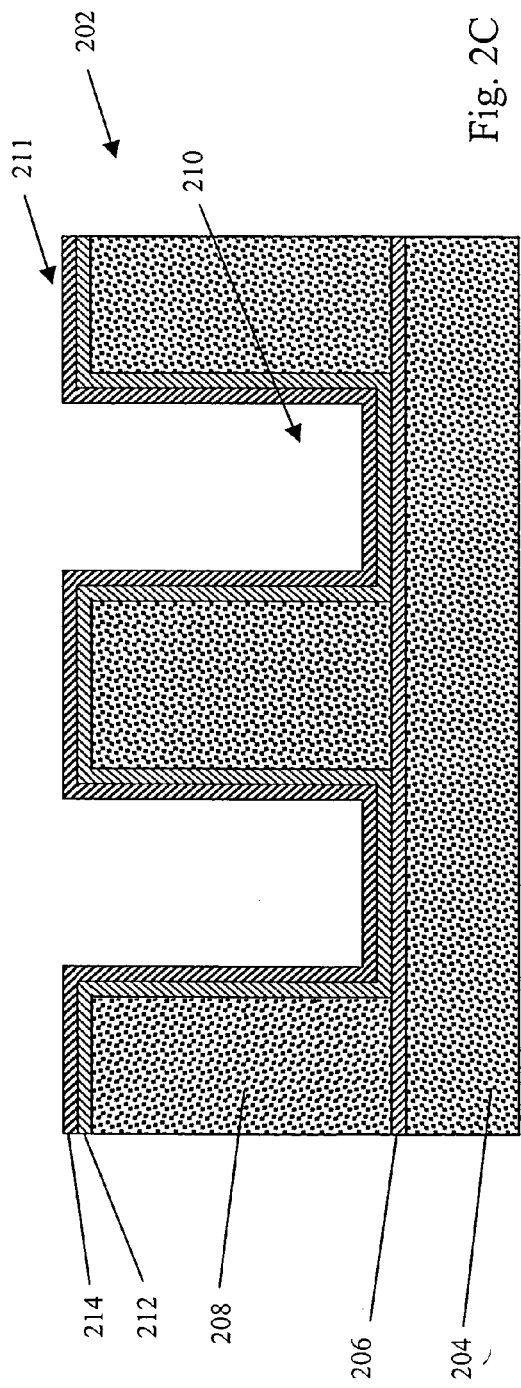

Next, with reference to FIG. 2C, a barrier layer 212 can be deposited on top of dielectric layer 208 by any convenient deposition method, such as CVD, PVD, ALD, a spin-on coating process followed by curing and drying steps, and the like. As depicted, barrier layer 212 can also line the walls of recessed areas 210. Additionally, barrier layer 212 can include a material that can prevent the diffusion or leaching of a subsequently formed a metal layer 216 (FIG. 2D), as will be described below, into dielectric layer 208, which can have a porous microstructure. Furthermore, barrier layer 212 can be formed from a conductive material, which adheres to both dielectric layer 208 and metal layer 216 (FIG. 2D).

As will also be described below, metal layer 216 (FIG. 2D) is preferably formed from copper. Accordingly, in the present embodiment, barrier layer 212 can include material resistant to diffusion of copper, such as titanium, tantalum, tungsten, titanium-nitride, tantalum-nitride, tungsten-nitride, tantalum silicon nitride, tungsten silicon nitride, and the like. It should be recognized, however, that barrier layer 212 can be omitted in some applications. For example, when dielectric layer 208 is formed from a material that is resistant to the diffusion of copper, or when the diffusion of copper into dielectric layer 208 will not adversely affect the performance of the semiconductor device, barrier layer 212 can be omitted.

After barrier layer 212 is deposited on top of dielectric layer 208, a seed layer 214 can be deposited on top of barrier layer 212 by any convenient method, such as CVD, PVD, ALD, a spin-on coating process followed by curing and drying steps, and the like. Seed layer 214 can include the same material as subsequently formed metal layer 216 (FIG. 2D), as will be described below, in order to facilitate the deposition and bonding of metal layer 216 (FIG. 2D) onto barrier layer 212 or dielectric layer 208 if no barrier layer 212 is used. Accordingly, in the present embodiment, seed layer 214 preferably includes copper. It should be recognized, however, that seed layer 214 can be omitted in some applications. For example, when metal layer 216 (FIG. 2D) is deposited by methods such as PVD, CVD, ALD, or a spin-on coating process followed by curing and drying steps, seed layer 214 may not be necessary.

Figure 2D:
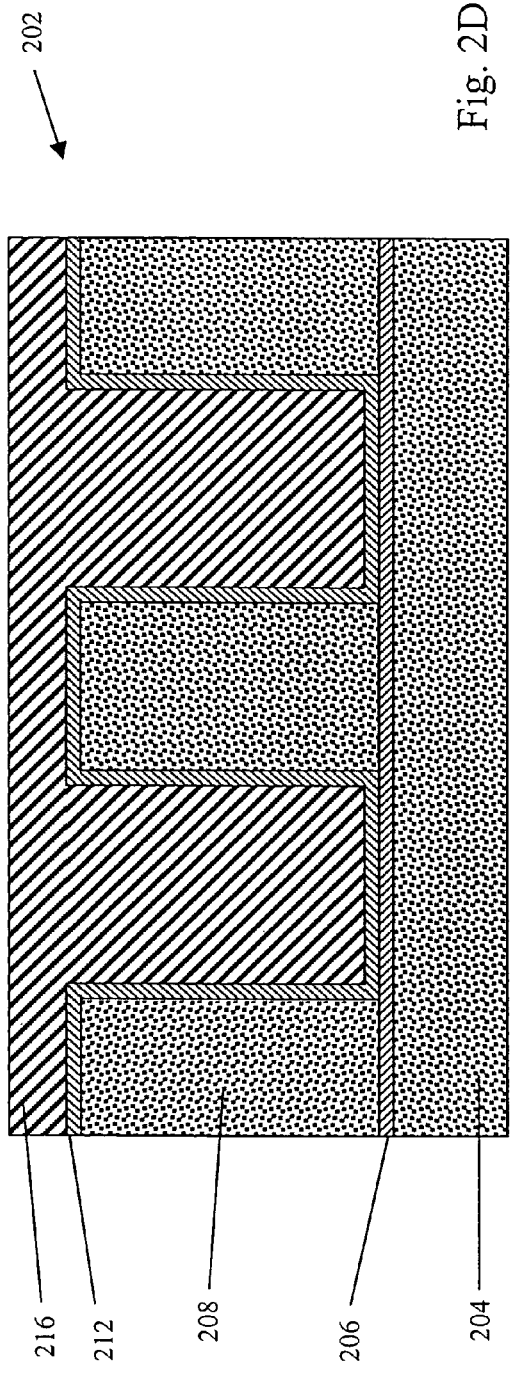

Next, with reference to FIG. 2D, metal layer 216 can be deposited onto seed layer 214 (FIG. 2C) by any convenient method, such as electroplating, electroless plating, PVD, CVD, ALD, a spin-on coating process followed by curing and drying steps, and the like. As depicted, metal layer 216 can fill recessed areas 210 (FIG. 2C) and cover non-recessed areas 211 (FIG. 2C). Additionally, metal layer 216 can include various electrically conductive materials, such as copper, aluminum, nickel, chromium, zinc, cadmium, silver, gold, rhodium, palladium, platinum, tin, lead, iron, indium, and the like. Furthermore, it should be recognized that metal layer 628 can include an alloy of any of the various electrically conductive materials.

In the present exemplary embodiment, metal layer 216 preferably includes copper, and can be electroplated onto seed layer 214 (FIG. 2C) using the electroplating apparatus and method described in U.S. patent application, Ser. No. 09/232,864, entitled PLATING APPARATUS AND METHOD, filed on Jan. 15, 1999, the entire content of which is incorporated herein by reference. As noted above, the deposition and bonding of metal layer 216 onto barrier layer 212, or dielectric layer 208 if no barrier layer 212 is used, during the electroplating process can be facilitated by a previously formed seed layer 214 (FIG. 2C). Additionally, as also noted above, a previously formed barrier layer 212 can prevent metal layer 216 and an associated seed layer 214 (FIG. 2C), if used, from diffusing or leaching into dielectric layer 208. However, it should be recognized that metal layer 216 can be deposited directly onto dielectric layer 208 or barrier layer 212 in some applications.

Now with reference to FIG. 2E, after metal layer 216 is deposited onto dielectric layer 208, metal layer 216 can then be removed from non-recessed areas 211 of dielectric layer 208 by any convenient method, such as electropolishing, chemical-mechanical polishing (CMP), and the like. As shown, removing metal layer 216 from non-recessed areas 211 of dielectric layer 208 can include removing metal layer 216 from non-recessed areas 211 of any intermediate layer, such as barrier layer 212 and the like, that are deposited on dielectric layer 208. Furthermore, as shown, in the present embodiment, metal layer 216 is removed from non-recessed areas 211 of dielectric layer 208 while maintaining the metal layer 216 within recessed areas 210 of dielectric layer 208.

Figure 3:
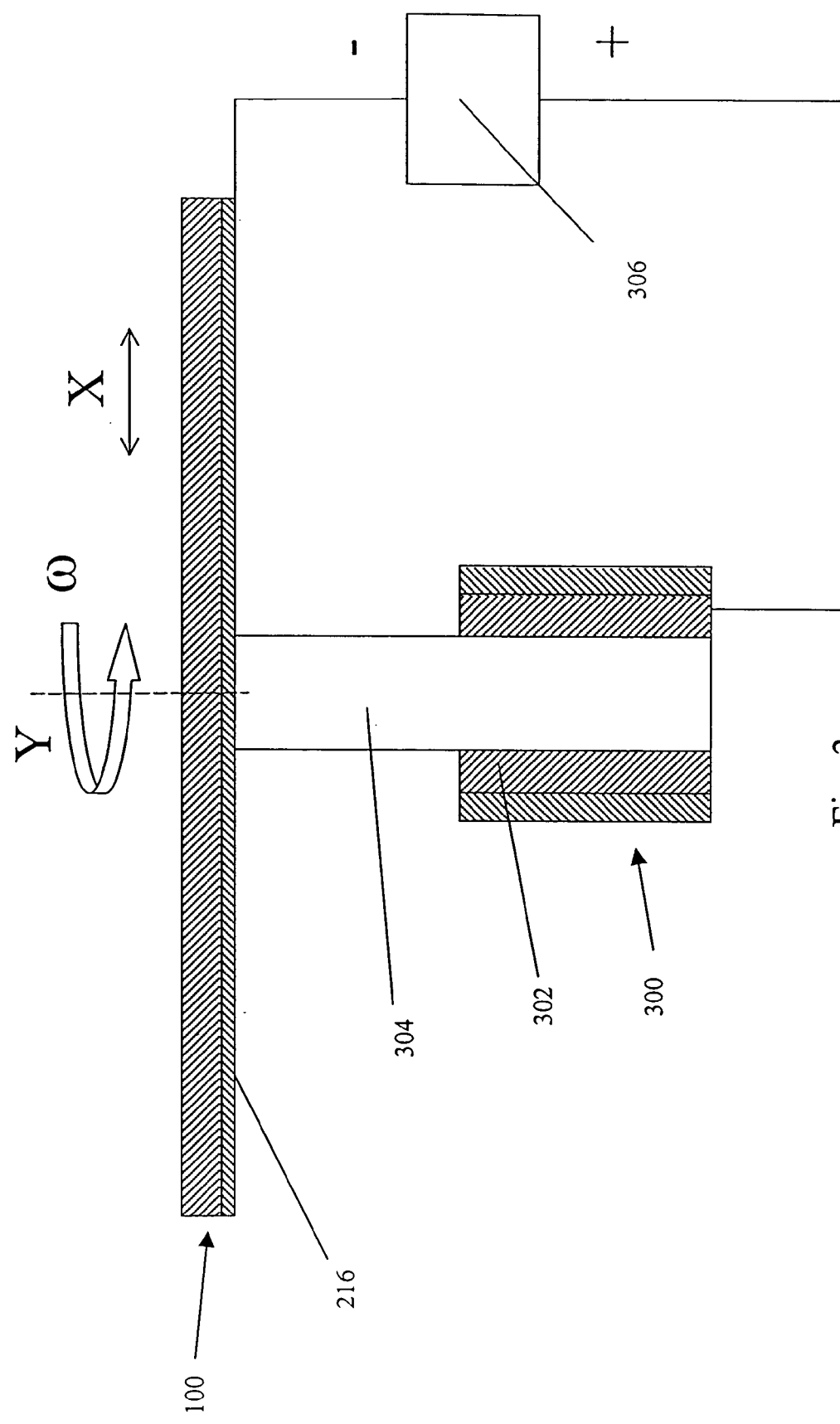
FIG. 3 illustrates, in cross-sectional view, an exemplary electropolishing nozzle.

In the present exemplary embodiment, metal layer 216 is preferably electropolished from dielectric layer 208. For example, with reference to FIG. 3, metal layer 216 on semiconductor wafer 100 can be electropolished with nozzle 300. More particularly, nozzle 300 can apply an electrolyte stream 304 to metal layer 216. This electrolyte stream 304 can be charged by an electrode 302. Furthermore, as depicted, a power supply 306, which can operate at a constant current or constant voltage mode, can apply opposing charges to electrode 302 and metal layer 216. Accordingly, when electrolyte stream 304 is charged positively relative to metal layer 216, metal ions can be removed from the portion of metal layer 216 in contact with the electrolyte stream 304.

In the present example, electrolyte stream 304 can be applied to metal layer 216 along a spiral path by rotating semiconductor wafer 100 about axis Y and translating semiconductor wafer 100 along axis X. By applying electrolyte stream 304 in a spiral path, metal layer 216 can be uniformly electropolished. Alternatively, electrolyte stream 304 can be applied to metal layer 216 by holding semiconductor wafer 100 stationary and moving nozzle 300 to apply electrolyte stream 304 to discrete portions of metal layer 216. Yet another alternative can include moving both semiconductor wafer 100 and nozzle 300 to apply electrolyte stream 304 to discrete portions of metal layer 216. For a more detailed description of electropolishing, see U.S. patent application Ser. No. 09/497,894, entitled METHODS AND APPARATUS FOR ELECTROPOLISHING METAL INTERCON- NECTIONS ON SEMICONDUCTOR DEVICES, filed on Feb. 4, 2000, which is incorporated in its entirety herein by reference.

With reference again to FIG. 2E, because electropolishing can exert low lateral stress on dielectric layer 208, metal layer 216 can be electropolished from dielectric layer 208 without fracturing dielectric layer 208, separating metal layer 216 from dielectric layer 208, or otherwise damaging dielectric layer 208, metal layer 216, or barrier layer 212.

Accordingly, electropolishing can provide advantages over conventional removal processes. In particular, polishing metal layer 216 from dielectric layer 208 with CMP can cause dielectric layer 208 to fracture or pull away from metal layer 216 due to the stress and pressure of CMP. Additionally, because electropolishing can be essentially stressless, constructing additional structures within dielectric layer 208 to increase the mechanical integrity of dielectric layer 208 may be unnecessary. However, it should be recognized that the present invention can be used with a dielectric layer 208 constructed with additional structures. Furthermore, it should also be recognized that a portion of metal layer 216 can be removed by CMP, or by any other process, before metal layer 216 is removed from non-recessed areas 211 of dielectric layer 208 by electropolishing.

Referring now to FIG. 2F, after metal layer 216 is removed from non-recessed areas 211 (FIG. 2E) of dielectric layer 208, barrier layer 212 can be removed from non-recessed areas 211 (FIG. 2E) of dielectric layer 208 by any convenient method, such as wet etching, dry chemical etching, dry plasma etching, and the like. As noted above, however, in some applications, barrier layer 212 may not be used.

Figure 2G:
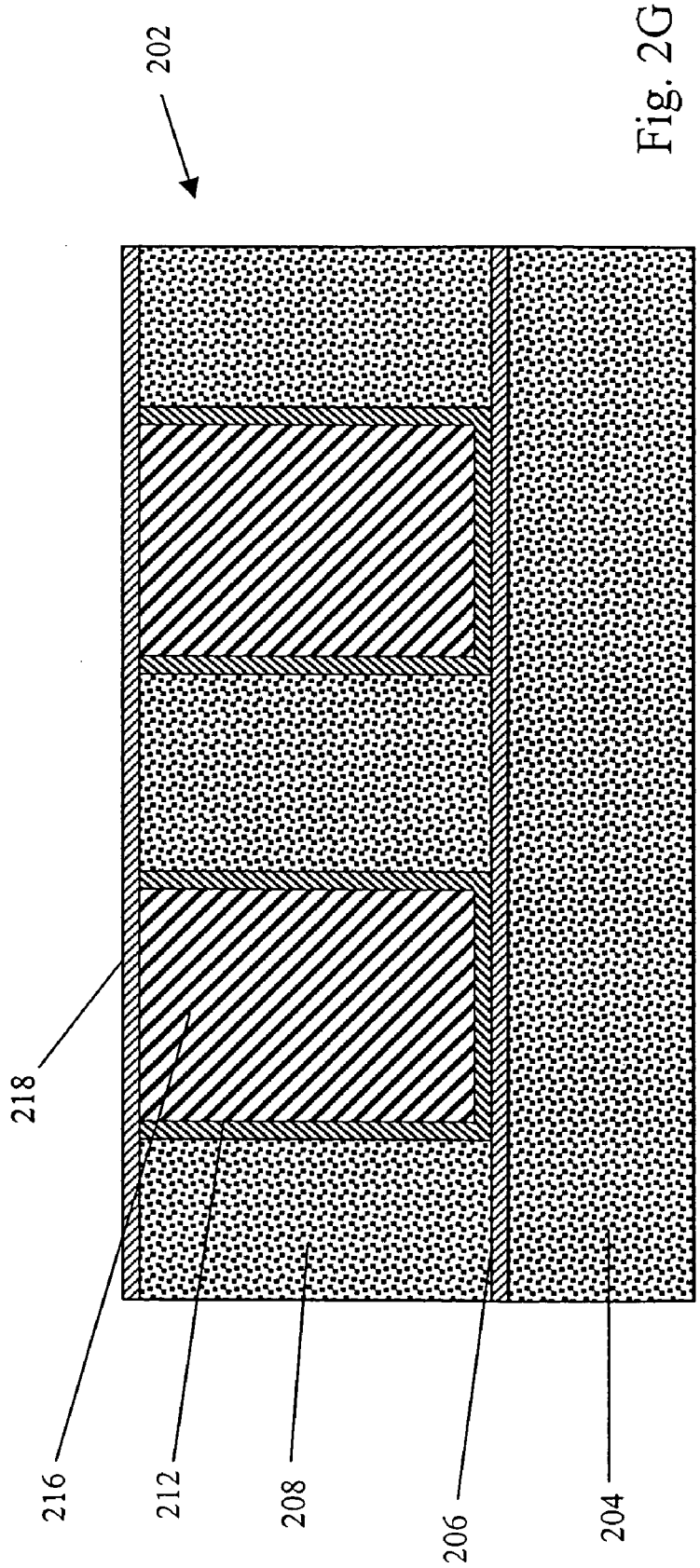
Figure 2H:
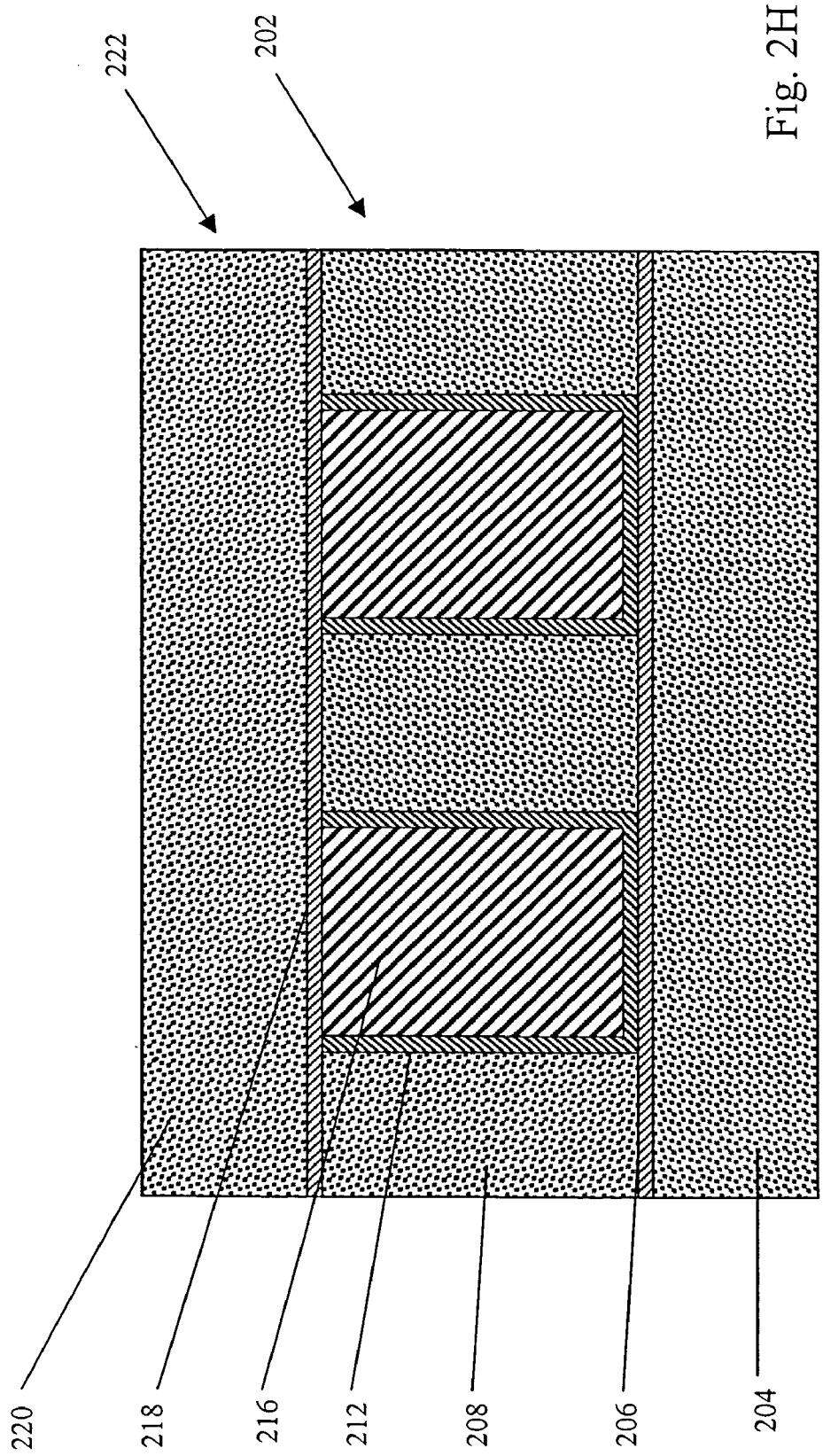

After barrier layer 212 is removed, with reference to FIG. 2G, an insulation layer 218 can be deposited on top of dielectric layer 208 by any convenient deposition process, such as CVD, PVD, ALD, a spin-on coating process followed by curing and drying steps, and the like. As shown, insulation layer 218 can also contact barrier layer 212 and metal layer 216. Furthermore, insulation layer 218 can separate layer 202 from any layers that may be deposited on top of layer 202. Additionally, insulation layer 218 can include anti-reflective properties that can reduce the reflection of light or UV rays from insulation layer 218 and any layers below that could interfere with a lithography and etching process performed on any layers deposited above layer 202. Moreover, insulation layer 206 can reduce the amount of materials in layer 202 etched away or otherwise damaged during lithography and etching processes that may be performed on layers deposited above layer 202. Accordingly, in the present exemplary embodiment, insulation layer 218 can include materials that are anti-reflective and resistant to lithography and etching methods, such as silicon nitride.

The above process for forming layer 202 in the present embodiment can be repeated to form additional layers on top of layer 202. For instance, with reference to FIG. 2H, dielectric layer 220 can be formed on top of layer 202, as part of another layer 222. Trenches and via can then be formed in dielectric layer 220 to form lines and plugs, respectively, that can contact metal layer 216 in layer 202.

In addition, although the present embodiment is described in conjunction with forming lines in a layer of a semiconductor wafer, it should be recognized that the above explained process can also be used to form gates, via, or any other semiconductor device structure. For instance, dielectric layer 204, as depicted in FIGS. 2A–2H can be substituted with substrate 102 (FIG. 1), and recessed areas 210 can be used to form gates.

Figure 4:
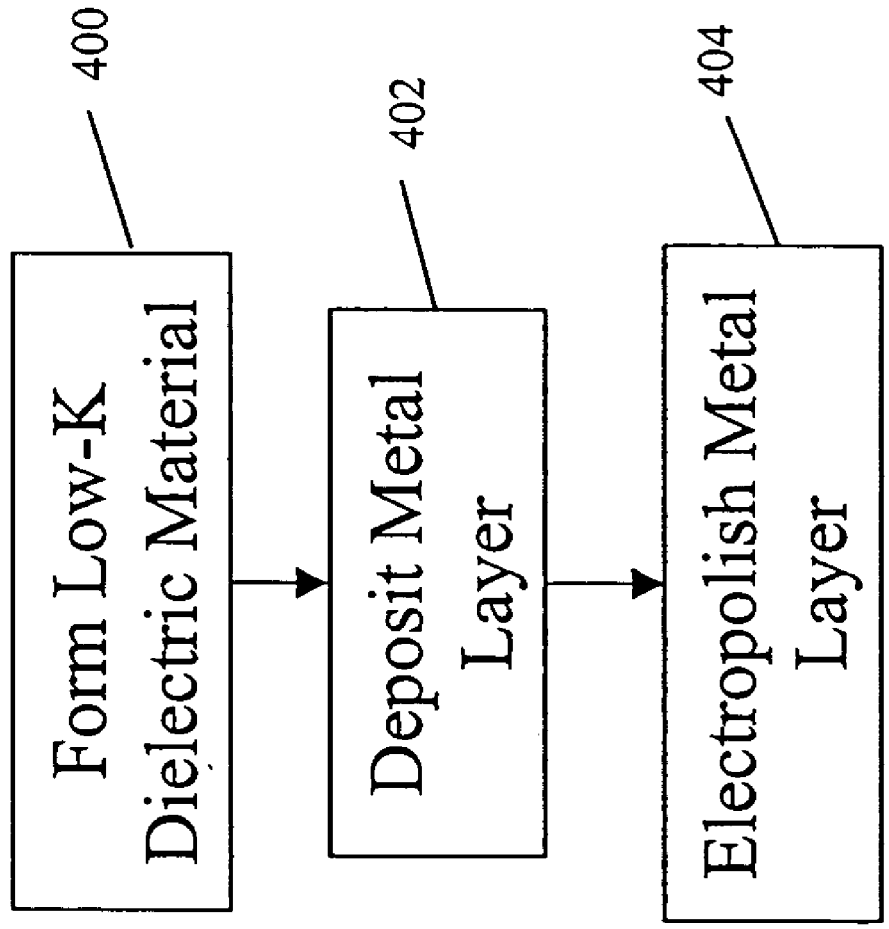
FIG. 4 is a flow chart illustrating the steps of a damascene process, in accordance with various embodiments of the present invention.

With reference to FIG. 4, a flow chart illustrating an exemplary damascene process is shown. In step 400, a dielectric layer is formed on a previously formed layer or on the substrate of a semiconductor wafer. In step 402, a metal layer is deposited on the dielectric layer. In step 404, the deposited metal layer is electropolished from the dielectric layer.

It should be recognized, however, that various modifications can be made to the process depicted in the flow chart. For example, the step of removing a portion of the metal layer using CMP can be added between steps 402 and 404. Additionally, it should be recognized that each of the steps depicted in FIG. 4 can include numerous steps. For example, step 400 can include providing a low-K dielectric material having recessed areas formed thereon. Moreover, it should be recognized that the steps depicted in FIG. 4 can be used for any damascene process, including a single-damascene process or a dual-damascene process.

In FIGS. 5A–5H, an alternative embodiment of the present invention is shown. The embodiment of FIGS. 5A–5H is similar in many respects to that of FIGS. 2A–2H, except that, with reference to FIG. 5A, a protective layer 500 can be deposited on top of dielectric layer 208 by any convenient method, such as PVD, CVD, ALD, a spin-on coating process followed by curing and drying steps, and the like. Similarly, with reference to FIG. 5H, a protective layer 502 can be deposited on top of dielectric layer 220.

Figure 5A:
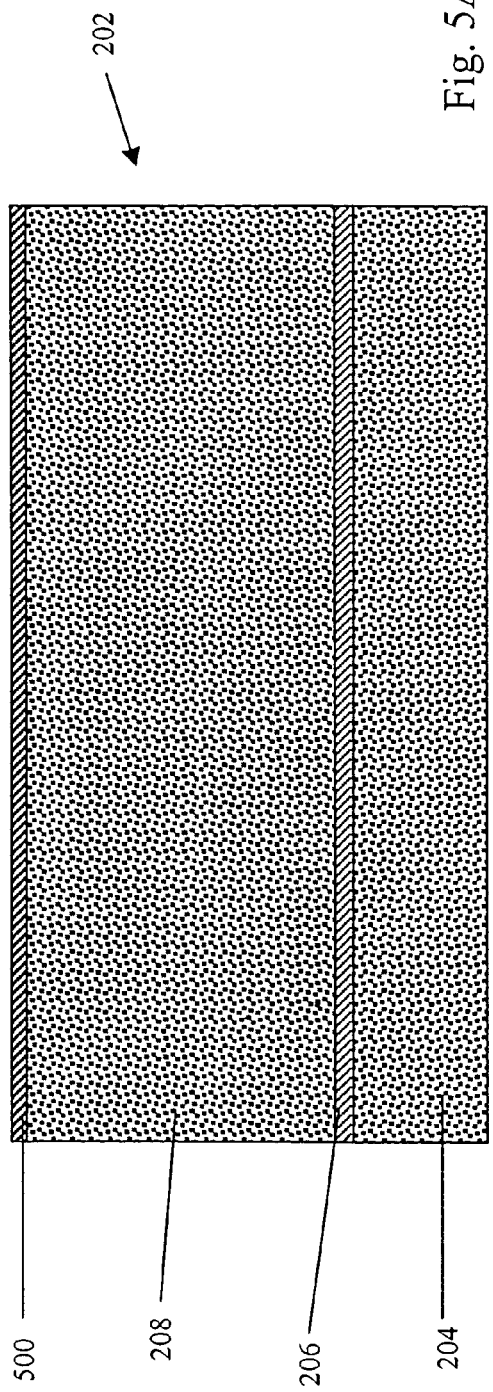
Figure 5B:
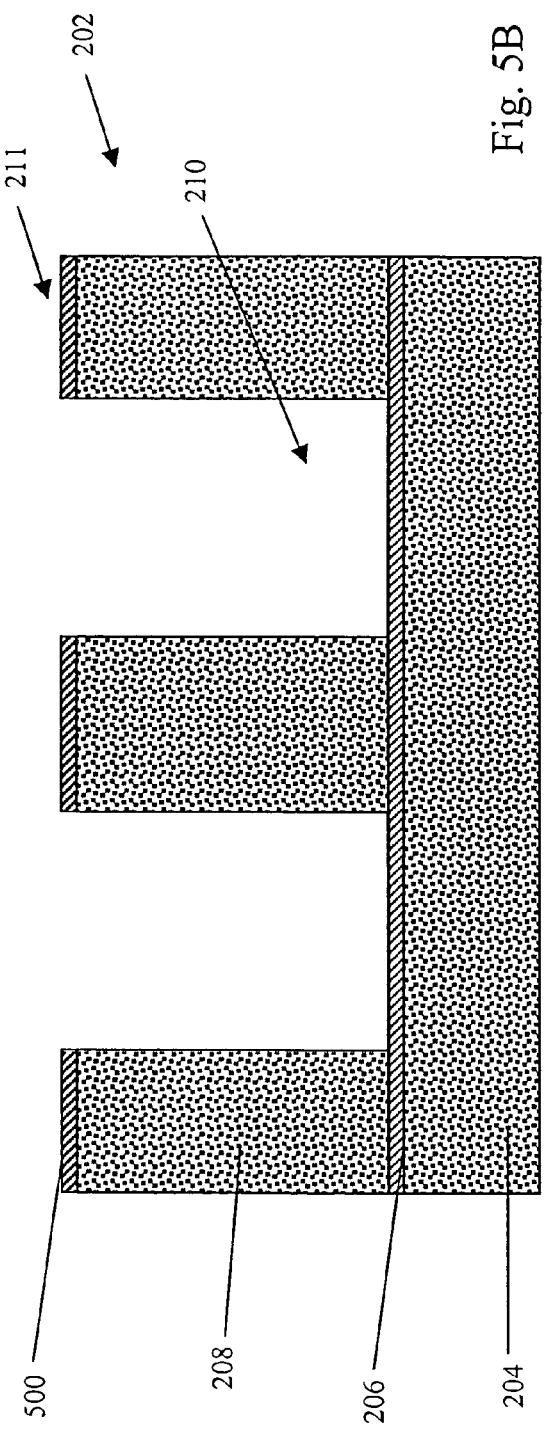
Figure 5E:
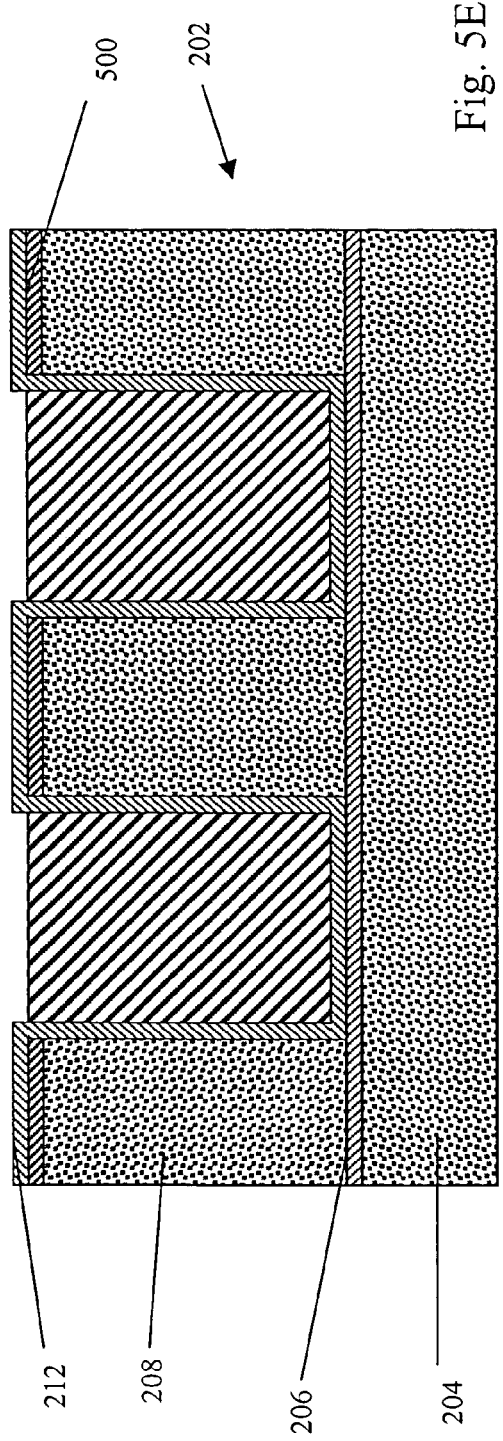
Figure 5F:
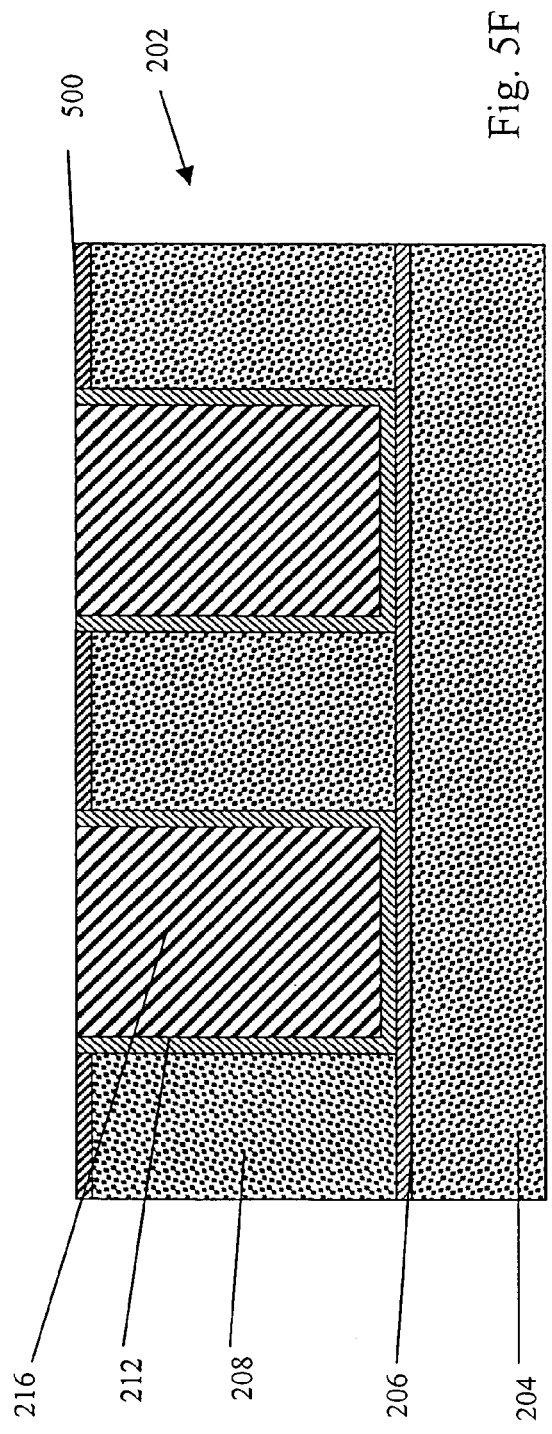
Figure 5G:
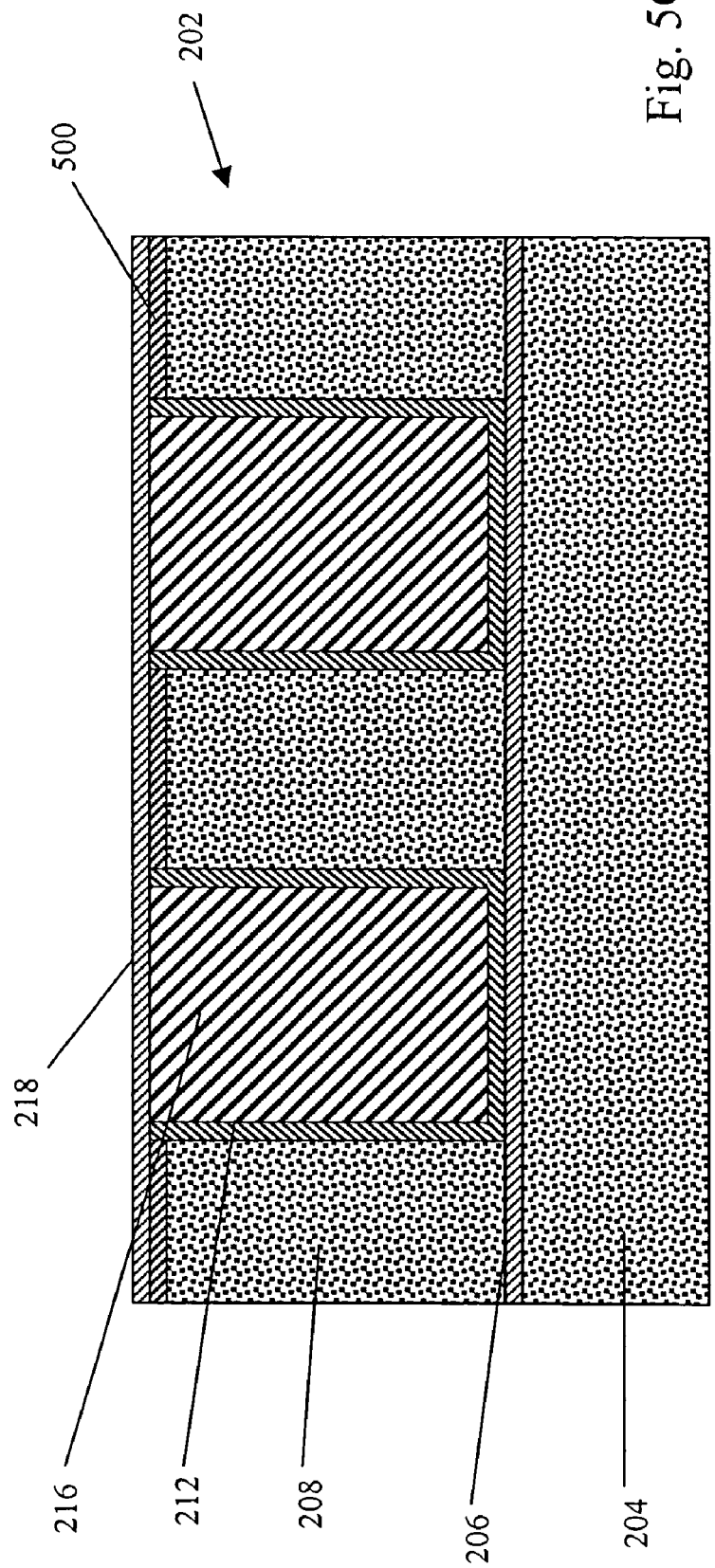
Figure 5H:
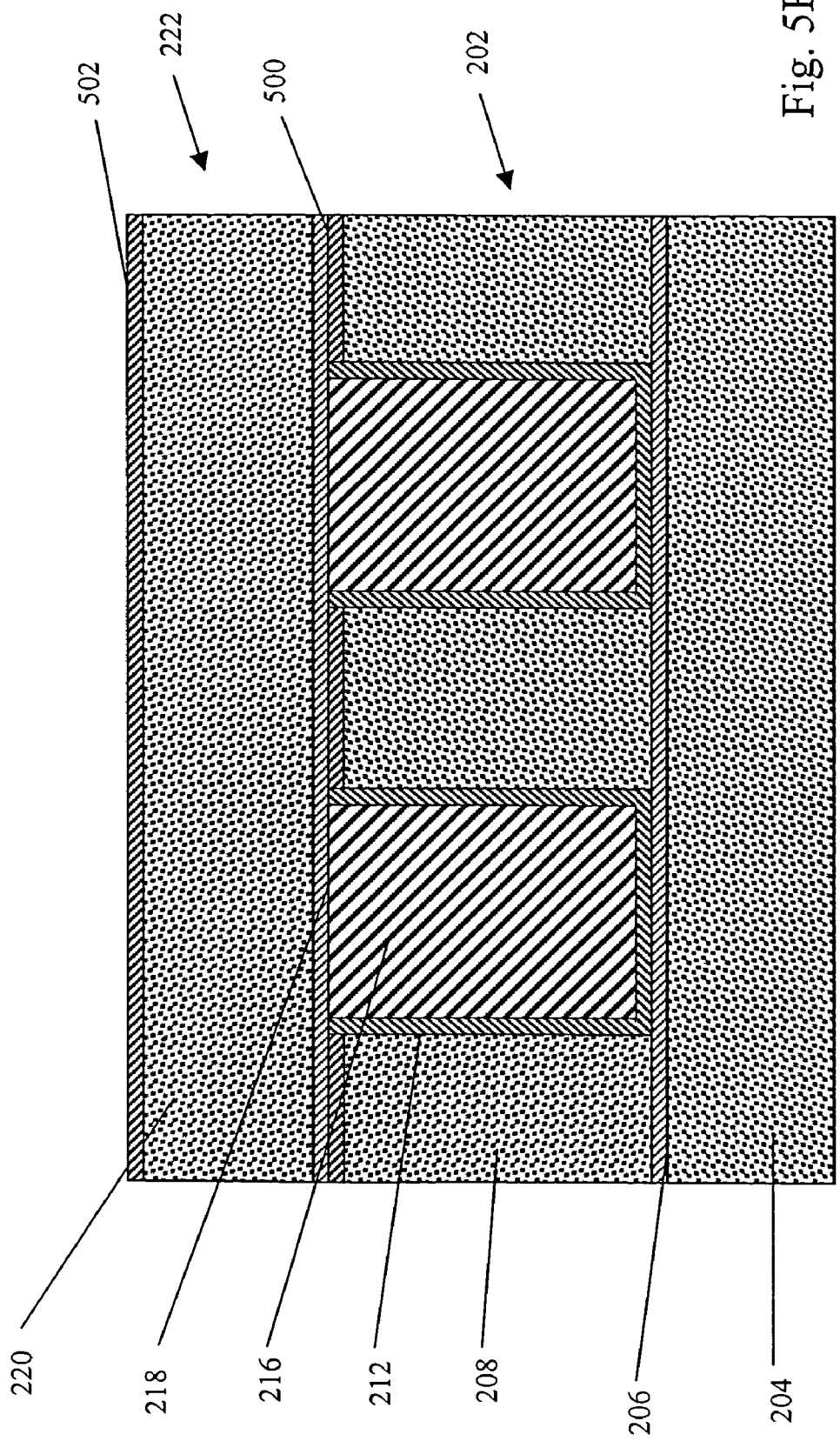

With reference now to FIGS. 5E and 5F, protective layer 500 can separate barrier layer 212 from dielectric layer 208, and can therefore protect dielectric layer 208 from damage, such as abrasion or corrosion, when barrier layer 212 is removed by any convenient method, such as wet etching, dry chemical etching, dry plasma etching, and the like. Additionally, with reference to FIGS. 5F–5H, protective layer 500 can remain on non-recessed areas 211 of dielectric layer 208 during various stages following the removal of barrier layer 212. Accordingly, protective layer 500 can include a material that is resistant to damage from processes such as wet etching, dry chemical etching, dry plasma etching, and the like, such as silicon carbide, diamond film, silicon dioxide, and the like.

In FIGS. 6A–6J, cross-sectional views of layers 600 and 602 are shown to illustrate another exemplary damascene process used to form lines and via, such as lines 120 and plugs 119 in section 126 of FIG. 1. As will be described below, in this exemplary process, the dielectric layer of layer 602 includes a first sub-layer 612 and a second sub-layer 616.

With reference now to FIG. 6A, first sub-layer 612 can be formed on previously formed layer 600 of a semiconductor wafer, which includes insulation layer 610, lines 606, and an optional barrier layer 608 that can prevent the materials in lines 606 from diffusing or leaching into dielectric layer 604. In particular, first sub-layer 612 can be formed by any convenient method, such as CVD, PVD, ALD, a spin-on coating process followed by curing and drying steps, and the like. First sub-layer 612 can include various materials having dielectric constant (K) values less than that of silicon dioxide, such as those listed in Tables 1 and 2. It should be recognized, however, that dielectric layer 604 can include any materials having K values less than about 4.0.

In the present exemplary embodiment, after first sub-layer 612 is formed on previously formed layer 600, insulation layer 614 can be deposited on top of first sub-layer 612 by any convenient deposition process, such as CVD, PVD, ALD, a spin-on coating process followed by curing and drying steps, and the like. As will be described below, insulation layer 614 can include materials having anti-reflective properties and resistance to lithography and etching methods, such as silicon nitride.

After insulation layer 614 is deposited on top of first sub-layer 612, second sub-layer 616 can be deposited on top of insulation layer 614 by any convenient method, such as CVD, PVD, ALD, a spin-on coating process followed by curing and drying steps, and the like. Second sub-layer 616 can include various materials having dielectric constant (K) values less than that of silicon dioxide, such as those listed in Tables 1 and 2. It should be recognized, however, that second sub-layer 616 can include any materials with K values less than about 4.0.

In the present embodiment, first sub-layer 612 and second sub-layer 616 are formed from materials having similar dielectric constants. However, as will be described later, first sub-layer 612 and second sub-layer 616 can be formed from materials having different dielectric constants.

Referring now to FIG. 6B, trenches 618 can then be formed in second sub-layer 616 by any convenient method, such as by lithography and etching, and the like. More particularly, the lithography method used can be UV lithography, deep UV lithography, x-ray lithography, electron lithography, ion beam lithography, and the like. As shown, insulation layer 614 can separate second sub-layer 616 from first sub-layer 612, and can therefore reduce the amount of first sub-layer 612 etched away or otherwise damaged during a lithography and etching process used to form trenches 618 in second sub-layer 616. Moreover, insulation layer 614 can include anti-reflective properties that can reduce the reflection of light or UV rays from insulation layer 614 and any layers below that could interfere with a lithography and etching process used to form the trenches 618 in second sub-layer 616.

In the present exemplary embodiment, after trenches 618 are formed in second sub-layer 616, insulation layer 614 can be removed from the bottom of trenches 618 by any convenient method, such as by wet etching, dry etching, and the like.

Next, after insulation layer 614 is removed from the bottom of trenches 618, via 620 can be formed in first sub-layer 612 by any convenient method, such as by lithography and etching, and the like. More particularly, the lithography method used can be UV lithography, deep UV lithography, x-ray lithography, electron lithography, ion beam lithography, and the like. As shown, insulation layer 610 can separate first sub-layer 612 from dielectric material 604, lines 606, and barrier layer 608 in previously formed layer 600, and can therefore reduce the amount of dielectric material 604, lines 606, and barrier layer 608 in previously formed layer 600 etched away or otherwise damaged during a lithography and etching process used to form via 620 in first sub-layer 612. Moreover, insulation layer 610 can include anti-reflective properties that can reduce the reflection of light or UV rays from insulation layer 610 and any layers below that could interfere with a lithography and etching process used to form via 620 in first sub-layer 612. It should be recognized that trench 618 and via 620 can be formed without using insulation layer 614.

In the present exemplary embodiment, after via 620 are formed in first sub-layer 612, insulation layer 610 can be removed from the bottom of via 620 by any convenient method, such as by wet etching, dry etching, and the like. Accordingly, via 620 can connect with lines 606 in previously formed layer 600.

Next, with reference to FIG. 6C, adhesion layer 622 can be deposited onto layer 602 by any convenient deposition method, such as CVD, PVD, ALD, a spin-on coating process followed by curing and drying steps, and the like. As depicted, adhesion layer 622 can line the walls of trenches 618 and via 620. Additionally, adhesion layer 622 can include a material that can provide a smooth surface within trenches 618 and via 620, especially if dielectric layers 616 and 612 are porous or if the etching profile within trenches 618 and via 620 is rough. Furthermore, adhesion layer 622 can be chosen of a material that can enhance the adhesion between the dielectric layers 612, 616 and a subseqently formed barrier layer 624 (FIG. 6E), as will be described below. Examples of materials that can provide a smooth surface and can enhance adhesion between dielectric layers 612, 616 and a subsequently formed barrier layer 624 (FIG. 6E) include silicon dioxide, tantalum oxide, titanium oxide, tungsten oxide, silicon carbide, and the like. It should be recognized, however, that adhesion layer 622 can be omitted in some applications, such as when direct adhesion between the dielectric layers 612, 616 and barrier layer 624 (FIG. 6E) is adequate for the particular application and will not adversely affect the performance of the semiconductor device.

With reference to FIG. 6D, after adhesion layer 622 is deposited onto layer 602, adhesion layer 622 can be removed from the bottom of via 620 by any convenient method, such as anisotropic etching, and the like. As shown, anisotropic etching can remove adhesion layer 622 from the bottom of via 620 without removing adhesion layer 622 from the walls of via 620.

Next, with reference to FIG. 6E, after adhesion layer 622 is removed from the bottom of via 620, barrier layer 624 can be deposited onto layer 602 by any convenient deposition method, such as CVD, PVD, ALD, a spin-on coating process followed by curing and drying steps, and the like. As shown, barrier layer 624 can also line the walls of trenches 618 and via 620. Additionally, barrier layer 624 can include a material that can reduce the amount of diffusion or leaching of a subsequently formed metal layer 628 (FIG. 6F), as will be described below, into dielectric layers 616 and 612, which can have porous microstructures. Furthermore, barrier layer 624 can be formed from a conductive material, which can adhere to dielectric layers 616 and 612, adhesion layer 622, and metal layer 628 (FIG. 6F).

As will also be described below, metal layer 624 (FIG. 6F) preferably includes copper. Accordingly, in the present embodiment, barrier layer 624 can include material resistant to the diffusion of copper, such as titanium, tantalum, tungsten, titanium-nitride, tantalum-nitride, tungsten-nitride, tantalum silicon nitride, tungsten silicon nitride, and the like. It should be recognized, however, that barrier layer 624 can be omitted in some applications. For example, when dielectric layers 616 and 612 are formed from materials that are resistant to the diffusion of copper, or when the diffusion of copper into dielectric layers 616 and 612 will not adversely affect the performance of the semiconductor device, barrier layer 624 can be omitted.

In the present exemplary embodiment, after barrier layer 624 is deposited onto layer 602, a seed layer 626 can be deposited on top of barrier layer 624 by any convenient method, such as CVD, PVD, ALD, a spin-on coating process followed by curing and drying steps, and the like. Seed layer 626 can include the same material as subsequently formed metal layer 628 (FIG. 6F), as will be described below, in order to facilitate the deposition and bonding of metal layer 628 (FIG. 6F) onto barrier layer 624, or onto adhesion layer 622 and dielectric layers 616 and 612 if no barrier layer 624 is used. Accordingly, in the present embodiment, seed layer 626 preferably includes copper. It should be recognized, however, that seed layer 626 can be omitted in some applications. For example, when metal layer 628 (FIG. 6F) is deposited by methods such as CVD, PVD, ALD, a spin-on coating process followed by curing and drying steps, and the like, seed layer 626 may not be necessary.

Next, with reference to FIG. 6F, metal layer 628 can be deposited onto layer 602 by any convenient method, such as electroplating, electroless plating, CVD, PVD, ALD, a spin-on coating process followed by curing and drying steps, and the like. As depicted, metal layer 628 can fill trenches 618 and via 620. Additionally, metal layer 628 can include various electrically conductive materials, such as copper, aluminum, nickel, chromium, zinc, cadmium, silver, gold, rhodium, palladium, platinum, tin, lead, iron, indium, and the like. Furthermore, it should be recognized that metal layer 628 can include an alloy of any of the various electrically conductive materials.

In the present exemplary embodiment, metal layer 628 preferably includes copper, and can be electroplated onto layer 602 using the electroplating apparatus and method described in U.S. patent application, Ser. No. 09/232,864, the entire content of which is incorporated herein by reference. As noted above, the deposition and bonding of metal layer 628 onto barrier layer 624, or onto adhesion layer 622 and dielectric layers 616 and 612 if no barrier layer 624 is used, during the electroplating process can be facilitated by a previously formed seed layer 626 (FIG. 6E). Additionally, as also noted above, a previously formed barrier layer 624 can reduce the amount of diffusion or leaching of metal layer 628 and an associated seed layer 626 (FIG. 6E), if used, into dielectric layers 616 and 612. However, it should be recognized that metal layer 216 can be deposited directly onto dielectric layers 616 and 612 in some applications.

Now with reference to FIG. 6G, after metal layer 628 is deposited onto layer 602, metal layer 628 can then be removed from the non-recessed areas of layer 602 by any convenient method, such as electropolishing, chemical-mechanical polishing (CMP), and the like. As shown, removing metal layer 628 from the non-recessed areas of layer 602 can include removing metal layer 628 from non-recessed areas of any intermediate layers, such as barrier layer 624 and the like, that are deposited on dielectric layers 616 and 612. Furthermore, as shown, in the present embodiment, metal layer 628 is removed from non-recessed areas of layer 602 while maintaining the metal layer 628 within the recessed areas (i.e., trench 618 and via 620 of FIG. 6E) of layer 602.

Figure 7:
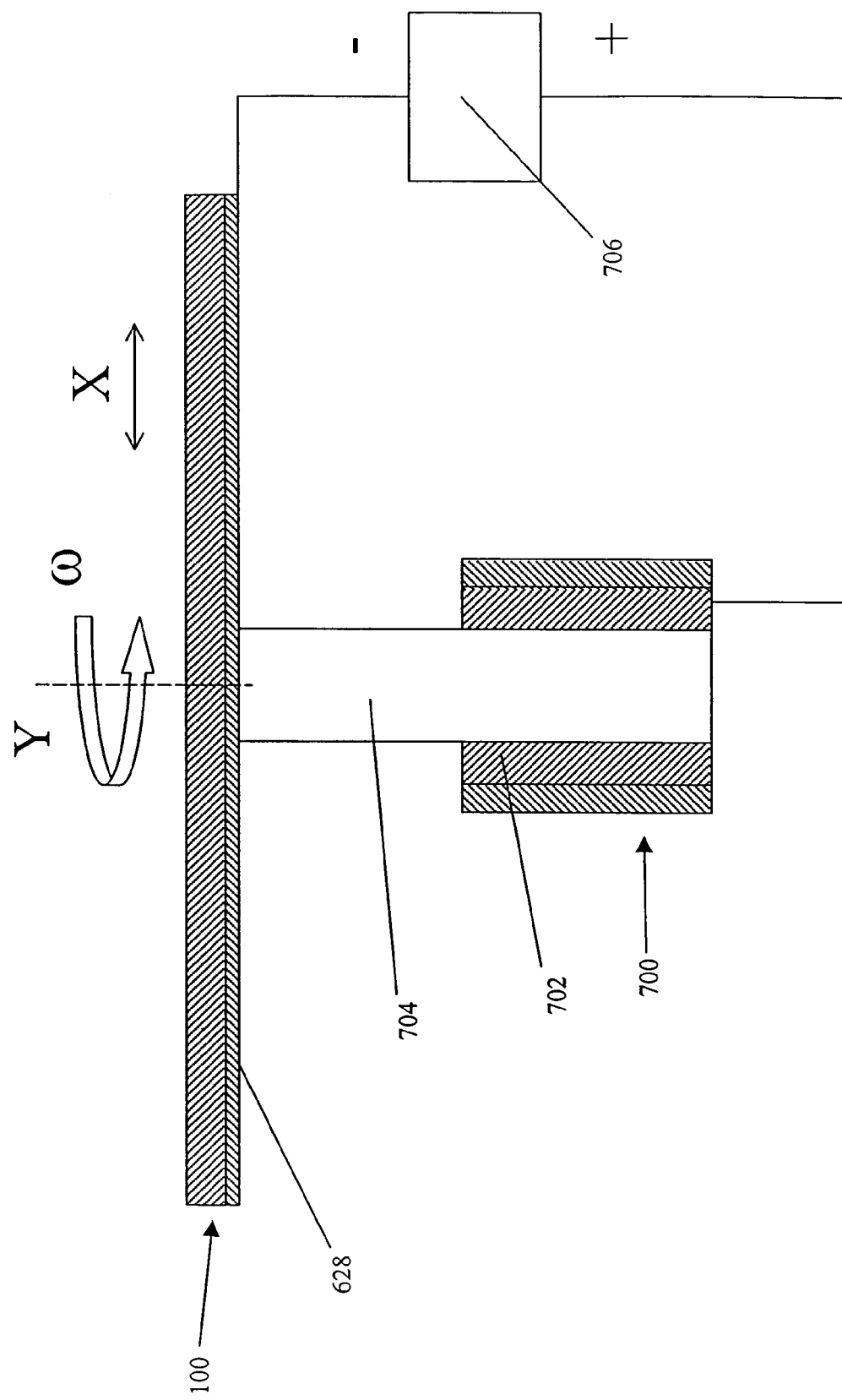
FIG. 7 illustrates, in cross-sectional view, an exemplary electropolishing nozzle.
Figure 8I:
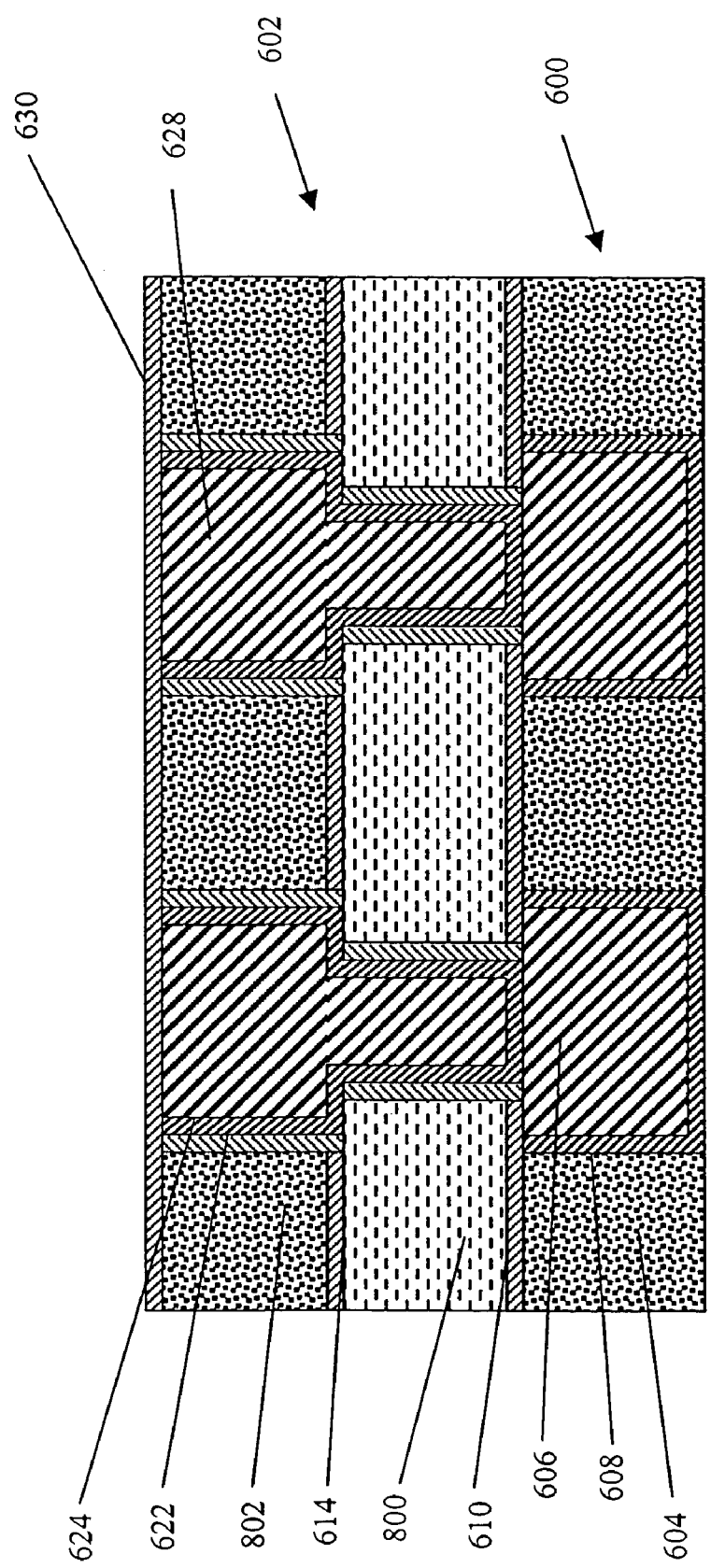
Figure 8J:
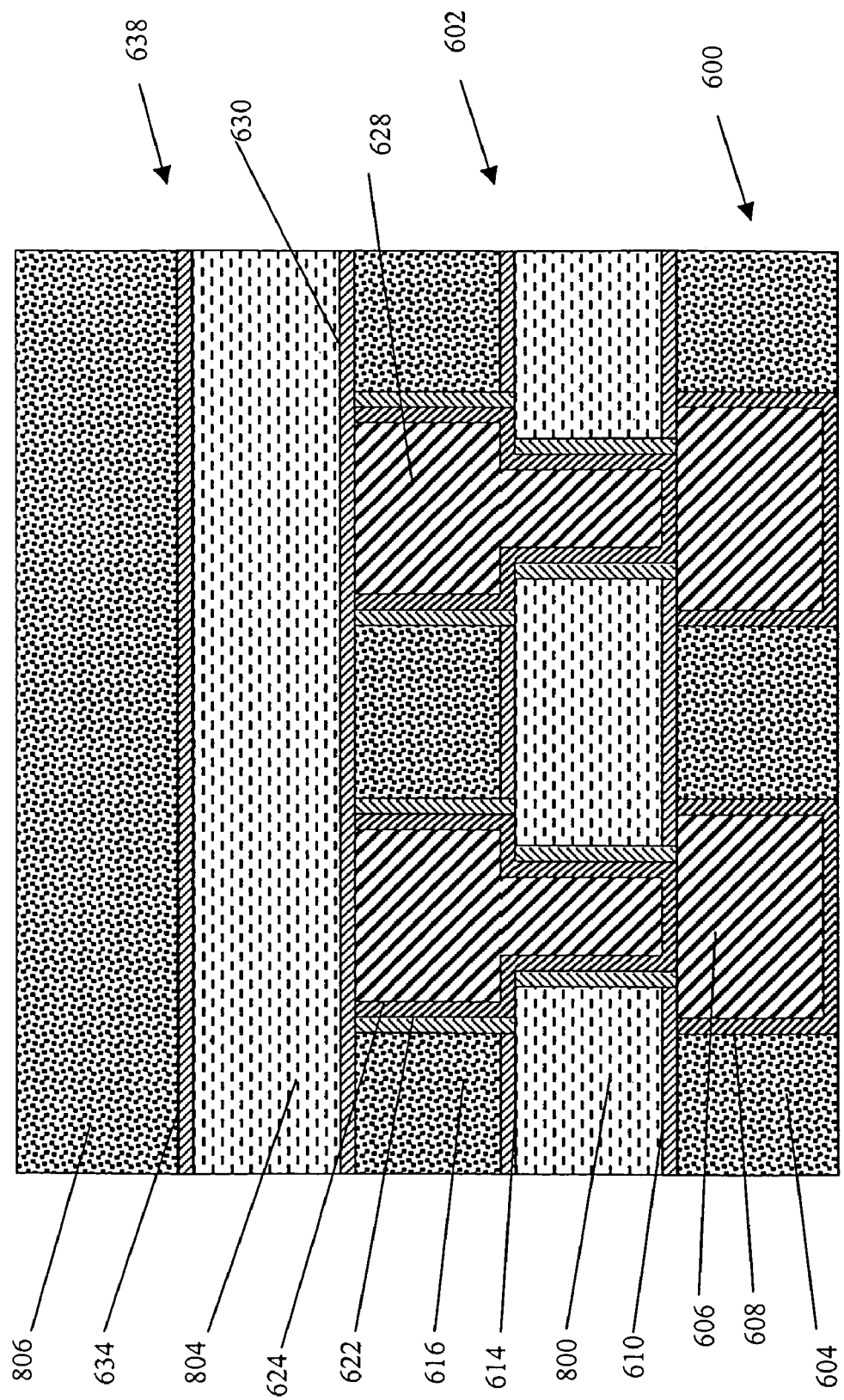
Figure 9G:
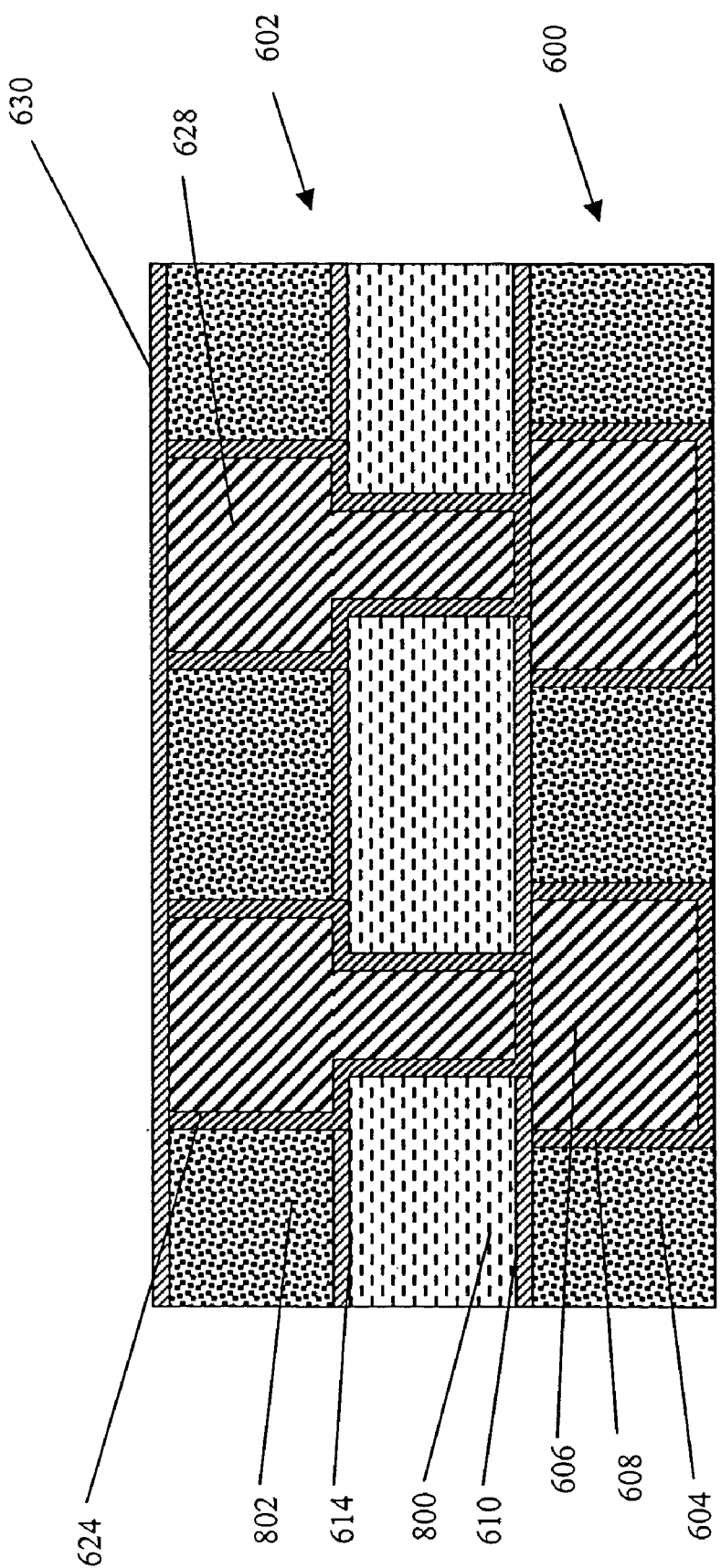
Figure 9H:
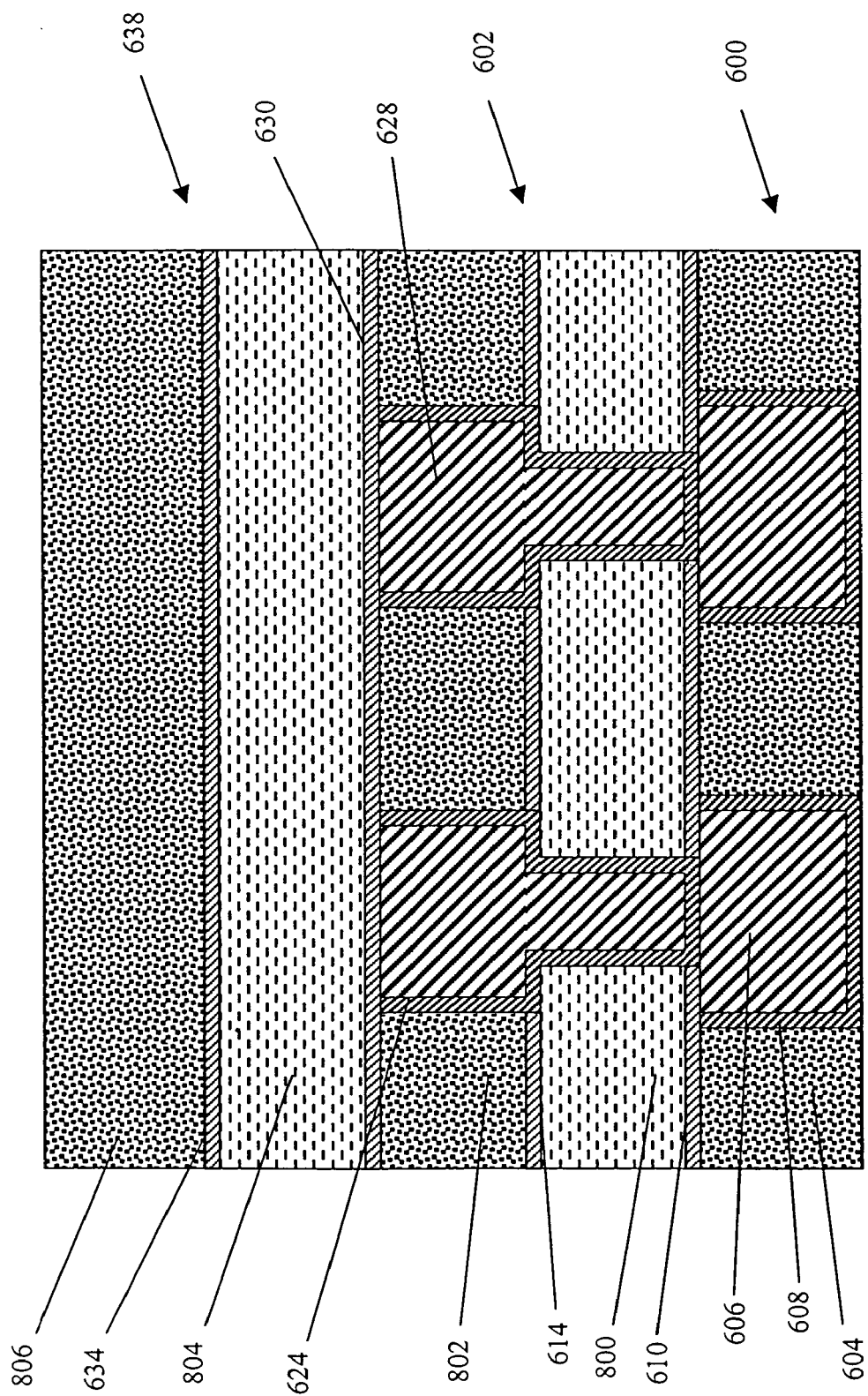

In the present exemplary embodiment, metal layer 628 is preferably electropolished from layer 602. For example, with reference to FIG. 7, metal layer 628 on semiconductor wafer 100 can be electropolished with nozzle 700. More particularly, nozzle 700 can apply an electrolyte stream 704 to metal layer 628. This electrolyte stream 704 can be charged by an electrode 702. Furthermore, as depicted, a power supply 706, which can operate at a constant current or constant voltage mode, can apply opposing charges to electrode 702 and metal layer 628. Accordingly, when electrolyte stream 704 is charged positively relative to metal layer 628, metal ions can be removed from the portion of metal layer 628 in contact with electrolyte stream 704.

In the present example, electrolyte stream 704 can be applied to metal layer 628 along a spiral path by rotating semiconductor wafer 100 about axis Y and translating semiconductor wafer 100 along axis X. By applying electrolyte stream 704 in a spiral path, metal layer 628 can be uniformly electropolished. Alternatively, electrolyte stream 704 can be applied to metal layer 628 by holding semiconductor wafer 100 stationary and moving nozzle 700 to apply electrolyte stream 704 to discrete portions of metal layer 628. Yet another alternative can include moving both semiconductor wafer 100 and nozzle 700 to apply electrolyte stream 704 to discrete portions of metal layer 628. For a more detailed description of electropolishing, see U.S. patent application Ser. No. 09/497,894, entitled METHODS AND APPARATUS FOR ELECTROPOLISHING METAL INTERCONNECTIONS ON SEMICONDUCTOR DEVICES, filed on Feb. 4, 2000, which is incorporated in its entirety herein by reference.

With reference again to FIG. 6G, because electropolishing can exert low stress on layer 602 during electropolishing, metal layer 628 can be electropolished from layer 602 without fracturing dielectric layers 616 and 612, separating metal layer 628 from dielectric layers 616 and 612, or otherwise damaging dielectric layers 616 and 612, metal layer 628, or barrier layer 624.

Accordingly, electropolishing can provide advantages over conventional removal processes. In particular, polishing metal layer 628 from layer 602 with CMP can cause dielectric layers 616 and 612 to fracture or pull away from metal layer 628 due to the stress and pressure of CMP. Additionally, because electropolishing can be essentially stressless, constructing additional structures within dielectric layers 616 and 612 to increase the mechanical integrity of dielectric layers 616 and 612 may be unnecessary. However, it should be recognized that the present invention can be used with dielectric layers 616 and 612 constructed with additional structures. Furthermore, it should also be recognized that a portion of metal layer 628 can be removed by CMP, or by any other process, before metal layer 628 is removed from the non-recessed areas of layer 602 by electropolishing.

Referring now to FIG. 6H, after metal layer 628 is removed from the non-recessed areas of layer 602, barrier layer 624 can be removed from the non-recessed areas of layer 602 by any convenient method, such as wet etching, dry chemical etching, dry plasma etching, and the like. As noted above, however, in some applications, barrier layer 624 may not be used.

Figure 6I:
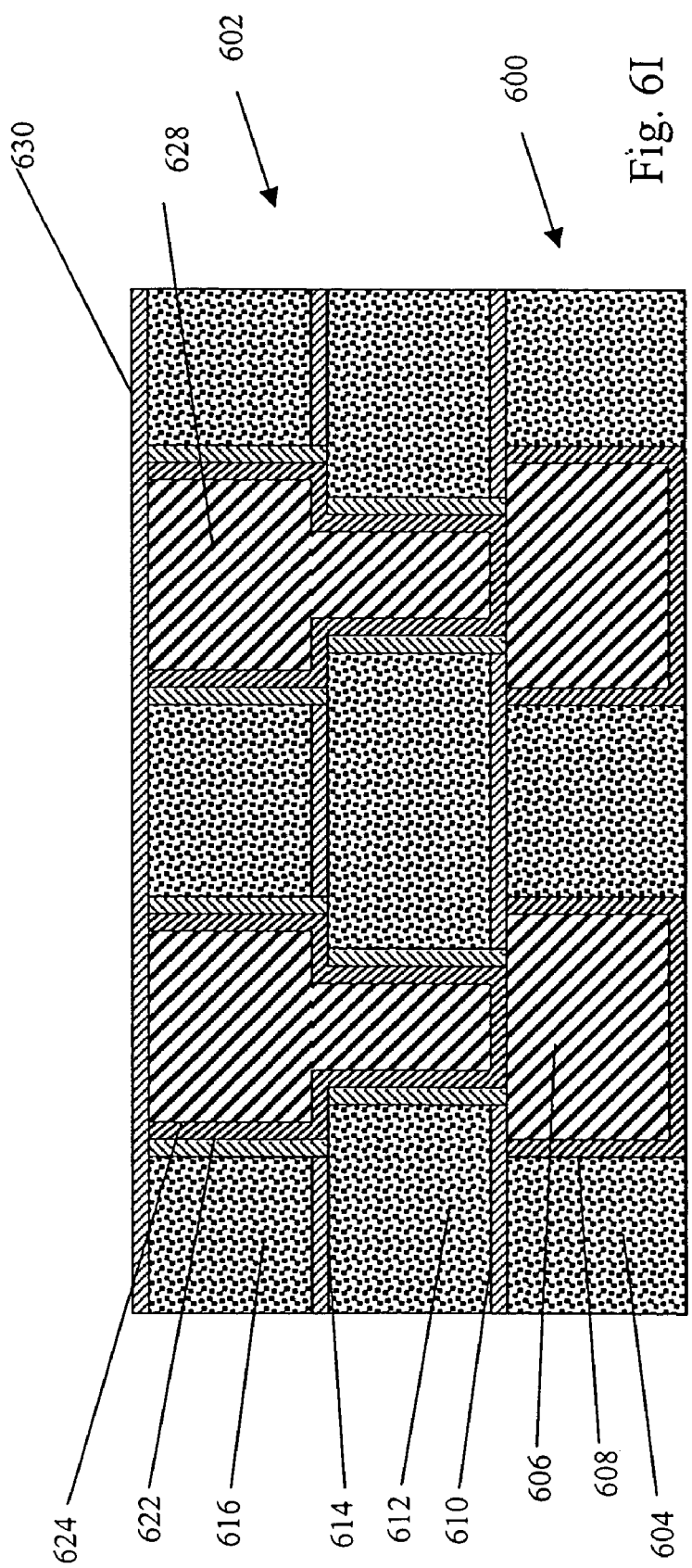
Figure 6J:
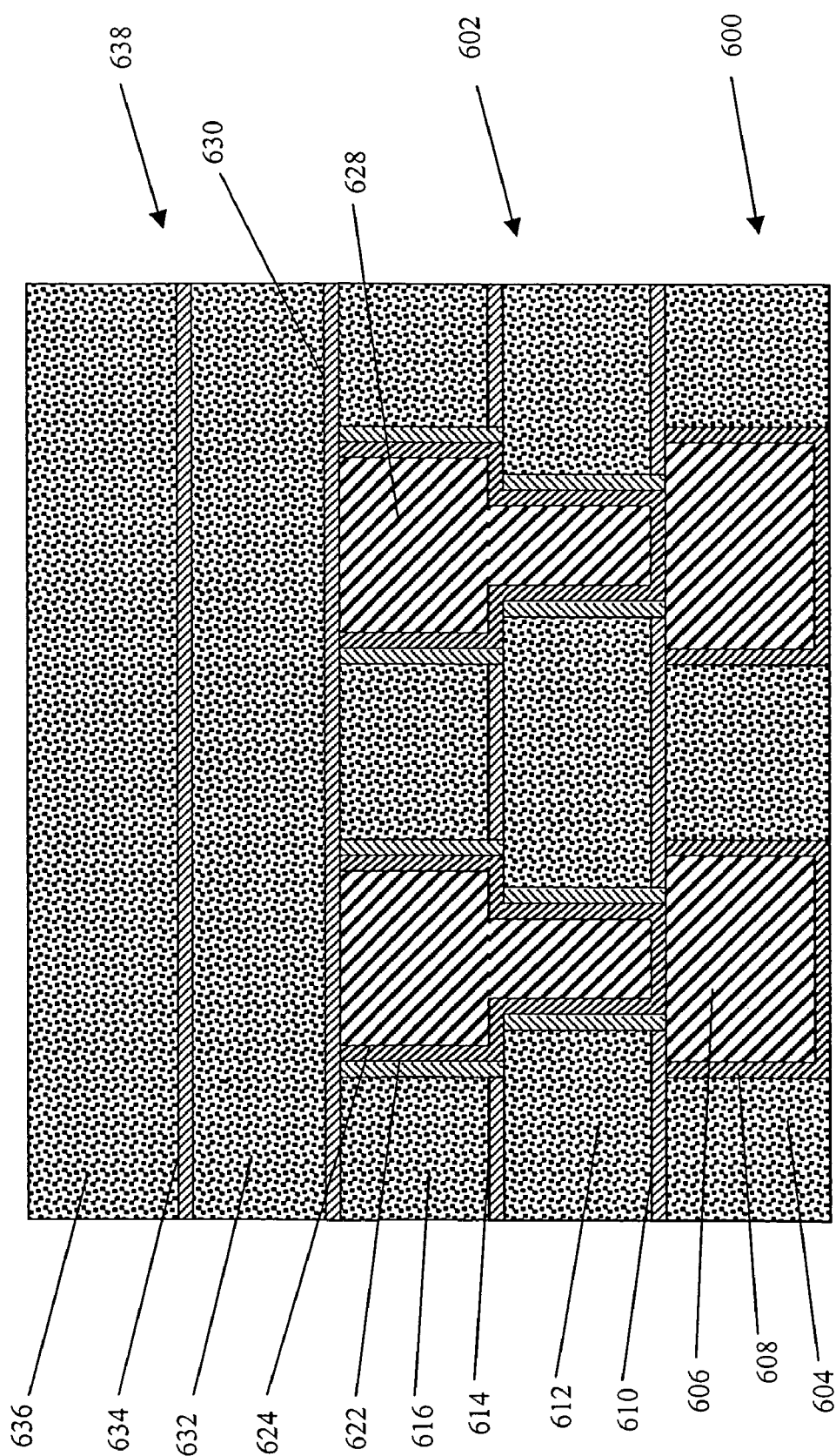

After barrier layer 624 is removed, with reference to FIG. 6I, insulation layer 630 can be deposited onto layer 602 by any convenient deposition process, such as CVD, PVD, ALD, a spin-on coating process followed by curing and drying steps, and the like. As shown, insulation layer 630 can separate layer 602 from any layers that may be deposited on top of layer 602. Additionally, insulation layer 630 can include anti-reflective properties that can reduce the reflection of light or UV rays from insulation layer 630 and any layers below that could interfere with a lithography and etching process performed on any layers deposited above layer 602. Moreover, insulation layer 630 can reduce the amount of materials in layer 602 etched away or otherwise damaged during lithography and etching processes that may be performed on layers deposited above layer 602. Accordingly, in the present exemplary embodiment, insulation layer 630 can include materials that are anti-reflective and resistant to lithography and etching methods, such as silicon nitride.

The above process for forming layer 602 in the present embodiment can be repeated to form additional layers on top of layer 602. For instance, with reference to FIG. 6J, a first sub-layer 632, an insulation layer 634, and a second sub-layer 636 can be formed on top of layer 602 to form another layer 638. Trenches and via can then be formed in layer 638 to form lines and plugs, respectively, that can contact metal layer 628 in layer 602.

In FIGS. 8A–8J, another exemplary embodiment of the present invention is shown. The embodiment of FIGS. 8A–8J is similar in many respects to that of FIGS. 6A–6J, except that, with reference to FIG. 8A, the dielectric layer of interconnection layer 602 includes a first sub-layer 800 and a second sub-layer 802 that have different dielectric constants (K). In the present embodiment, as depicted in FIGS. 8A–8J, interconnection lines (trenches 618) are formed in second sub-layer 802, and plugs (via 620) are formed in first sub-layer 802.

As discussed above, as feature size is decreased, the density of interconnection lines increases, which can result in increased interconnect delays. Although the density of the plugs, which connect interconnection lines of different layers together, also increases, it does not increase as rapidly as the density of the interconnection lines.

As also discussed above, materials having lower dielectric constants K than silicon dioxide can be used to reduce interconnect delays. However, materials with lower K values also have lower mechanical integrity than materials with higher K values.

As such, in the present embodiment, first sub-layer 800 includes material having higher K values than second sub-layer 802. Thus, first sub-layer 800 can have greater mechanical integrity and thermal conductivity than if formed from material having the same or lower K value than second sub-layer 802. In this manner, the overall mechanical and thermal conductivity of the semiconductor wafer and, consequently, the number of layers that can be formed on the semiconductor wafer can be increased.

In the present embodiment, first sub-layer 800 can include a material having an ultra-low dielectric constant, and second sub-layer 802 can include a material having a low dielectric constant. For example, first sub-layer 800 can include a material with a dielectric constant of greater than about 2.5 and less than about 4.0, such as those materials listed in Table 1. Second sub-layer 802 can include a material with a dielectric constant of between about 1.1 and about 2.5, and preferably about 1.8, such as those materials list in Table 2.

In an alternative embodiment, first sub-layer 800 can include silicon dioxide, and second sub-layer 802 can include a material having a dielectric constant lower than silicon dioxide. For example, second sub-layer 802 can include any of the materials listed in Tables 1 and 2 that have dielectric constants lower than silicon dioxide. It should be recognized, however, that first sub-layer 800 and second sub-layer 802 can include various materials depending on the particular application.

As described above, the above process for forming layer 602 in the present embodiment can be repeated to form additional layers on top of layer 602. For instance, with reference to FIG. 8J, a first sub-layer 804, insulation layer 634, and a second sub-layer 806 can be formed on top of layer 603 to form another layer 638. Trenches and via can then be formed in layer 638 to form lines and plugs, respectively, that can contact metal layer 628 in layer 602.

In FIGS. 9A–9H, another exemplary embodiment of the present invention is shown. The embodiment of FIGS. 9A–9H is similar in many respects to that of FIGS. 8A–8J, except that, with reference to FIGS. 8C and 9C, adhesion layer 622 is omitted. As described above, adhesion layer 622 can be omitted in some applications, such as when direct adhesion between the dielectric layer (i.e., first sub-layer 800 or second sub-layer 802) and barrier layer 624 is adequate for the particular application and will not adversely affect the performance of the semiconductor device.

In the following description and associated drawing figures, various alternative embodiments will be described and depicted. It should be recognized, however, that these alternative embodiments are not intended to demonstrate all of the various modifications that can be made to the present invention. Rather, these alternative embodiments are provided to demonstrate only some the many modifications that are possible without deviating from the spirit and/or scope of the present invention.

In FIGS. 10A–10J, an alternative embodiment of the present invention is shown. The embodiment of FIGS. 10A–10J is similar in many respects to that of FIGS. 6A–6J, except that, with reference to FIG. 10A, protective layer 1000 can be deposited on top of second sub-layer 616 by any convenient method, such as PVD, CVD, ALD, a spin-on coating process followed by curing and drying steps, and the like. Similarly, with reference to FIG. 10J, protective layer 1002 can be deposited on top of dielectric layer 636.

Figure 10I:
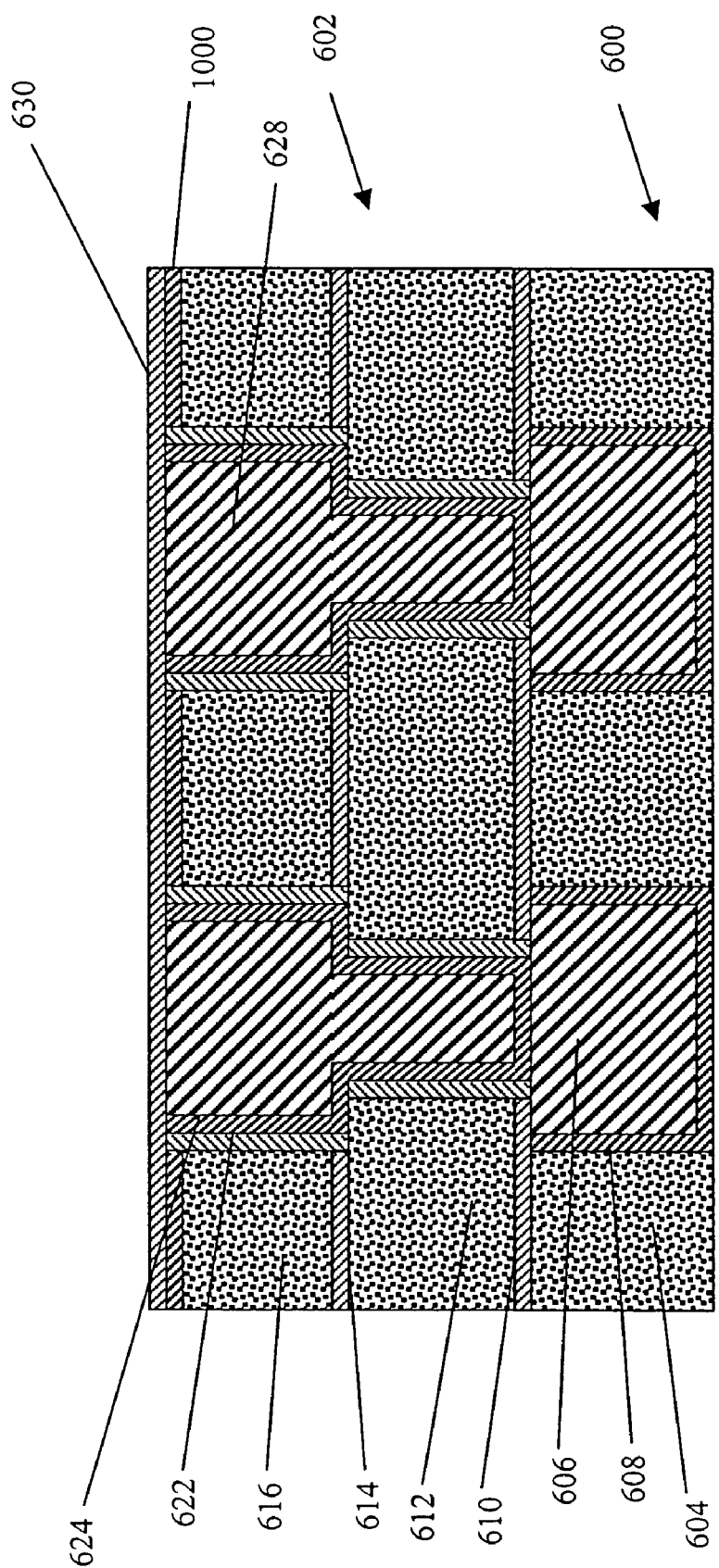
Figure 10J:
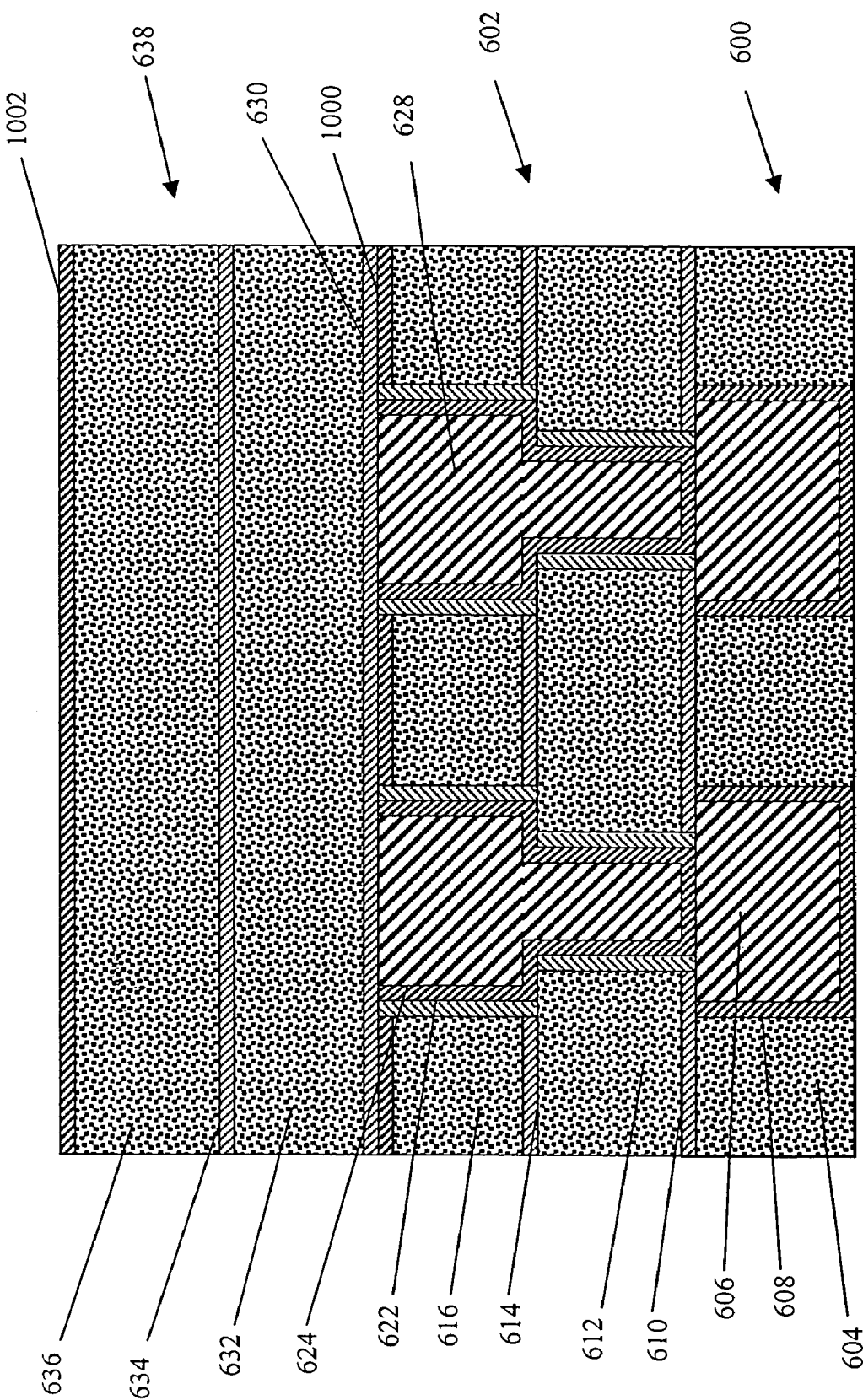
Figure 11C:
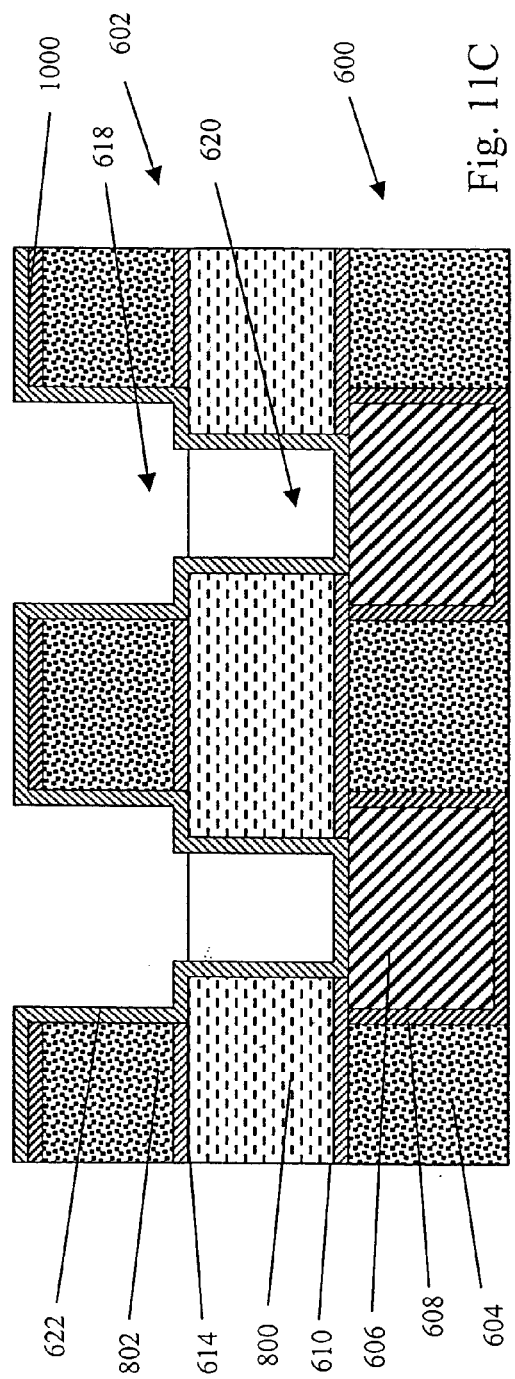
Figure 11D:
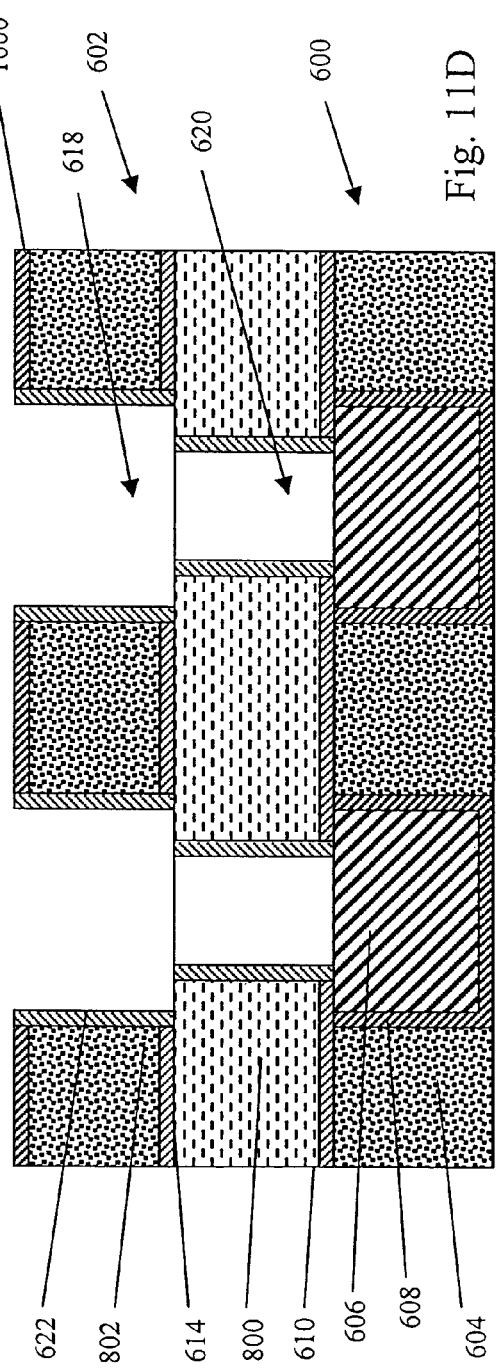
Figure 11I:
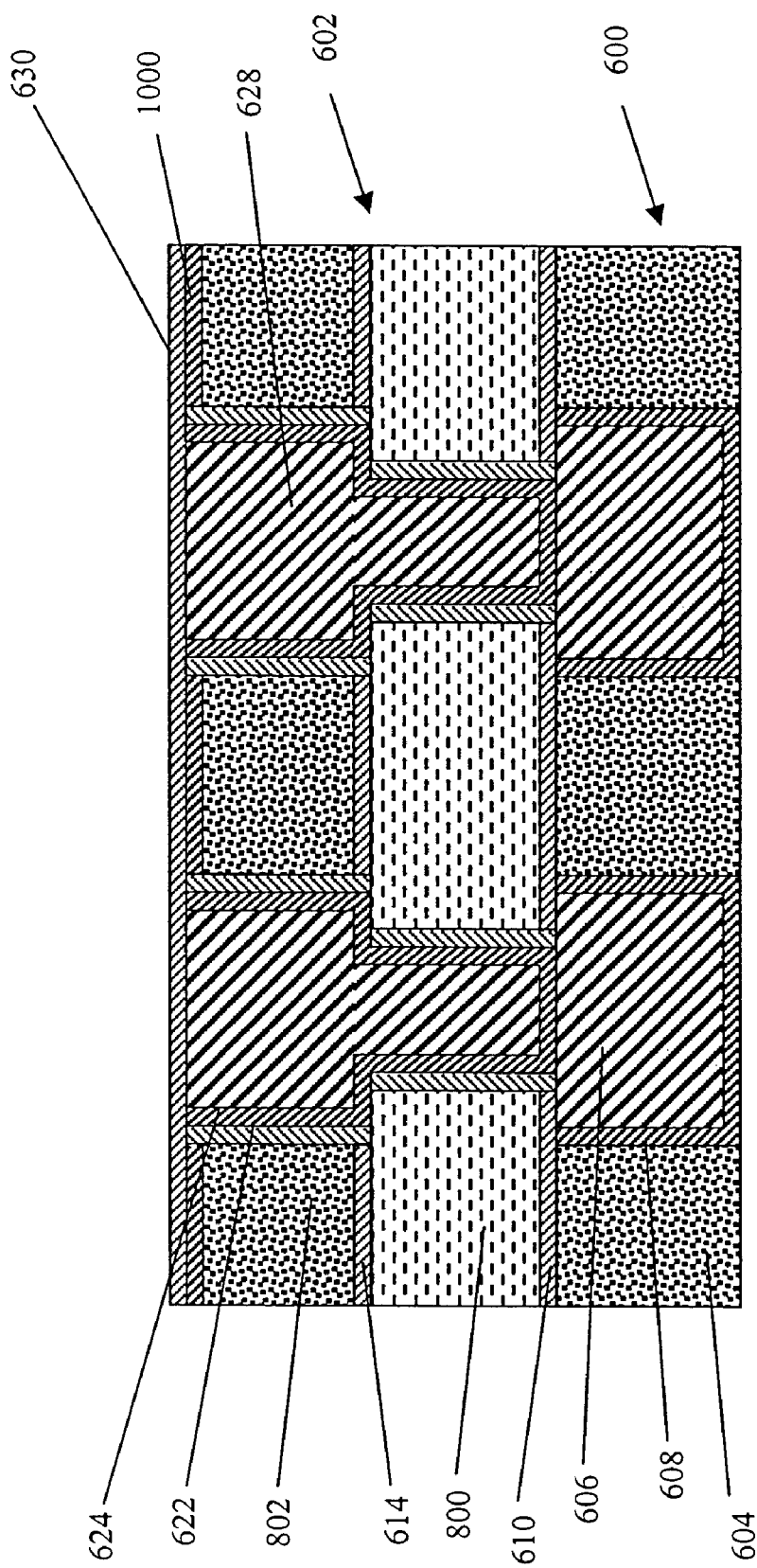
Figure 11J:
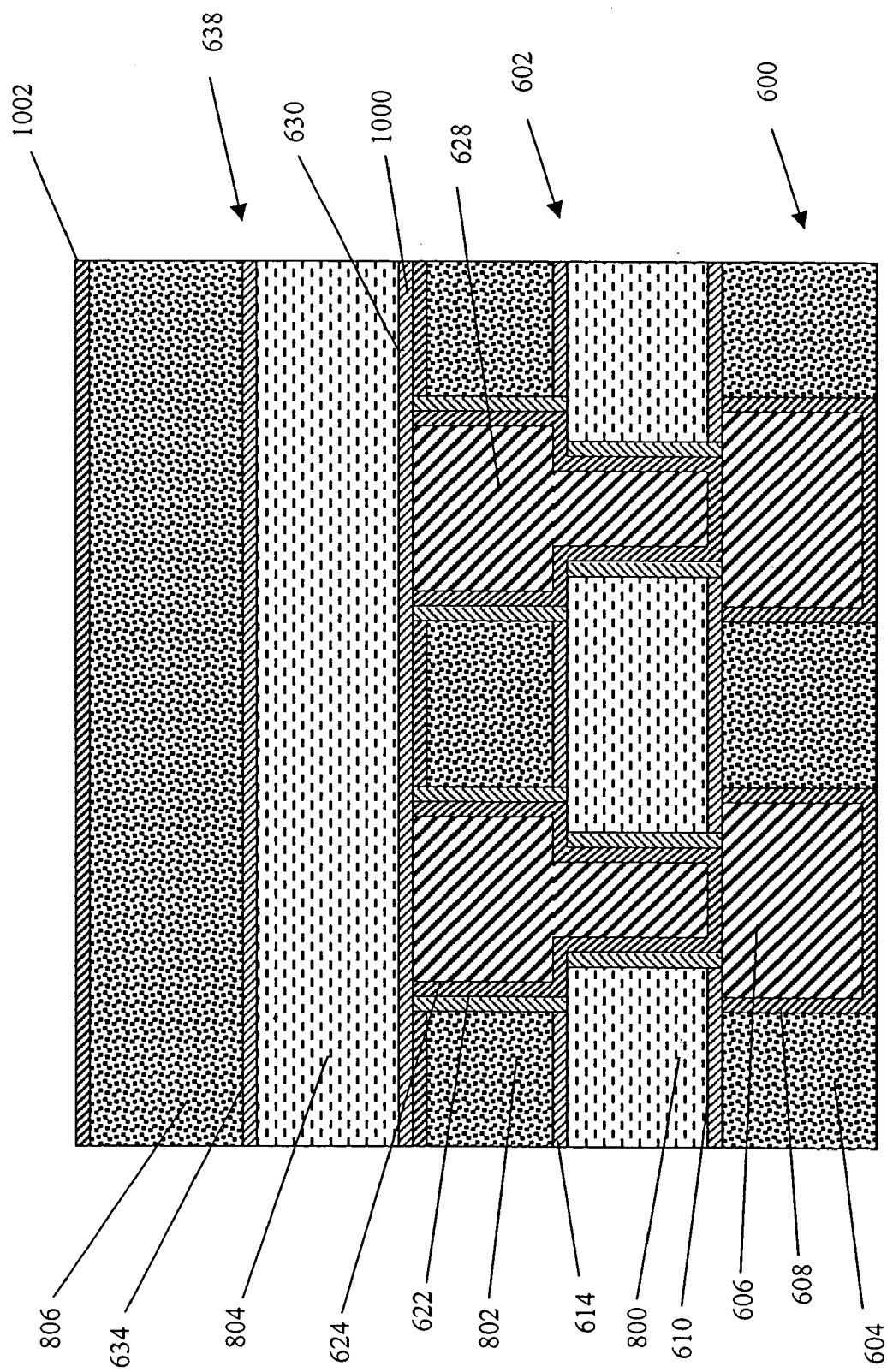

With reference now to FIGS. 10G and 10OH, protective layer 1000 can separate barrier layer 624 from second sub-layer 616, and can therefore protect second sub-layer 616 from damage, such as abrasion or corrosion, when barrier layer 624 is removed by any convenient method, such as wet etching, dry chemical etching, dry plasma etching, and the like. Additionally, with reference to FIGS. 10H–10J, protective layer 1000 can remain on the non-recessed areas of second sub-layer 616 during various stages following the removal of barrier layer 624. Accordingly, protective layer 1000 can include a material that is resistant to damage from processes such as wet etching, dry chemical etching, dry plasma etching, and the like, such as silicon carbide, diamond film, silicon dioxide, and the like.

In FIGS. 11A–11J, another alternative embodiment of the present invention is shown. The embodiment of FIGS. 11A–11J is similar in many respects to that of FIGS. 8A–8J, except that, with reference to FIG. 11A, protective layer 1000 can be deposited on top of second sub-layer 802 by any convenient method, such as PVD, CVD, ALD, a spin-on coating process followed by curing and drying steps, and the like. Similarly, with reference to FIG. 11J, protective layer 1002 can be deposited on top of second sub-layer 806.

With reference now to FIGS. 11G and 11H, protective layer 1000 can separate barrier layer 624 from second sub-layer 802, and can therefore protect second sub-layer 802 from damage, such as abrasion or corrosion, when barrier layer 624 is removed by any convenient method, such as wet etching, dry chemical etching, dry plasma etching, and the like. Additionally, with reference to FIGS. 11H–11J, protective layer 1000 can remain on the non-recessed areas of second sub-layer 802 during various stages following the removal of barrier layer 624. Accordingly, protective layer 1000 can include a material that is resistant to damage from processes such as wet etching, dry chemical etching, dry plasma etching, and the like, such as silicon carbide, diamond film, silicon dioxide, and the like.

In FIGS. 12A–12H, yet another alternative embodiment of the present invention is shown. The embodiment of FIGS. 12A–12H is similar in many respects to that of FIGS. 9A–9H, except that with reference to FIG. 12A, protective layer 1000 can be deposited on top of second sub-layer 802 by any convenient method, such as PVD, CVD, ALD, a spin-on coating process followed by curing and drying steps, and the like. Similarly, with reference to FIG. 12H, protective layer 1002 can be deposited on top of second sub-layer 806.

Figure 12G:
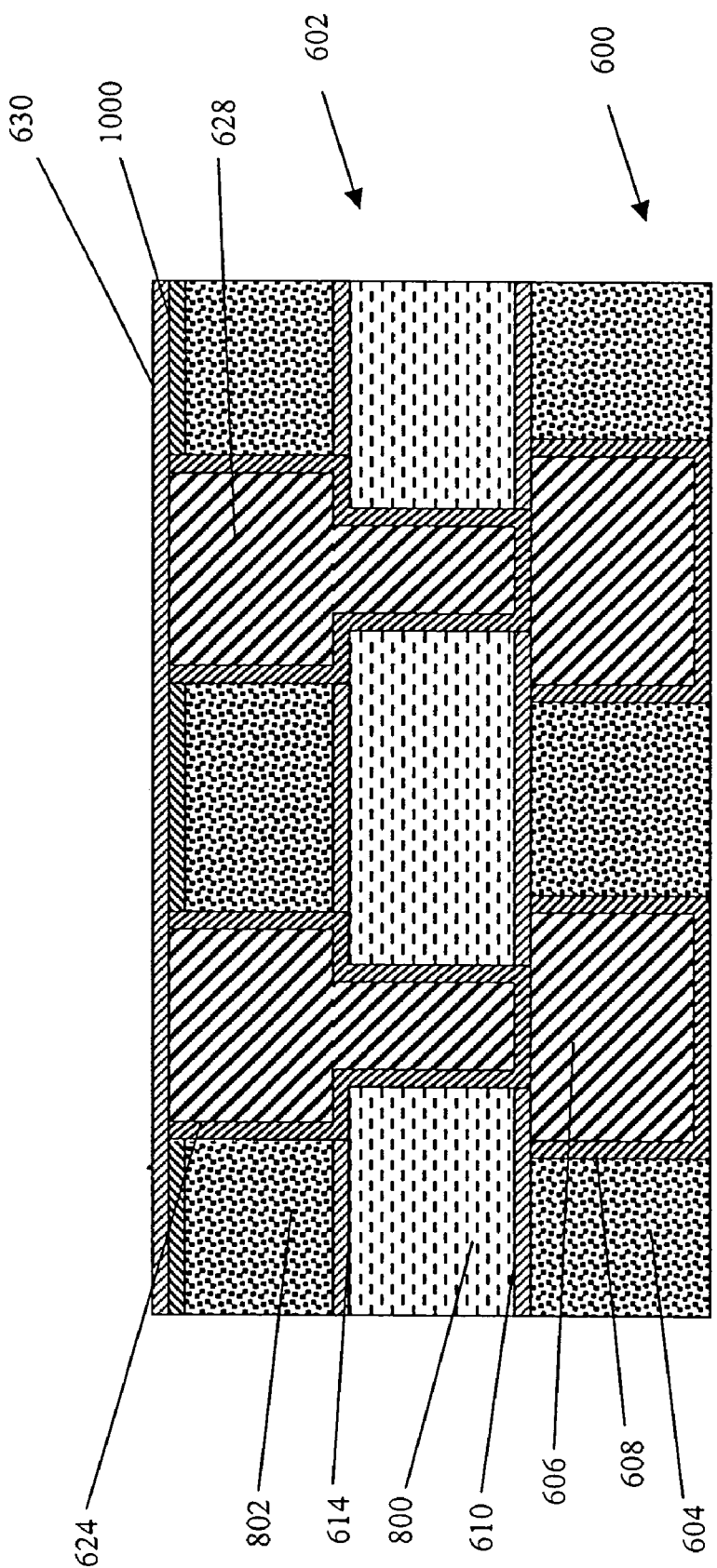
Figure 12H:
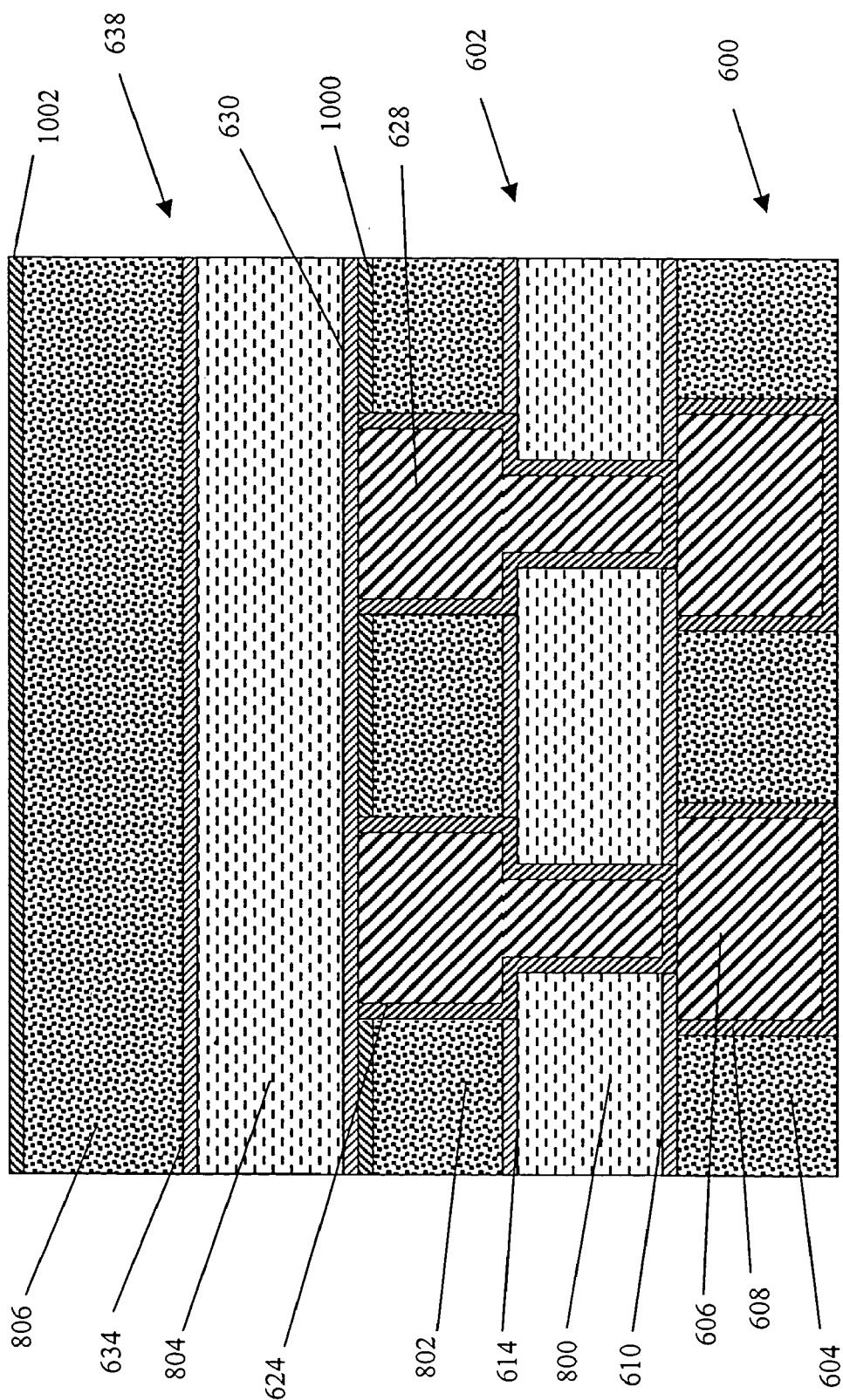

With reference now to FIGS. 12E and 12F, protective layer 1000 can separate barrier layer 624 from second sub-layer 802, and can therefore protect second sub-layer 802 from damage, such as abrasion or corrosion, when barrier layer 624 is removed by any convenient method, such as wet etching, dry chemical etching, dry plasma etching, and the like. Additionally, with reference to FIGS. 12F–12H, protective layer 1000 can remain on the non-recessed areas of second sub-layer 802 during various stages following the removal of barrier layer 624. Accordingly, protective layer 1000 can include a material that is resistant to damage from processes such as wet etching, dry chemical etching, dry plasma etching, and the like, such as silicon carbide, diamond film, silicon dioxide, and the like.

Although the present invention has been described with respect to certain embodiments, examples, and applications, it will be apparent to those skilled in the art that various modifications and changes may be made without departing from the invention.

I claim:

1. A method of forming a layer of a semiconductor wafer comprising:
   depositing a dielectric layer, wherein a first sub-layer of the dielectric layer is deposited and a second sub-layer of the dielectric layer is deposited on the first sub-layer, wherein the second sub-layer has a low dielectric constant, and wherein the dielectric constant of the second sub-layer is lower than the dielectric constant of the first sub-layer;
   forming recessed and non-recessed areas in the dielectric layer;
   depositing a metal layer on the dielectric layer to fill the recessed areas and cover the non-recessed areas; and
   electropolishing the metal layer to remove the metal layer covering the non-recessed areas while maintaining the metal layer in the recessed areas.

2. The method of claim 1, wherein the metal layer is electropolished discretely from portions of the wafer without applying lateral stress.

3. The method of claim 1, wherein forming recessed areas includes:
   forming trenches for interconnection lines in the second sub-layer; and
   forming via for plugs in the first sub-layer.

4. The method of claim 1 further comprising:
   depositing an insulation layer on the first sub-layer before depositing the second sub-layer.

5. The method of claim 1, wherein the first sub-layer includes silicon dioxide and the second sub-layer includes a material having a dielectric constant lower than that of silicon dioxide.

6. The method of claim 1, wherein the first sub-layer includes material having a low dielectric constant and the second sub-layer includes material having an ultra-low dielectric constant.

7. The method of claim 1, wherein the material of the first sub-layer has a dielectric constant greater than about 2.5 and less than about 4.0.

8. The method of claim 7, wherein the material of the second sub-layer has a dielectric constant of between about 1.1 and about 2.5.

9. The method of claim 8, wherein the material of the second sub-layer has a dielectric constant of about 1.8.

10. The method of claim 1 further comprising:
    depositing a barrier layer between the dielectric layer and the metal layer.

11. The method of claim 10, wherein the metal layer includes copper.

12. The method of claim 10 further comprising:
    removing the barrier layer from the non-recessed areas after electropolishing the metal layer.

13. The method of claim 1 further comprising:
    depositing an adhesion layer between the dielectric layer and the metal layer.

14. The method of claim 1 further comprising:
    removing a portion of the metal layer using chemical-mechanical polishing prior to electropolishing the metal layer.

15. A method of forming a layer on a semiconductor wafer comprising:
    depositing a dielectric layer, wherein a first sub-layer of the dielectric layer is deposited and a second sub-layer of the dielectric layer is deposited above the first sub-layer, and wherein the dielectric constant of the second sub-layer is lower than the dielectric constant silicon dioxide and the first sub-layer;
    forming recessed and non-recessed areas in the dielectric layer;
    depositing a metal layer to fill the recessed areas and cover the non-recessed areas; and
    electropolishing the metal layer to remove the metal layer covering the non-recessed areas.

16. The method of claim 15, wherein forming recessed areas includes:
    forming trenches for interconnection lines in the dielectric layer; and
    forming via for plugs in the dielectric layer.

17. The method of claim 16,
    wherein the trenches for interconnection lines are formed only in the second sub-layer; and
    wherein the via for plugs are formed in the first sub-layer.

18. The method of claim 17, wherein the first sub-layer includes silicon dioxide and the second sub-layer includes a material having a dielectric constant lower than that of silicon dioxide.

19. The method of claim 18 further comprising:
    removing the barrier layer from the non-recessed areas after electropolishing the metal layer.

20. The method of claim 17, wherein the first sub-layer includes material having a low dielectric constant and the second sub-layer includes material having an ultra-low dielectric constant.

21. The method of claim 15 further comprising:
    depositing a barrier layer between the dielectric layer and the metal layer.

22. The method of claim 21 further comprising:
    depositing an adhesion layer between the dielectric layer and the metal layer.

23. The method of claim 15 further comprising:
    removing a portion of the metal layer using chemical-mechanical polishing prior to electropolishing the metal layer.

24. A method of forming a layer on a semiconductor wafer comprising:
    depositing a first sub-layer of a dielectric layer;

depositing a second sub-layer subsequent to the first sub-layer, the second sub-layer having a dielectric constant less than that of silicon dioxide and the first sub-layer;

forming at least one trench in the second sub-layer;

forming at least one via in the first sub-layer through the a least one trench formed in the second sub-layer;

depositing a metal layer to fill the at least one trench formed in the second sub-layer and the at least one via formed in the first sub-layer; and electropolishing the metal layer.

25. The method of claim 24, further comprising:

after depositing the first sub-layer and before depositing the second sub-layer, depositing a first insulation layer on the first sub-layer, wherein a portion of the first insulation layer is exposed at the bottom of the at least one trench when the at least one trench is formed in the second sub-layer; and after forming the at least one trench in the second sub-layer and before forming the at least one via in the first sub-layer, removing the portion of the first insulation layer exposed at the bottom of the at least one trench.

26. The method of claim 25, further comprising:

before depositing the first sub-layer, depositing a second insulation layer, wherein a portion of the second insulation layer is exposed at the bottom of the at least one via when the at least one via is formed in the first sub-layer; and after forming the at least one via in the first sub-layer and before depositing the metal layer, removing the portion of the second insulation layer exposed at the bottom of the at least one via.

27. The method of claim 26, further comprising:

after forming the at least one via and before depositing the metal layer, depositing an adhesion layer to line the walls of the at least one trench and the at least one via; and before depositing the metal layer, removing a portion of the adhesion layer deposited on the bottom of the at least one via.

28. The method of claim 27, further comprising:

after removing the portion of the adhesion layer deposited on the bottom of the least one via and before depositing the metal layer, depositing a barrier layer to adhere to the adhesion layer.

* * * * *